United States Patent
Kang et al.

(10) Patent No.: US 12,484,372 B2
(45) Date of Patent: Nov. 25, 2025

(54) LIGHT-EMITTING DEVICE AND ELECTRONIC APPARATUS INCLUDING THE SAME

(71) Applicant: Samsung Display Co., Ltd., Yongin-si (KR)

(72) Inventors: Namsu Kang, Yongin-si (KR); Heungsu Park, Yongin-si (KR); Wonsuk Han, Yongin-si (KR); Huiju Park, Yongin-si (KR); Hyunshik Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 421 days.

(21) Appl. No.: 17/989,910

(22) Filed: Nov. 18, 2022

(65) Prior Publication Data

US 2023/0165029 A1    May 25, 2023

(30) Foreign Application Priority Data

Nov. 23, 2021   (KR) .................. 10-2021-0162595

(51) Int. Cl.
*H10K 50/125* (2023.01)
*H10K 59/123* (2023.01)

(52) U.S. Cl.
CPC ......... *H10K 50/125* (2023.02); *H10K 59/123* (2023.02)

(58) Field of Classification Search
CPC ...... H10K 50/19; H10K 50/125; H10K 59/32; H10K 50/16; H10K 50/171; H10K 50/18; H10K 30/865; H10K 50/13; H10K 50/17; H10K 59/12; H10K 59/38; H10K 59/40; H10K 85/342; H10K 85/631
See application file for complete search history.

(56) References Cited

U.S. PATENT DOCUMENTS

| | | | |
|---|---|---|---|
| 7,531,247 B2 | 5/2009 | Kim et al. | |
| 7,868,538 B2 | 1/2011 | Lee et al. | |
| 8,563,143 B2 | 10/2013 | Park et al. | |

(Continued)

FOREIGN PATENT DOCUMENTS

| | | |
|---|---|---|
| KR | 10-0587304 | 6/2006 |
| KR | 10-2007-0013002 | 1/2007 |

(Continued)

*Primary Examiner* — Moazzam Hossain
(74) *Attorney, Agent, or Firm* — Lerner David LLP

(57) ABSTRACT

A light-emitting device includes a first electrode, a second electrode, and an interlayer between the first electrode and the second electrode. The interlayer includes an emission layer, a third layer between the emission layer and the second electrode, a first layer between the third layer and the second electrode, and a second layer between the first layer and the third layer. The first layer includes a first metal-free material and a first metal-containing material, the second layer includes a second metal-free material and a second metal-containing material, the first metal-free material and the second metal-free material are different from each other, the first metal-containing material and the second metal-containing material are different from each other, and the third layer consists of a third metal-free material. Embodiments include an electronic apparatus including the light-emitting device.

19 Claims, 3 Drawing Sheets

(56) References Cited

U.S. PATENT DOCUMENTS

| | | |
|---|---|---|
| 8,796,676 B2 | 8/2014 | Pieh et al. |
| 8,912,534 B2 | 12/2014 | Pieh et al. |
| 9,184,407 B2 | 11/2015 | Lee et al. |
| 9,293,736 B2 | 3/2016 | Ko et al. |
| 9,780,338 B2 | 10/2017 | Suzuki et al. |
| 10,147,899 B2 | 12/2018 | Tu et al. |
| 10,411,213 B2 | 9/2019 | Tu |
| 10,424,754 B2 | 9/2019 | Bi et al. |
| 10,541,276 B2 | 1/2020 | Peng et al. |
| 2016/0141338 A1 | 5/2016 | Li |
| 2017/0279064 A1* | 9/2017 | Wallikewitz ......... H10K 50/165 |
| 2017/0294587 A1 | 10/2017 | Kim et al. |
| 2018/0151814 A1 | 5/2018 | Hirose et al. |
| 2019/0252622 A1* | 8/2019 | Kim ..................... H10K 85/615 |
| 2021/0384439 A1* | 12/2021 | Kim ..................... H10K 85/654 |

FOREIGN PATENT DOCUMENTS

| | | |
|---|---|---|
| KR | 10-0698300 | 3/2007 |
| KR | 20170116301 A | 10/2017 |
| KR | 20180062368 A | 6/2018 |
| KR | 10-1958059 | 3/2019 |
| KR | 10-2084170 | 3/2020 |

* cited by examiner

LIGHT-EMITTING DEVICE AND ELECTRONIC APPARATUS INCLUDING THE SAME

CROSS-REFERENCE TO RELATED APPLICATION(S)

This application claims priority to and benefits of Korean Patent Application No. 10-2021-0162595 under 35 U.S.C. § 119, filed on Nov. 23, 2021, in the Korean Intellectual Property Office, the entire contents of which are incorporated herein by reference.

BACKGROUND

1. Technical Field

Embodiments relate to a light-emitting device and an electronic apparatus including the same.

2. Description of the Related Art

Light-emitting devices are self-emissive devices that have wide viewing angles, high contrast ratios, short response times, and excellent characteristics in terms of luminance, driving voltage, and response speed.

In a light-emitting device, a first electrode is located on a substrate, and a hole transport region, an emission layer, an electron transport region, and a second electrode are sequentially arranged on the first electrode. Holes provided from the first electrode move toward the emission layer through the hole transport region, and electrons provided from the second electrode move toward the emission layer through the electron transport region. Carriers, such as holes and electrons, recombine in the emission layer to produce excitons. These excitons transition from an excited state to a ground state to thereby generate light.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

Embodiments relate to a light-emitting device with low driving voltage, high efficiency, and a long lifespan.

Additional aspects will be set forth in part in the description which follows and, in part, will be apparent from the description, or may be learned by practice of the embodiments of the disclosure.

According to embodiments, a light-emitting device may include a first electrode, a second electrode, and an interlayer between the first electrode and the second electrode, wherein
the interlayer may include an emission layer, a third layer between the emission layer and the second electrode, a first layer between the third layer and the second electrode, and a second layer between the first layer and the third layer,
the first layer may include a first metal-free material and a first metal-containing material, the second layer may include a second metal-free material and a second metal-containing material, the first metal-free material and the second metal-free material may be different from each other, the first metal-containing material and the second metal-containing material may be different from each other, and the third layer may consist of a third metal-free material.

In an embodiment, the interlayer may include m emitting units, and m−1 charge generation unit(s) between neighboring emitting units among the m emitting units, wherein m may be an integer of 2 or more, and any one of the m emitting units may include the emission layer, the first layer, the second layer, and the third layer.

In an embodiment, a maximum emission wavelength of light emitted from at least one of the m emitting units may be different from a maximum emission wavelength of light emitted from at least one of the remainder of the m emitting units.

In an embodiment, an emitting unit neighboring the second electrode among the m emitting units may include the emission layer, the first layer, the second layer, and the third layer.

In an embodiment, m may be 4.

In an embodiment, the m emitting units may include a first emitting unit, a second emitting unit, a third emitting unit, and a fourth emitting unit; the m−1 charge generation units may include a first charge generation unit, a second charge generation unit, and a third charge generation unit; the first charge generation unit may be between the first emitting unit and the second emitting unit; the second charge generation unit may be between the second emitting unit and the third emitting unit; the third charge generation unit may be between the third emitting unit and the fourth emitting unit; the first emitting unit may be between the first electrode and the first charge generation unit; the second emitting unit may be between the first charge generation unit and the second charge generation unit; the third emitting unit may be between the second charge generation unit and the third charge generation unit; the fourth emitting unit may be between the third charge generation unit and the second electrode; and any one of the first emitting unit, the second emitting unit, the third emitting unit, and the fourth emitting unit may include the emission layer, the first layer, the second layer, and the third layer.

In an embodiment, the fourth emitting unit may include the emission layer, the first layer, the second layer, and the third layer.

In an embodiment, the fourth emitting unit may emit green light.

In an embodiment, the first metal-free material may include a phosphine oxide-based compound, a phenanthroline-based compound, or any combination thereof.

In an embodiment, the first metal-containing material may include an alkali metal, an alkaline earth metal, a lanthanide metal, or any combination thereof.

In an embodiment, the first metal-containing material may be Yb, Li, Cu, Ag, Au, Al, Mg, or any combination thereof.

In an embodiment, the second metal-free material may include a compound including at least one of: groups of Group 2A; a condensed cyclic group in which two or more groups of Group 2A are condensed with each other; or a condensed cyclic group in which at least one group of Group 2A and at least one of Group 2B are condensed with each other, wherein Group 2A and Group 2B are explained below.

In an embodiment, the second metal-containing material may include an alkali metal complex.

In an embodiment, the third metal-free material may include a compound including at least one of: groups of Group 3A; a condensed cyclic group in which two or more groups of Group 3A are condensed with each other; or a condensed cyclic group in which at least one group of Group 3A and at least one of Group 3B are condensed with each other, wherein Group 3A and Group 3B are explained below.

In an embodiment, the second metal-free material and the third metal-free material may be identical to each other.

In an embodiment, an amount of the second metal-free material may be in a range of about 10 parts by weight to about 90 parts by weight, based on 100 parts by weight of the second metal-free material and the second metal-containing material.

In an embodiment, the first layer may directly contact the second layer.

In an embodiment, a thickness of the first layer may be equal to or less than a thickness of the second layer.

According to embodiments, an electronic apparatus may include the light-emitting device and a thin-film transistor, wherein the thin-film transistor may include a source electrode and a drain electrode, and the first electrode of the light-emitting device may be electrically connected to the source electrode or the drain electrode.

In an embodiment, the electronic apparatus may further include a color filter, a color conversion layer, a touch screen layer, a polarizing layer, or any combination thereof.

BRIEF DESCRIPTION OF THE DRAWINGS

The above and other aspects and features of the disclosure will be more apparent by describing in detail embodiments thereof with reference to the accompanying drawings, in which.

DETAILED DESCRIPTION OF THE EMBODIMENTS

Figure 1:
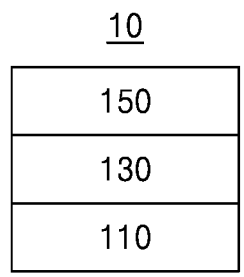
FIG. 1 is a schematic cross-sectional view of a light-emitting device according to an embodiment.

The disclosure will now be described more fully hereinafter with reference to the accompanying drawings, in which embodiments are shown. This disclosure may, however, be embodied in different forms and should not be construed as limited to the embodiments set forth herein. Rather, these embodiments are provided so that this disclosure will be thorough and complete, and will fully convey the scope of the disclosure to those skilled in the art.

In the drawings, the sizes, thicknesses, ratios, and dimensions of the elements may be exaggerated for ease of description and for clarity. Like numbers refer to like elements throughout.

In the description, it will be understood that when an element (or region, layer, part, etc.) is referred to as being "on", "connected to", or "coupled to" another element, it can be directly on, connected to, or coupled to the other element, or one or more intervening elements may be present therebetween. In a similar sense, when an element (or region, layer, part, etc.) is described as "covering" another element, it can directly cover the other element, or one or more intervening elements may be present therebetween.

In the description, when an element is "directly on," "directly connected to," or "directly coupled to" another element, there are no intervening elements present. For example, "directly on" may mean that two layers or two elements are disposed without an additional element such as an adhesion element therebetween.

As used herein, the expressions used in the singular such as "a," "an," and "the," are intended to include the plural forms as well, unless the context clearly indicates otherwise.

As used herein, the term "and/or" includes any and all combinations of one or more of the associated listed items. For example, "A and/or B" may be understood to mean "A, B, or A and B." The terms "and" and "or" may be used in the conjunctive or disjunctive sense and may be understood to be equivalent to "and/or".

In the specification and the claims, the term "at least one of" is intended to include the meaning of "at least one selected from the group of" for the purpose of its meaning and interpretation. For example, "at least one of A and B" may be understood to mean "A, B, or A and B." When preceding a list of elements, the term, "at least one of," modifies the entire list of elements and does not modify the individual elements of the list.

It will be understood that, although the terms first, second, etc. may be used herein to describe various elements, these elements should not be limited by these terms. These terms are only used to distinguish one element from another element.

Thus, a first element could be termed a second element without departing from the teachings of the disclosure. Similarly, a second element could be termed a first element, without departing from the scope of the disclosure.

The spatially relative terms "below", "beneath", "lower", "above", "upper", or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

The terms "about" or "approximately" as used herein is inclusive of the stated value and means within an acceptable range of deviation for the recited value as determined by one of ordinary skill in the art, considering the measurement in question and the error associated with measurement of the recited quantity (i.e., the limitations of the measurement system). For example, "about" may mean within one or more standard deviations, or within ±20%, ±10%, or ±5% of the stated value.

It should be understood that the terms "comprises," "comprising," "includes," "including," "have," "having," "contains," "containing," and the like are intended to specify the presence of stated features, integers, steps, operations, elements, components, or combinations thereof in the disclosure, but do not preclude the presence or addition of one or more other features, integers, steps, operations, elements, components, or combinations thereof.

Unless otherwise defined or implied herein, all terms (including technical and scientific terms) used have the same meaning as commonly understood by those skilled in the art to which this disclosure pertains. It will be further understood that terms, such as those defined in commonly used dictionaries, should be interpreted as having a meaning that is consistent with their meaning in the context of the relevant art and should not be interpreted in an ideal or excessively formal sense unless clearly defined in the specification.

The term "interlayer" as used herein refers to a single layer and/or multiple layers located between the first electrode and the second electrode of the light-emitting device.

The term "B consisting of A" as used herein refers to a case in which a particular region of B consists only of a compound belonging to the region of Compound A, or any combination thereof. Therefore, when B consists of A, any compound that does not belong to Compound A may not be included in B.

The term "metal-containing material" as used herein refers to a material including a metal atom, which may include a metal, a metal-containing compound, or a metal complex.

For example, a "metal-containing material" may include an alkali metal, an alkaline earth metal, a rare earth metal, an alkali metal-containing compound, an alkaline earth-metal compound, a rare earth metal-containing compound, an alkali metal complex, an alkaline earth metal complex, a rare earth metal complex, or any combination thereof.

The alkali metal may include Li, Na, K, Rb, Cs, or any combination thereof. The alkaline earth metal may include Mg, Ca, Sr, Ba, or any combination thereof. The rare earth metal may include Sc, Y, Ce, Tb, Yb, Gd, or any combination thereof.

The alkali metal-containing compound, the alkaline earth metal-containing compound, and the rare earth metal-containing compound may include: oxides, halides (for example, fluorides, chlorides, bromides, or iodides), or tellurides of each of the alkali metal, the alkaline earth metal, and the rare earth metal; or any combination thereof.

The alkali metal-containing compound may include: alkali metal oxides, such as $Li_2O$, $Cs_2O$, or $K_2O$; alkali metal halides, such as LiF, NaF, CsF, KF, LiI, NaI, CsI, or KI; or any combination thereof. The alkaline earth metal-containing compound may include an alkaline earth metal compound, such as BaO, SrO, CaO, $Ba_xSr_{1-x}O$ (wherein x is a real number satisfying the condition of $0<x<1$), $Ba_xCa_{1-x}O$ (wherein x is a real number satisfying the condition of $0<x<1$), or the like. The rare earth metal-containing compound may include $YbF_3$, $ScF_3$, $Sc_2O_3$, $Y_2O_3$, $Ce_2O_3$, $GdF_3$, $TbF_3$, $YbI_3$, $ScI_3$, $TbI_3$, or any combination thereof. In embodiments, the rare earth metal-containing compound may include a lanthanide metal telluride. Examples of the lanthanide metal telluride may include LaTe, CeTe, PrTe, NdTe, PmTe, SmTe, EuTe, GdTe, TbTe, DyTe, HoTe, ErTe, TmTe, YbTe, LuTe, $La_2Te_3$, $Ce_2Te_3$, $Pr_2Te_3$, $Nd_2Te_3$, $Pm_2Te_3$, $Sm_2Te_3$, $Eu_2Te_3$, $Gd_2Te_3$, $Tb_2Te_3$, $Dy_2Te_3$, $Ho_2Te_3$, $Er_2Te_3$, $Tm_2Te_3$, $Yb_2Te_3$, and $Lu_2Te_3$.

The alkali metal complex, the alkaline earth-metal complex, and the rare earth metal complex may include one of ions of the alkali metal, ions of the alkaline earth metal, and ions of the rare earth metal, and a ligand bonded to the metal ion (for example, a hydroxyquinoline, a hydroxyisoquinoline, a hydroxybenzoquinoline, a hydroxyacridine, a hydroxyphenanthridine, a hydroxyphenyloxazole, a hydroxyphenylthiazole, a hydroxyphenyloxadiazole, a hydroxyphenylthiadiazole, a hydroxyphenylpyridine, a hydroxyphenylbenzimidazole, a hydroxyphenylbenzothiazole, a bipyridine, a phenanthroline, a cyclopentadiene, or any combination thereof).

The term "metal-free material" as used herein refers to a material that does not contain a metal atom, which includes a non-metal element, a heavy metal element, or any combination thereof. For example, the "metal-free material" does not include an alkali metal, an alkaline earth metal, and a rare earth metal.

In an embodiment, a light-emitting device may include a first electrode, a second electrode, and an interlayer between the first electrode and the second electrode, wherein the interlayer may include an emission layer, a third layer between the emission layer and the second electrode, a first layer between the third layer and the second electrode, and a second layer between the first layer and the third layer, the first layer may include a first metal-free material and a first metal-containing material, the second layer may include a second metal-free material and a second metal-containing material, the first metal-free material and the second metal-free material may be different from each other, the first metal-containing material and the second metal-containing material may be different from each other, and the third layer may consist of a third metal-free material.

The light-emitting device according to embodiments may have high electron injection capability by including the first layer including the first metal-free material and the first metal-containing material, and the second layer including the second metal-free material and the second metal-containing material.

The light-emitting device may have high electron transport capability and may prevent exciton quenching by including the third layer consisting of the third metal-free material.

Therefore, the light-emitting device according to embodiments may, by including the first layer, the second layer, and the third layer, simultaneously have high electron injection capability and electron transport capability, thereby having low driving voltage and excellent efficiency and lifespan.

In an embodiment, the first metal-free material may include a phosphine oxide-based compound, a phenanthroline-based compound, or any combination thereof.

The term "phosphine oxide-based compound" as used herein refers to a compound including at least one phosphine oxide group, wherein the phosphine oxide-based compound is in a form of a phosphine oxide or includes the phosphine oxide as a moiety of a compound.

The term "phenanthroline-based compound" as used herein refers to a compound including at least one phenanthroline group, wherein the phenanthroline-based compound includes a substituted or unsubstituted phenanthroline group.

In an embodiment, the first metal-free material may include a compound represented by Formula 1-1:

[Formula 1-1]

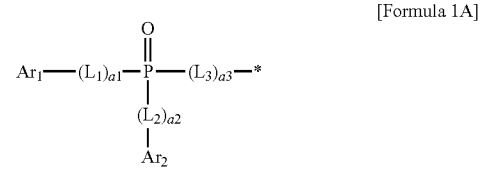

[Formula 1A]

[Formula 1B]

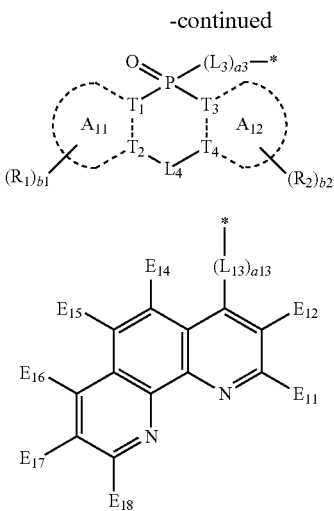

[Formula 1C]

In Formula 1-1, $B_1$ may be a group represented by Formula 1A, a group represented by Formula 1B, or a group represented by Formula 1C.

In Formulae 1-1, 1A, 1B, and 1C,
ring $A_1$, ring $A_{11}$, and ring $A_{12}$ may each independently be a $C_5$-$C_{60}$ carbocyclic group or a $C_2$-$C_{60}$ heterocyclic group, ring $A_{11}$ and ring $A_{12}$ may be optionally linked to each other via a single bond, c1 and c2 may each independently be an integer from 1 to 3, $T_1$ to $T_4$ may each independently be carbon or nitrogen,
$E_{11}$ may be $*-(L_{11})_{a11}-(R_{11})_{b11}$,
$E_{12}$ may be $*-(L_{12})_{a12}-(R_{12})_{b12}$,
$E_{14}$ may be $*-(L_{14})_{a14}-(R_{14})_{b14}$,
$E_{15}$ may be $*-(L_{15})_{a15}-(R_{15})_{b15}$,
$E_{16}$ may be $*-(L_{16})_{a16}-(R_{16})_{b16}$,
$E_{17}$ may be $*-(L_{17})_{a17}-(R_{17})_{b17}$,
$E_{18}$ may be $*-(L_{18})_{a18}-(R_{18})_{b18}$, $L_1$ to $L_3$ and $L_{11}$ to $L_{18}$ may each independently be a single bond, a $C_3$-$C_{60}$ carbocyclic group unsubstituted or substituted with at least one $R_{10a}$, or a $C_1$-$C_{60}$ heterocyclic group unsubstituted or substituted with at least one $R_{10a}$, a1 to a3 and a11 to a18 may each independently be an integer from 0 to 4, $L_4$ may be a single bond, $*-C(R_5)(R_6)-*'$, $*-C(R_5)=C(R_6)-*'$, or $*-N(R_5)-C(=R_6)-*$, wherein $R_5$ and $R_6$ may be optionally linked to each other to form a $C_3$-$C_{60}$ carbocyclic group unsubstituted or substituted with at least one $R_{10a}$, or a $C_1$-$C_{60}$ heterocyclic group unsubstituted or substituted with at least one $R_{10a}$, $Ar_1$ and $Ar_2$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, $R_1$, $R_2$, $R_4$ to $R_6$, $R_{11}$, $R_{12}$, and $R_{14}$ to $R_{18}$ may each independently be hydrogen, deuterium, —F, —Cl, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, a $C_6$-$C_{60}$ aryloxy group unsubstituted or substituted with at least one $R_{10a}$, a $C_6$-$C_{60}$ arylthio group unsubstituted or substituted with at least one $R_{10a}$, —Si($Q_1$)($Q_2$)($Q_3$), —B($Q_1$)($Q_2$), —C(=O)($Q_1$), —S(=O)$_2$($Q_1$), or —P(=O)($Q_1$)($Q_2$), $R_1$ and $R_2$ may be optionally linked to each other to form a $C_5$-$C_{60}$ carbocyclic group unsubstituted or substituted with at least one $R_{10a}$ or a $C_2$-$C_{60}$ heterocyclic group unsubstituted or substituted with at least one $R_{10a}$, in Formula 1-1, when b4 is 2 or more, any two of $R_4$ in the number of b4 may be optionally linked to each other by a single bond, $*-C(R_7)(R_8)-*'$, $*-N(R_7)-*'$, $*-O-*'$, or $*-S-*'$ to form a $C_5$-$C_{60}$ carbocyclic group unsubstituted or substituted with at least one $R_{10a}$ or a $C_2$-$C_{60}$ heterocyclic group unsubstituted or substituted with at least one $R_{10a}$, and $R_7$ and $R_8$ are each the same as described in connection with $R_1$, b1, b2, and b4 may each independently be an integer from 0 to 5, b11, b12, and b14 to b18 may each independently be an integer from 0 to 10, $Q_1$ to $Q_3$ are each the same as defined herein, and
* and *' each indicate a binding site to a neighboring atom.

In an embodiment, the first metal-free material may include a compound represented by Formula 1-2:

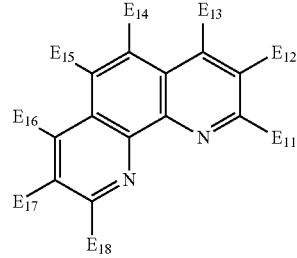

[Formula 1-2]

In Formula 1-2,
$E_{11}$ may be $*-(L_{11})_{a11}-(R_{11})_{b11}$,
$E_{12}$ may be $*-(L_{12})_{a12}-(R_{12})_{b12}$,
$E_{13}$ may be $*-(L_{13})_{a13}-(R_{13})_{b13}$,
$E_{14}$ may be $*-(L_{14})_{a14}-(R_{14})_{b14}$,
$E_{15}$ may be $*-(L_{15})_{a15}-(R_{15})_{b15}$,
$E_{16}$ may be $*-(L_{16})_{a16}-(R_{16})_{b16}$,
$E_{17}$ may be $*-(L_{17})_{a17}-(R_{17})_{b17}$,
$E_{18}$ may be $*-(L_{18})_{a18}-(R_{18})_{b18}$, $L_{11}$ to $L_{18}$ may each independently be a single bond, a $C_5$-$C_{60}$ carbocyclic group unsubstituted or substituted with at least one $R_{10a}$, or a $C_2$-$C_{60}$ heterocyclic group unsubstituted or substituted with at least one $R_{10a}$, a11 to a18 may each independently be an integer from 1 to 3, $R_{11}$ to $R_{18}$ may each independently be hydrogen, deuterium, —F, —Cl, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, a $C_6$-$C_{60}$ aryloxy group unsubstituted or substituted with at least one $R_{10a}$, a $C_6$-$C_{60}$ arylthio group unsubstituted or substituted with at least one $R_{10a}$, —Si($Q_1$)($Q_2$)($Q_3$), —B($Q_1$)($Q_2$), —C(=O)($Q_1$), —S(=O)$_2$($Q_1$), or —P(=O)($Q_1$)($Q_2$), b11 to b18 may each independently be an integer from 0 to 10, $Q_1$ to $Q_3$ are each the same as defined herein, and

* indicates a binding site to a neighboring atom.

In an embodiment, the first metal-containing material may include an alkali metal, an alkaline earth metal, a lanthanide metal, or any combination thereof.

In an embodiment, the first metal-containing material may include Yb, Li, Cu, Ag, Au, Al, Mg, or any combination thereof.

In an embodiment, the second metal-free material may include a compound including at least one of: groups of Group 2A; a condensed cyclic group in which two or more groups of Group 2A are condensed with each other; or a condensed cyclic group in which at least one group of Group 2A and at least one of Group 2B are condensed with each other:

[Group 2A]
a pyridine group, a diazine group, a triazine group, a tetrazine group

[Group 2B]
a benzene group.

For example, the second metal-free material may include at least one of a pyridine group, a pyrimidine group, a pyrazine group, a pyridazine group, a triazine group, a quinoline group, an isoquinoline group, a benzoquinoline group, a benzoisoquinoline group, a quinoxaline group, a benzoquinoxaline group, a quinazoline group, a benzoquinazoline group, a phenanthroline group, a cinnoline group, a phthalazine group, a naphthyridine group, or any combination thereof.

For example, the second metal-free material be a substituted or unsubstituted pyridine group or may include the pyridine group as a moiety of the compound.

In an embodiment, the second metal-containing material may include an alkali metal complex.

In an embodiment, the second metal-containing material may include an Li complex.

In an embodiment, the second metal-containing material may include Compound ET-D1, Compound ET-D2, or any combination thereof:

ET-D1

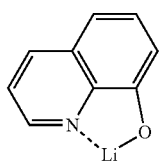

ET-D2

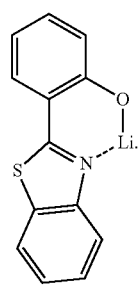

In an embodiment, the third metal-free material may include a compound including at least one of: groups of Group 3A; a condensed cyclic group in which two or more groups of Group 3A are condensed with each other; or a condensed cyclic group in which at least one group of Group 3A and at least one of Group 3B are condensed with each other:

[Group 3A]
a pyridine group, a diazine group, a triazine group, a tetrazine group,

[Group 3B]
a benzene group.

For example, the third metal-free material may include at least one of a pyridine group, a pyrimidine group, a pyrazine group, a pyridazine group, a triazine group, a quinoline group, an isoquinoline group, a benzoquinoline group, a benzoisoquinoline group, a quinoxaline group, a benzoquinoxaline group, a quinazoline group, a benzoquinazoline group, a phenanthroline group, a cinnoline group, a phthalazine group, a naphthyridine group, or any combination thereof.

In an embodiment, the second metal-free material and the third metal-free material may each independently be represented by Formula 2:

[Formula 2]

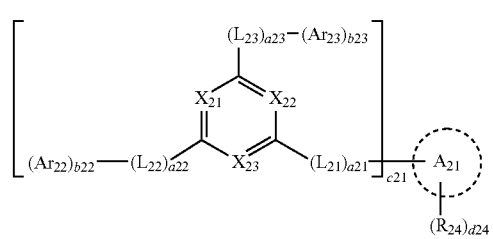

In Formula 2, $X_{21}$ may be $C(R_{21})$ or N, $X_{22}$ may be $C(R_{22})$ or N, $X_{23}$ may be $C(R_{23})$ or N, at least one of $X_{21}$ to $X_{23}$ may be N, $A_{21}$ may be a single bond, *—C($R_{25}$)($R_{26}$)—*', a $C_5$-$C_{60}$ carbocyclic group, or a $C_2$-$C_{60}$ heterocyclic group, d24 may be an integer from 0 to 10, $L_{21}$ to $L_{23}$ may each independently be a single bond, a $C_5$-$C_{60}$ carbocyclic group unsubstituted or substituted with at least one $R_{10a}$, or a $C_2$-$C_{60}$ heterocyclic group unsubstituted or substituted with at least one $R_{10a}$, a21 to a23 may each independently be an integer from 0 to 3, b22 and b23 may each independently be an integer from 1 to 5, c21 may be 1 or 2, $R_{21}$ to $R_{26}$, $Ar_{22}$, and $Ar_{23}$ may each independently be hydrogen, deuterium, —F, —Cl, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, a $C_6$-$C_{60}$ aryloxy group unsubstituted or substituted with at least one $R_{10a}$, a $C_6$-$C_{60}$ arylthio group unsubstituted or substituted with at least one $R_{10a}$, —Si$(Q_1)(Q_2)(Q_3)$, —B$(Q_1)(Q_2)$, —C(=O)$(Q_1)$, —S(=O)$_2(Q_1)$, or —P(=O)$(Q_1)(Q_2)$, neighboring substituents of $R_{21}$ to $R_{23}$, $Ar_{22}$, and $Ar_{23}$ may be linked to each other to form a $C_2$-$C_{60}$ heterocyclic group unsubstituted or substituted with at least one $R_{10a}$, $R_{25}$ and $R_{26}$ may be linked to each other to form a $C_5$-$C_{60}$ carbocyclic group unsubstituted or substituted with at least one $R_{10a}$ or a $C_2$-$C_{60}$ heterocyclic group unsubstituted or substituted with at least one $R_{10a}$, $Q_1$ to $Q_3$ are each the same as defined herein, and

* and *' each indicate a binding site to a neighboring atom.

The term "$R_{10a}$" as used herein may be:

deuterium, —F, —Cl, —Br, —I, a hydroxyl group, a cyano group, or a nitro group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each unsubstituted or substituted with deuterium, —F, —Cl, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —Si$(Q_{11})(Q_{12})(Q_{13})$, —B$(Q_{11})(Q_{12})$, —C(=O)$(Q_{11})$, —S(=O)$_2(Q_{11})$, —P(=O)$(Q_{11})(Q_{12})$, or any combination thereof;

a $C_3$-$C_{60}$ carbocyclic group, a $C_1$-$C_{60}$ heterocyclic group, a $C_6$-$C_{60}$ aryloxy group, or a $C_6$-$C_{60}$ arylthio group, each unsubstituted or substituted with deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —Si$(Q_{21})(Q_{22})(Q_{23})$, —B$(Q_{21})(Q_{22})$, —C(=O)$(Q_{21})$, —S(=O)$_2(Q_{21})$, —P(=O)$(Q_{21})(Q_{22})$, or any combination thereof; or —Si$(Q_{31})(Q_{32})(Q_{33})$, —B$(Q_{31})(Q_{32})$, —C(=O)$(Q_{31})$, —S(=O)$_2(Q_{31})$, or —P(=O)$(Q_{31})(Q_{32})$, wherein $Q_1$ to $Q_3$, $Q_{11}$ to $Q_{13}$, $Q_{21}$ to $Q_{23}$, and $Q_{31}$ to $Q_{33}$ may each independently be: hydrogen; deuterium; —F; —Cl; —Br; —I; a hydroxyl group; a cyano group; a nitro group; a $C_1$-$C_{60}$ alkyl group; a $C_2$-$C_{60}$ alkenyl group; a $C_2$-$C_{60}$ alkynyl group; a $C_1$-$C_{60}$ alkoxy group; or a $C_3$-$C_{60}$ carbocyclic group or a $C_1$-$C_{60}$ heterocyclic group, each unsubstituted or substituted with deuterium, —F, a cyano group, a $C_1$-$C_{60}$ alkyl group, a $C_1$-$C_{60}$ alkoxy group, a $C_3$-$C_{60}$ carbocyclic group, a $C_1$-$C_{60}$ heterocyclic group, or any combination thereof.

In an embodiment, c21 may be 2.

In an embodiment, the first metal-free material may be selected from Group I and Group II, but is not limited thereto:

[Group I]

1-1

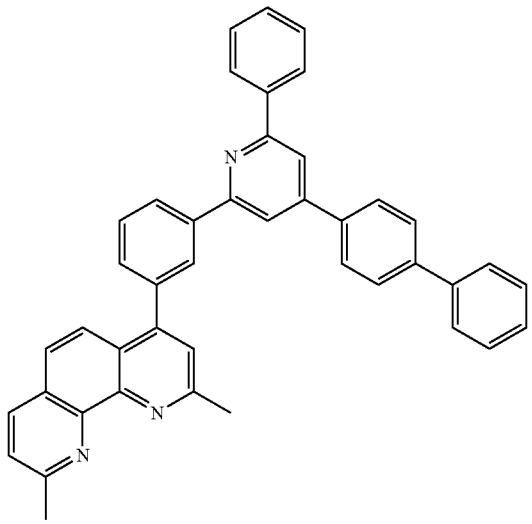

1-2

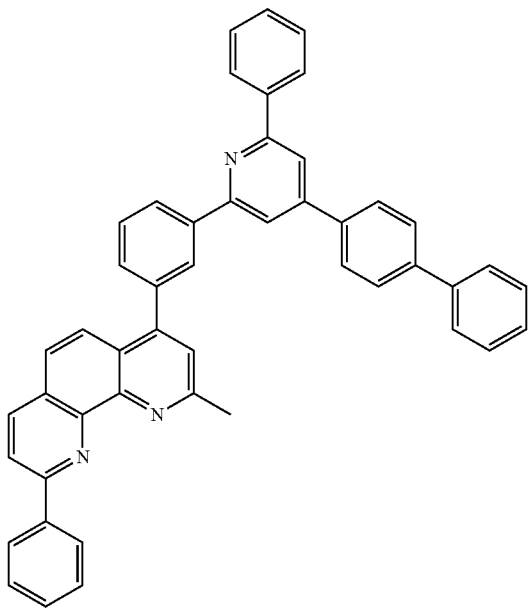

1-3
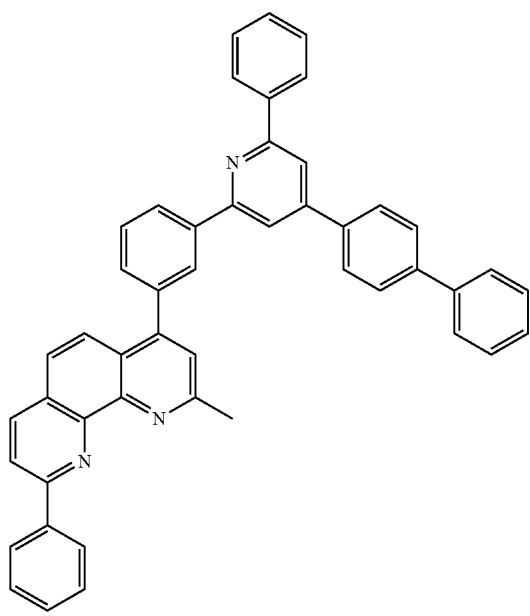
1-5
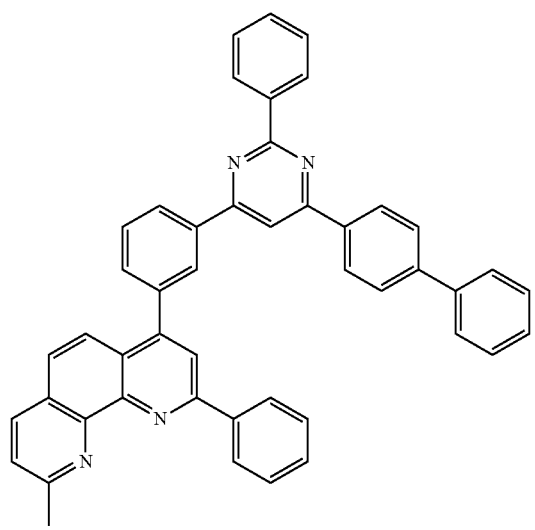
1-6
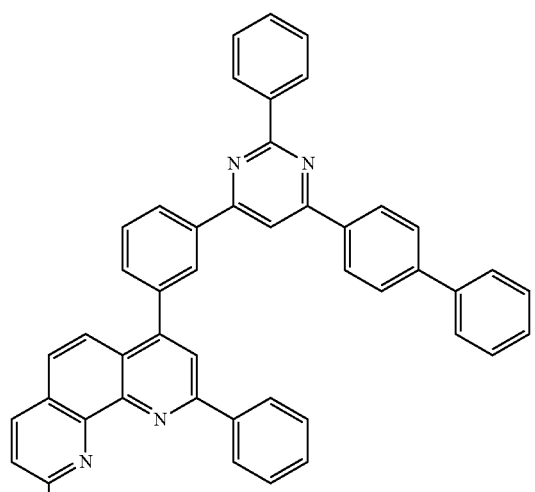
1-4
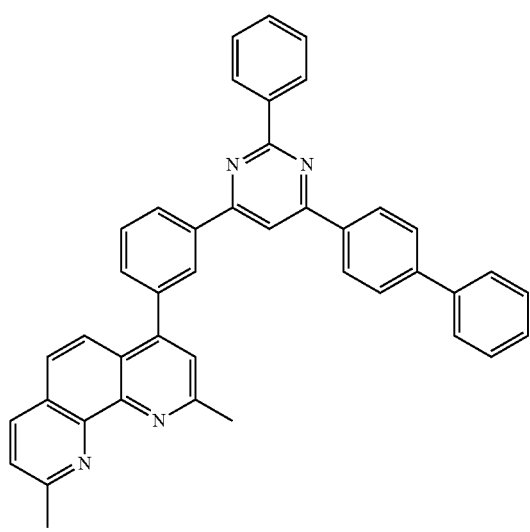
1-7
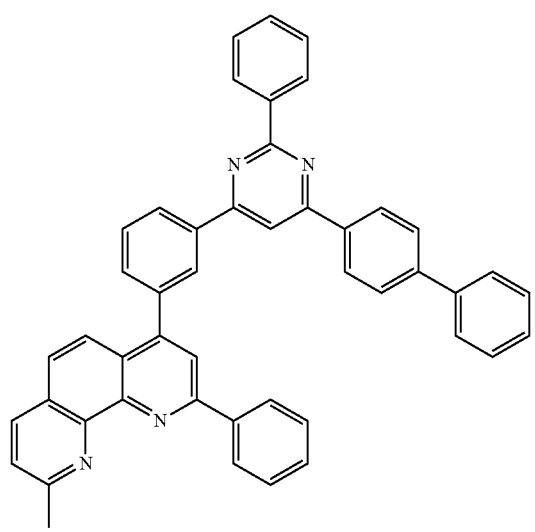

1-8
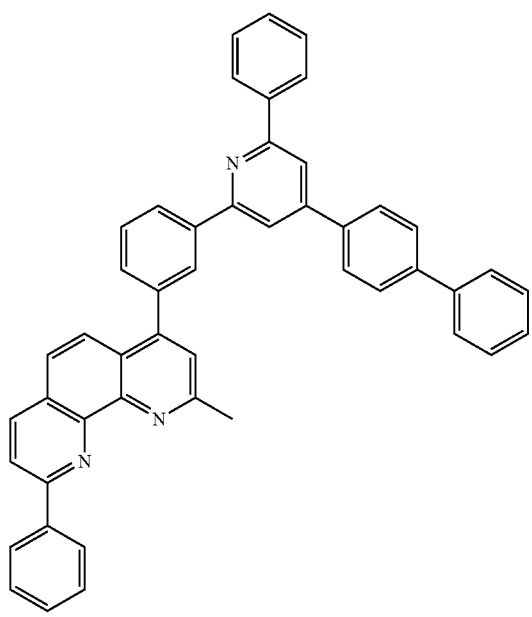
1-9
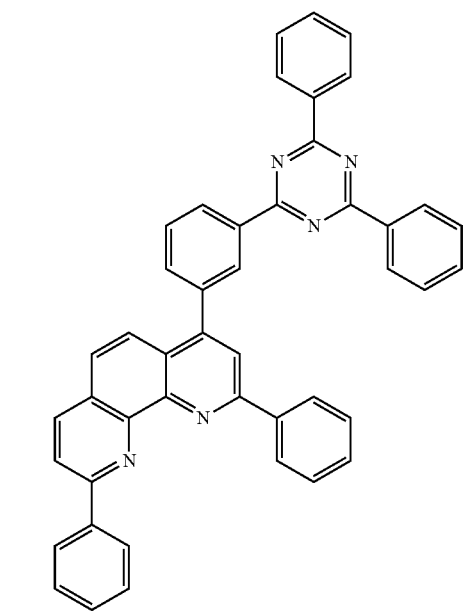
[Group II]
2-1
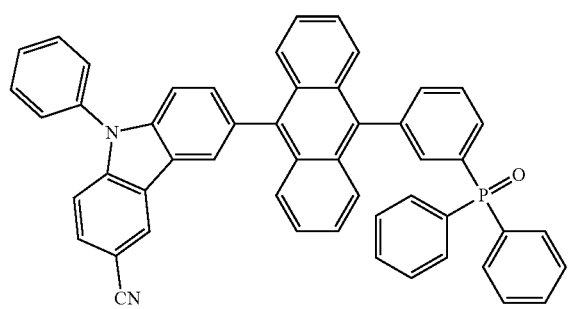
2-2
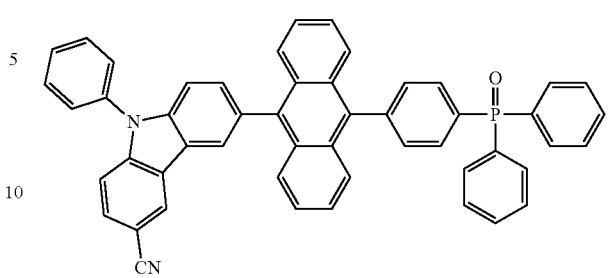
2-3
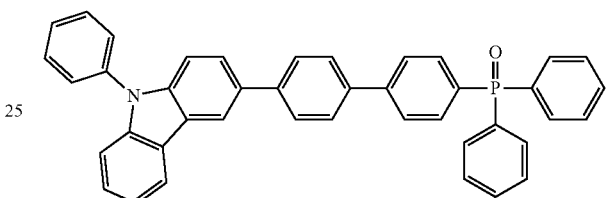
2-4
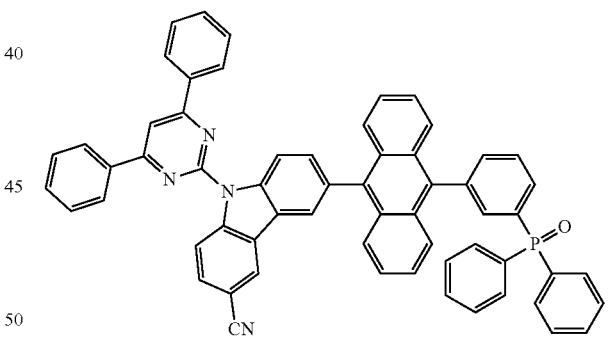
2-5
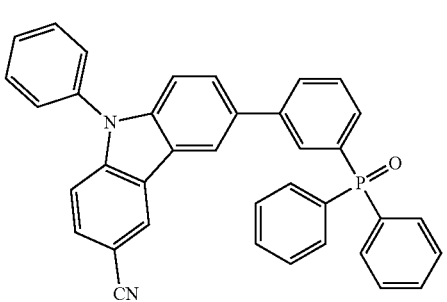

2-6
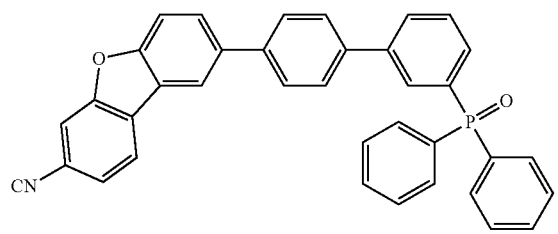
2-7
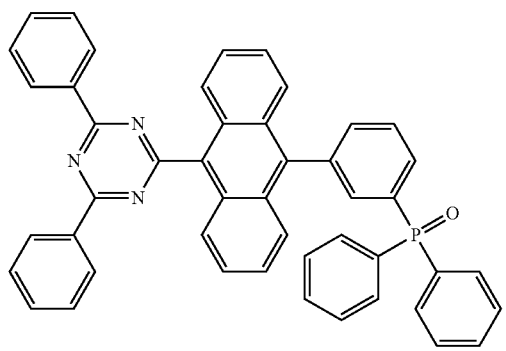
2-8
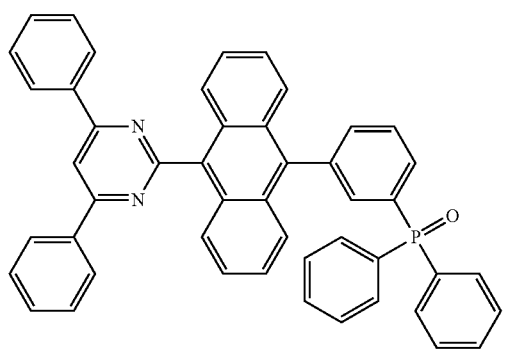
2-9
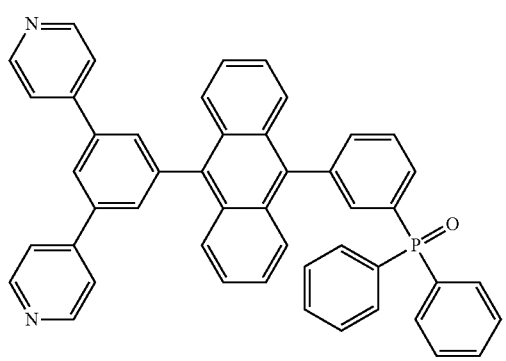
2-10
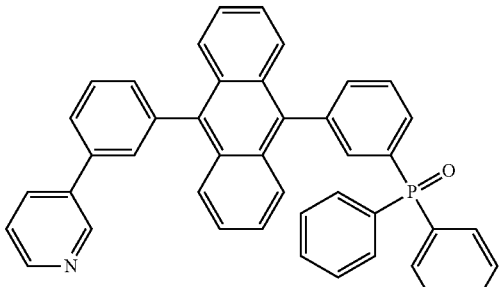
2-11
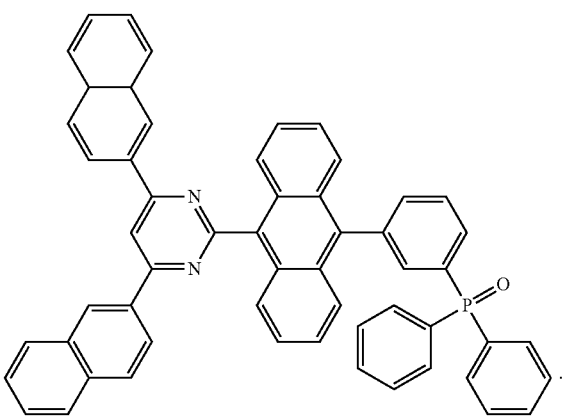
2-12
In an embodiment, the second metal-free material and the third metal-free material may each independently be selected from Group III, but is not limited thereto:

[Group III]
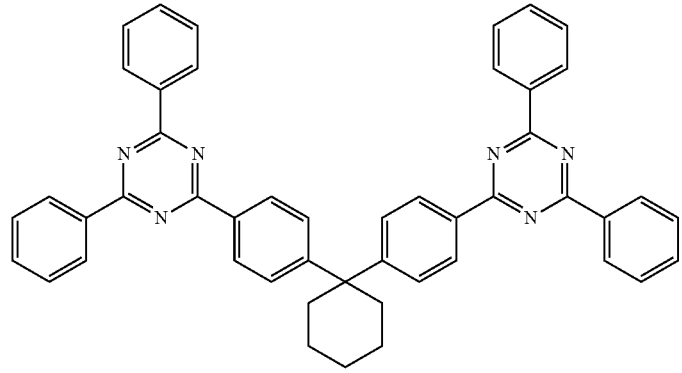
3-1
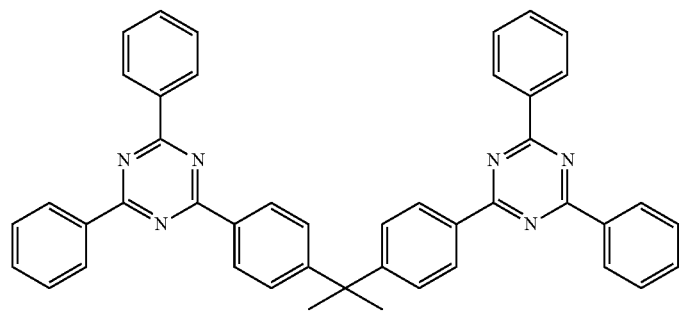
3-2
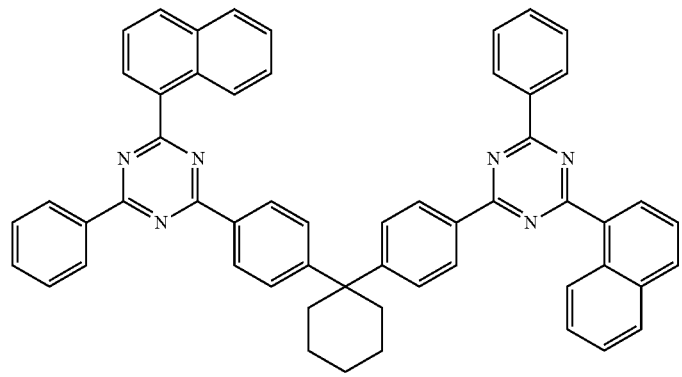
3-3
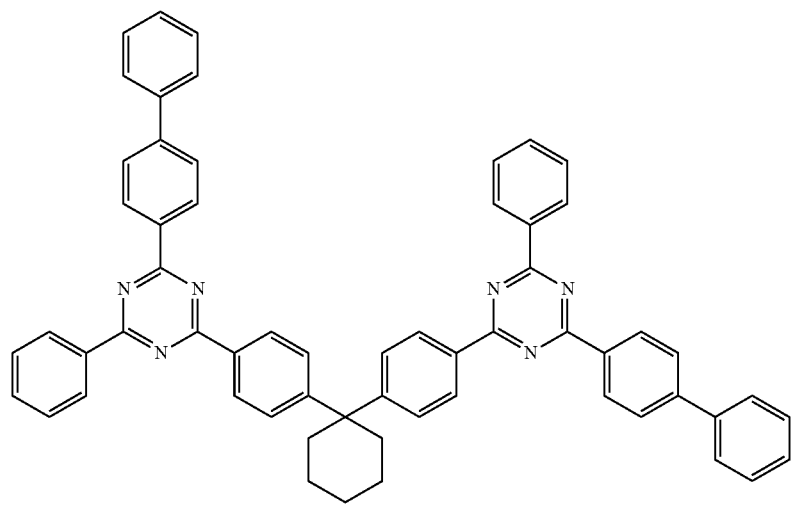
3-4

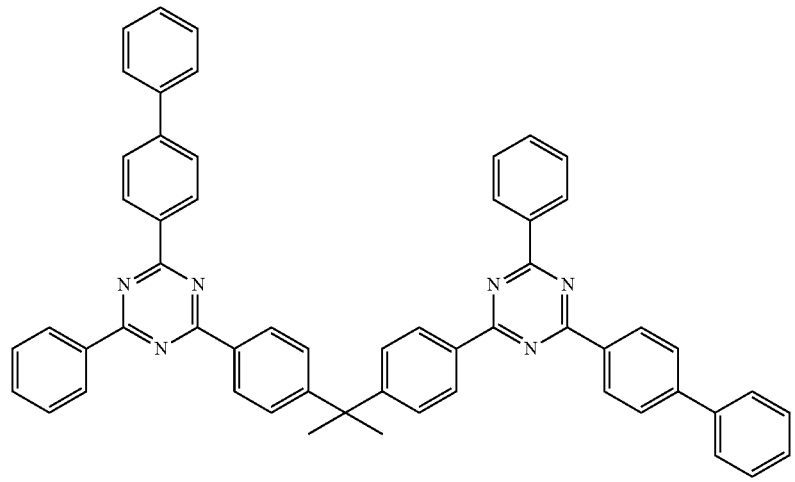
3-5
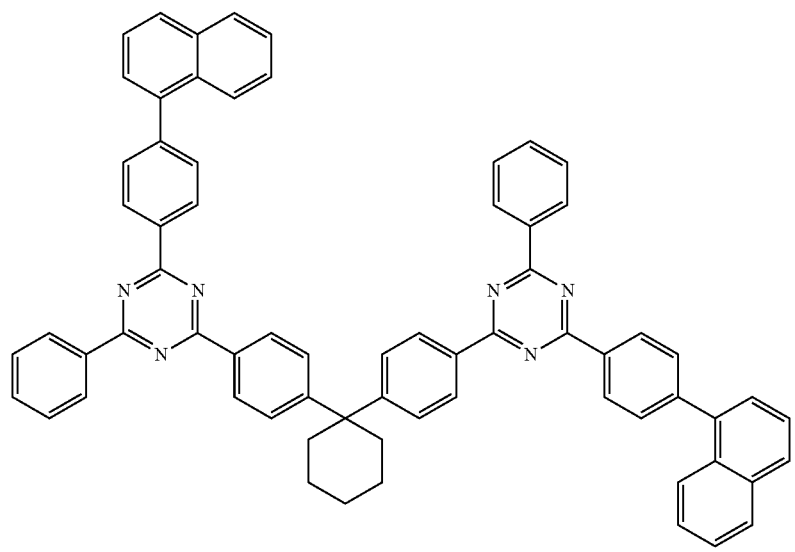
3-6
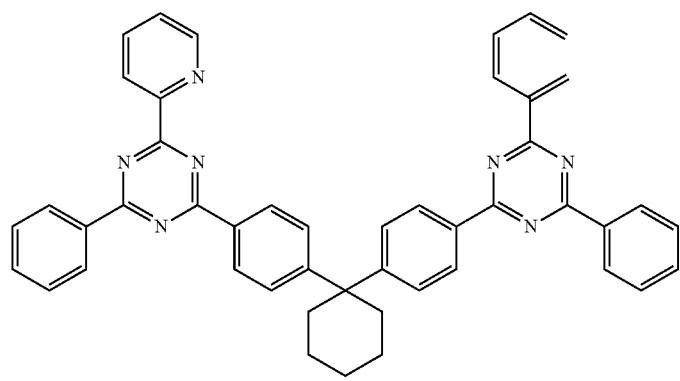
3-7

3-8
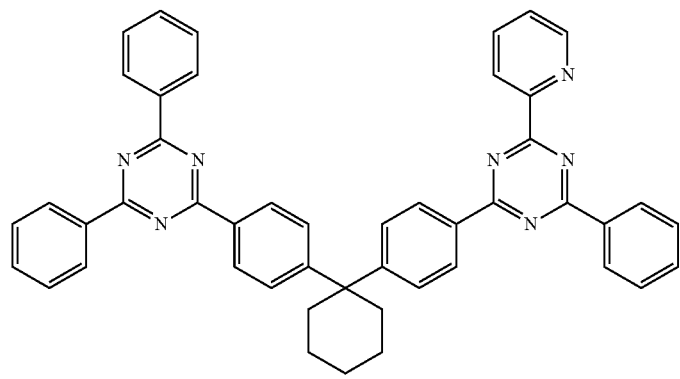
3-9
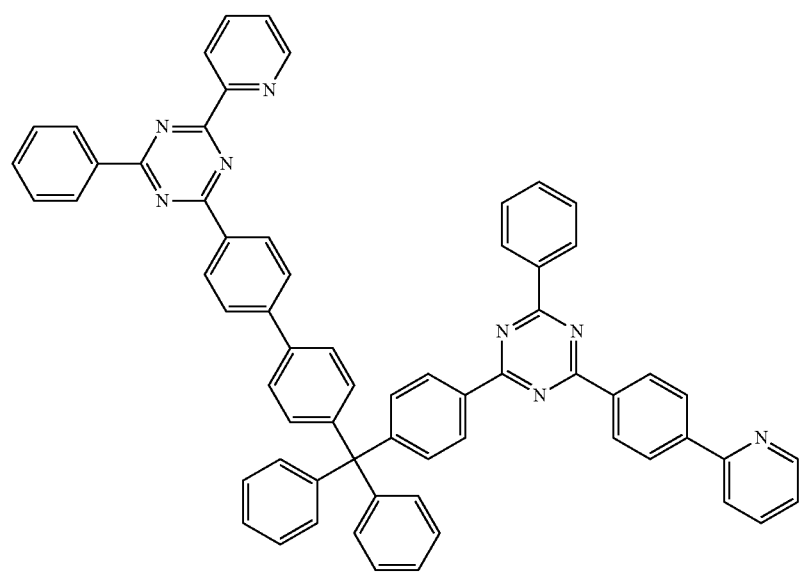
3-10
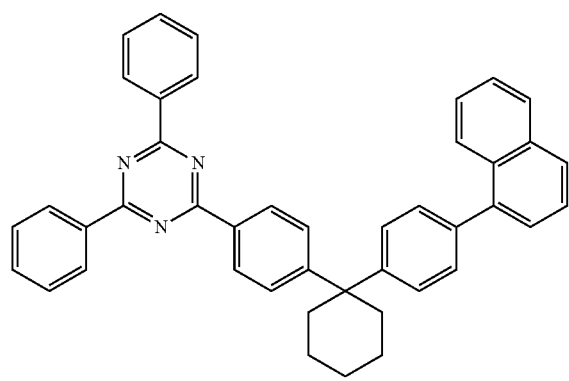

-continued
3-11
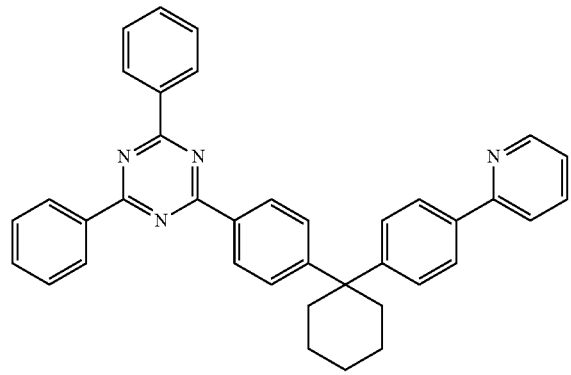
3-12
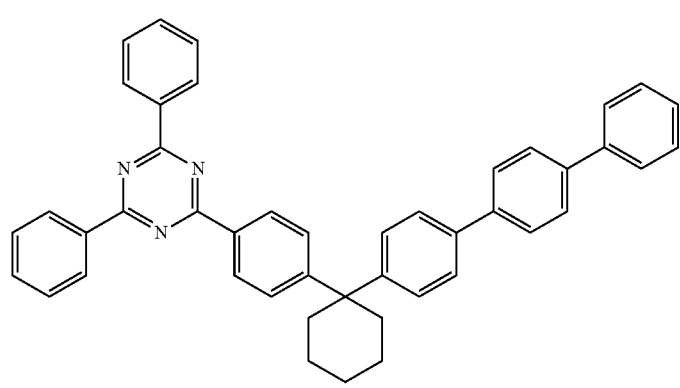
3-13
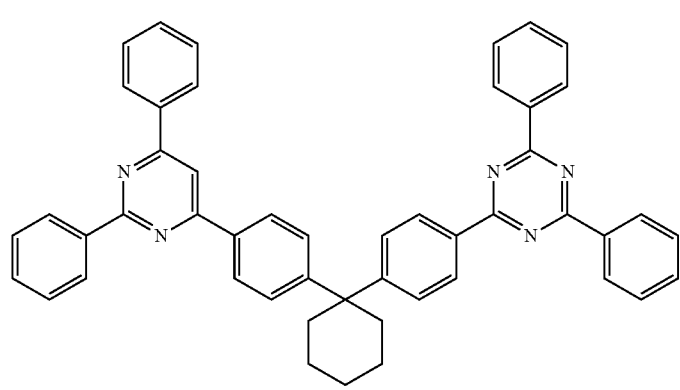
3-14
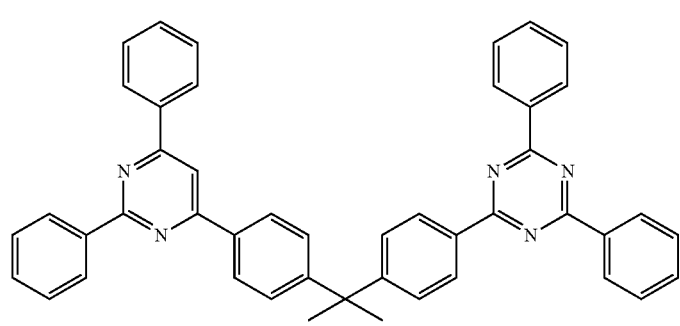

3-15
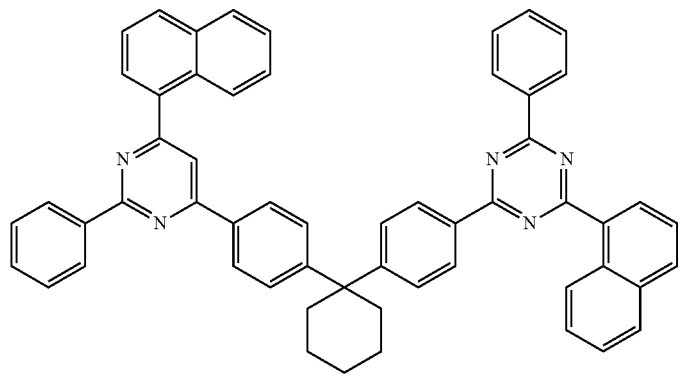
3-16
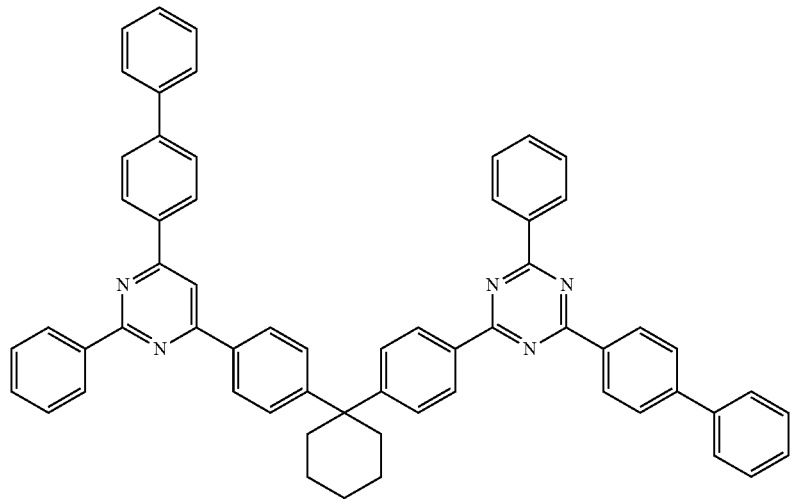
3-17
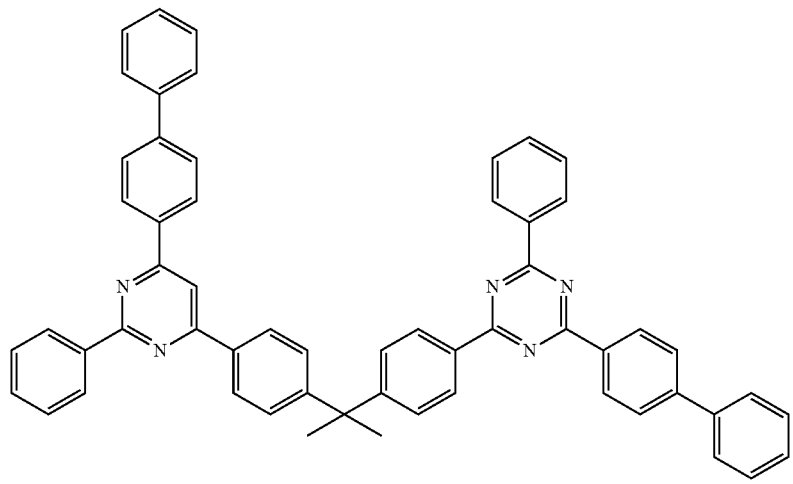

3-18
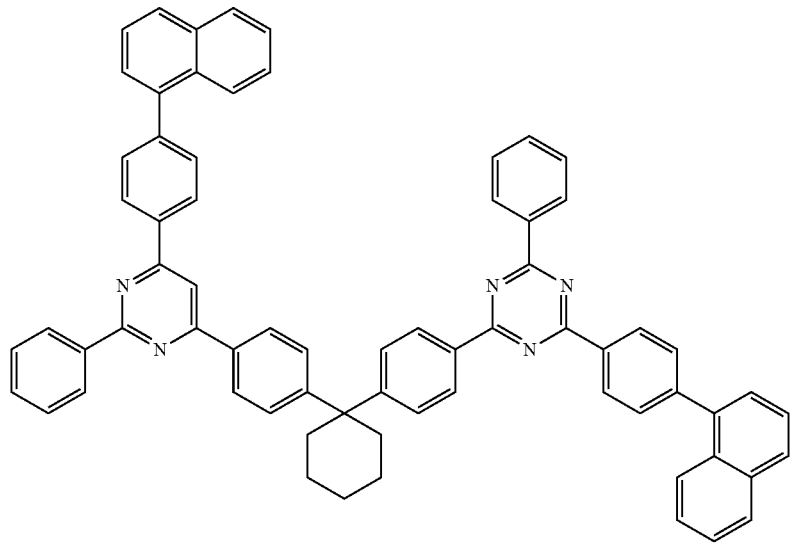
3-19
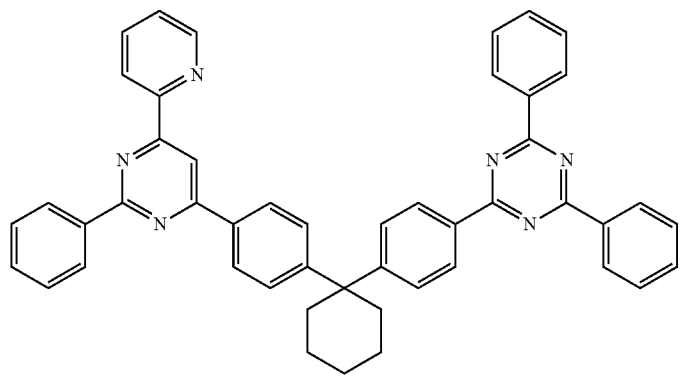
3-20
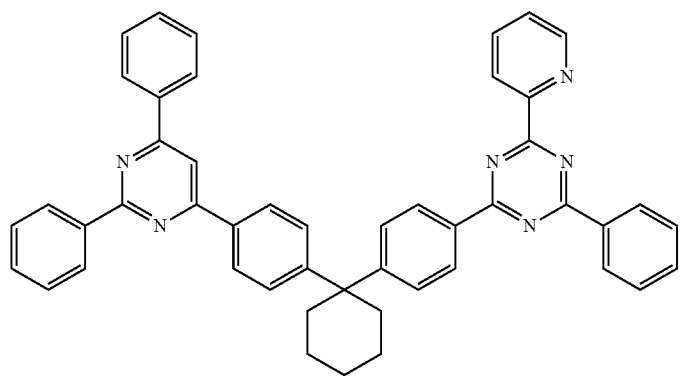

-continued
3-21
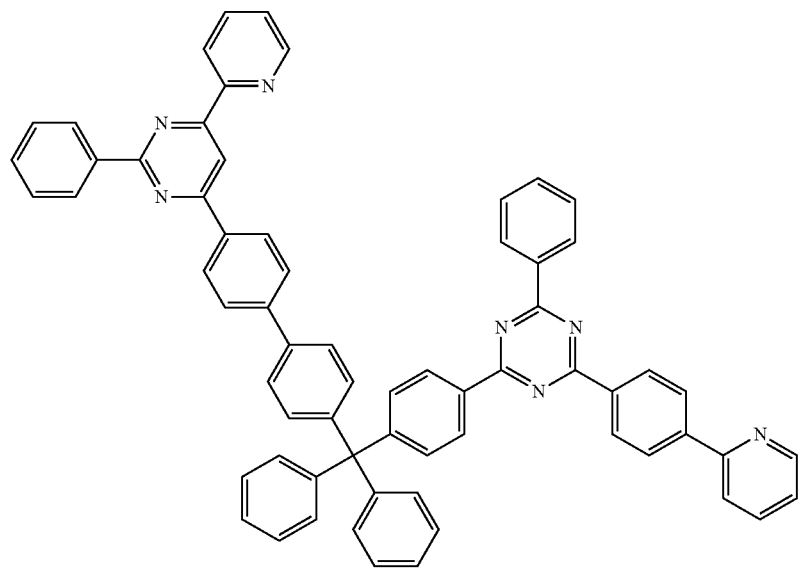
3-22
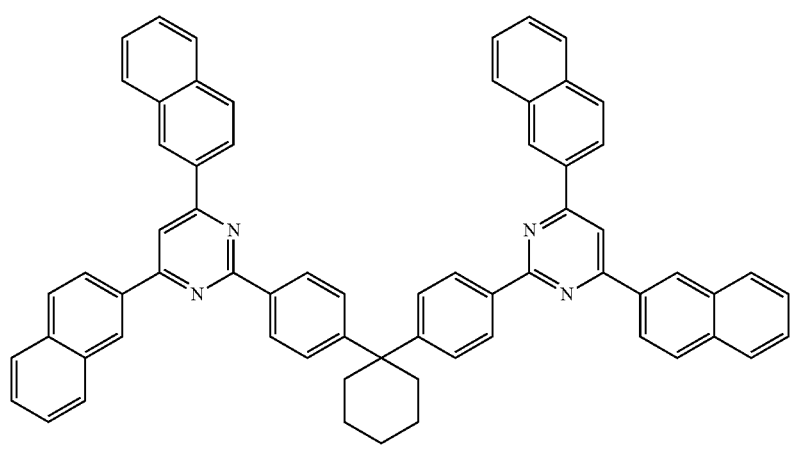
3-23
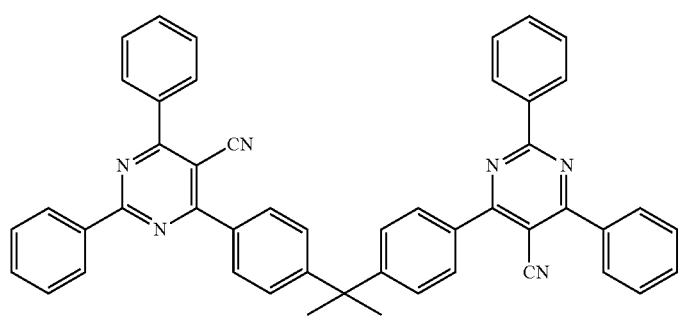
3-24
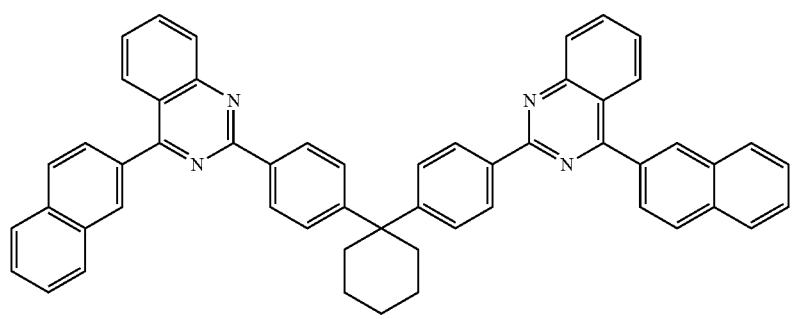

In an embodiment, the first layer may consist of a mixture of the first metal-free material and the first metal-containing material.

In an embodiment, the second layer may consist of a mixture of the second metal-free material and the second metal-containing material.

In an embodiment, the second metal-free material and the third metal-free material may be identical to each other.

In an embodiment, an amount of the first metal-free material may be in a range of about 75 parts by weight to about 100 parts by weight, based on 100 parts by weight of the first metal-free material and the first metal-containing material.

In an embodiment, an amount of the first metal-free material may be in a range of about 75 parts by weight to about 100 parts by weight, based on 100 parts by weight of the first layer.

In an embodiment, an amount of the second metal-free material may be in a range of about 10 parts by weight to about 90 parts by weight, based on 100 parts by weight of the second metal-free material and the second metal-containing material. For example, an amount of the second metal-free material may be in a range of about 20 parts by weight to about 80 parts by weight, based on 100 parts by weight of the second metal-free material and the second metal-containing material.

In an embodiment, an amount of the second metal-free material may be in a range of about 20 parts by weight to about 80 parts by weight, based on 100 parts by weight of the second layer.

In an embodiment, the first layer may directly contact the second layer.

In an embodiment, the first layer may directly contact the second electrode.

In an embodiment, the second layer may directly contact the third layer.

In an embodiment, a thickness of the first layer may be equal to or less than a thickness of the second layer.

In an embodiment, a thickness of the third layer may be greater than a thickness of the second layer.

In an embodiment, a thickness of the first layer may be in a range of about 5 Å to about 100 Å.

In an embodiment, a thickness of the second layer may be in a range of about 20 Å to about 300 Å.

In an embodiment, the light-emitting device may further include a capping layer located outside the second electrode, and the capping layer may have a refractive index equal to or greater than about 1.6. For example, the capping layer may have a refractive index in a range of about 1.6 to about 2.5.

In an embodiment, the light-emitting device may emit green light having a maximum emission wavelength in a range of about 490 nm to about 580 nm. For example, the light-emitting device may emit green light having a maximum emission wavelength in a range of about 500 nm to about 560 nm.

In an embodiment, the first electrode of the light-emitting device may be an anode, the second electrode of the light-emitting device may be a cathode, and the interlayer may further include a hole transport region between the first electrode and the emission layer and an electron transport region between the emission layer and the second electrode.

In an embodiment, the electron transport region may include the first layer, the second layer, and the third layer.

In an embodiment, the hole transport region may include a hole injection layer, a hole transport layer, an electron blocking layer, or any combination thereof, and the electron transport region may include a hole blocking layer, an electron control layer, an electron transport layer, an electron injection layer, or any combination thereof.

In an embodiment, the interlayer may include m emitting units, and m−1 charge generation unit(s) between neighboring emitting units among the m emitting units, wherein m may be an integer of 2 or more, and any one of the m emitting units may include the emission layer, the first layer, the second layer, and the third layer. The emission layer, the first layer, the second layer, and the third layer are each the same as described herein.

The light-emitting device may include m−1 charge generation unit(s) between neighboring emitting units among the m emitting units.

For example, an m−$1^{th}$ charge generation unit may be included between the $m^{th}$ emitting unit and the m−$1^{th}$ emitting unit. In embodiments, m may be a natural number of 2 or more. For example, m may be a natural number from 2 to 10.

In an embodiment, m may be 4.

For example, when m is 2, a first electrode, a first emitting unit, a first charge generation unit, a second emitting unit, and a second electrode may be sequentially disposed. The first emitting unit may emit first-color light, the second light emitting unit may emit second-color light, and the maximum emission wavelength of the first-color light and the maximum emission wavelength of the second-color light may be identical to or different from each other.

As another example, when m is 3, a first electrode, a first emitting unit, a first charge generation unit, a second emitting unit, a second charge generation unit, a third emitting unit, and a second electrode may be sequentially disposed. The first emitting unit may emit first-color light, the second emitting unit may emit second-color light, the third emitting unit may emit third-color light, and the maximum emission wavelength of the first-color light, the maximum emission wavelength of the second-color light, and the maximum emission wavelength of the third-color light may be identical to or different from each other.

As yet another example, when m is 4, a first electrode, a first emitting unit, a first charge generation unit, a second emitting unit, a second charge generation unit, a third emitting unit, a third charge generation unit, a fourth emitting unit, and a second electrode may be sequentially disposed. The first emitting unit may emit first-color light, the second emitting unit may emit second-color light, the third emitting unit may emit third-color light, the fourth emitting unit may emit fourth-color light, and the maximum emission wavelength of the first-color light, the maximum emission wavelength of the second-color light, the maximum emission wavelength of the third-color light, and the maximum emission wavelength of the fourth color light may be identical to or different from each other.

In an embodiment, a maximum emission wavelength of light emitted from at least one of the m emitting units may be different from a maximum emission wavelength of light emitted from at least one of the remainder of the m emitting units.

In the light-emitting device according to an embodiment, at least one of the m emitting units may include the emission layer, the first layer, the second layer, and the third layer.

For example, the $m^{th}$ emitting unit, which may be the emitting unit closest to the second electrode 150, may include the hole transport region, the emission layer, and the electron transport region, wherein the electron transport region may include the first layer, the second layer, and the third layer.

Figure 2:
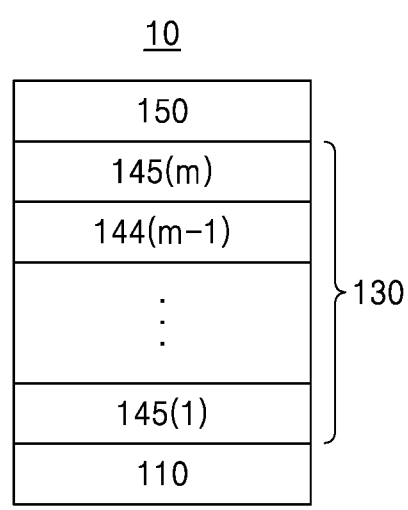
FIG. 2 is a schematic cross-sectional view of a light-emitting device according to an embodiment.
Figure 3:
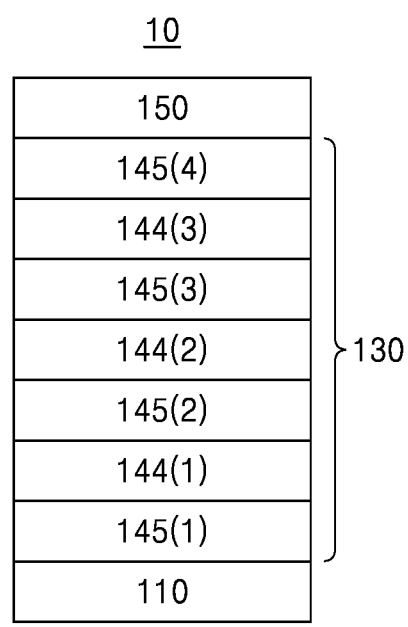
FIG. 3 is a schematic cross-sectional view of a light-emitting device according to another embodiment.

Referring to FIGS. 2 and 3, the $m^{th}$ emitting unit which is closest to the second electrode 150 among the m emitting units may be referred to as the $m^{th}$ emitting unit (145(m)).

The emitting unit that is closest to the first electrode among m emitting units is the first emitting unit (145(1)), the farthest emitting unit from the first electrode is the $m^{th}$ emitting unit (145(m)), and the first emitting unit (ELU(1)) to the $m^{th}$ emitting unit (ELU(m)) are arranged sequentially. Thus, an $m-1^{th}$ emitting unit (145(m-1)) may be located between the first electrode (145(1)) and the $m^{th}$ emitting unit (145(m)).

Another aspect provides an electronic apparatus including the light-emitting device. The electronic apparatus may further include a thin-film transistor. For example, the electronic apparatus may further include a thin-film transistor including a source electrode and a drain electrode, wherein the first electrode of the light-emitting device may be electrically connected to the source electrode or the drain electrode.

In an embodiment, the electronic apparatus may further include a color filter, a color conversion layer, a touch screen layer, a polarizing layer, or any combination thereof. For more details on the electronic apparatus, related descriptions provided herein may be referred to.

Description of FIGS. 1 to 3

FIGS. 1 to 3 are each a schematic cross-sectional view of a light-emitting device 10 according to an embodiment. The light-emitting device 10 includes a first electrode 110, an interlayer 130, and a second electrode 150.

In FIG. 2, the interlayer of the light-emitting device may include m emitting units (145(1), . . . 145(m-1), 145(m)) and m-1 charge generation units (144(1), . . . , 144(m-1)) located between the neighboring emitting units, wherein any one of the m emitting units (145(1), . . . 145(m-1), 145(m)) may include the emission layer, the first layer, the second layer, and the third layer.

FIG. 3 shows a light-emitting device wherein m is 4. Any one of the four emitting units 145(1), 145(2), 145(3), and 145(4) (hereinafter also referred to as the first emitting unit 145(1), the second emitting unit 145(2), the third emitting unit 145(3), and the fourth emitting unit 145(4)) may include the emission layer, the first layer, the second layer, and the third layer.

Hereinafter, the structure and manufacturing method of the light-emitting device 10 according to an embodiment will be described in connection with FIGS. 1 to 3.
[First Electrode 110]

Although not illustrated in FIG. 1, a substrate may be further included under the first electrode 110 or on the second electrode 150. The substrate may be a glass substrate or a plastic substrate, but is not limited thereto. In embodiments, the substrate may be a flexible substrate, and may include plastics with excellent heat resistance and durability, such as polyimide, polyethylene terephthalate (PET), polycarbonate, polyethylene napthalate, polyarylate (PAR), polyetherimide, or any combination thereof.

The first electrode 110 may be formed by, for example, depositing or sputtering a material for forming the first electrode 110 on the substrate. When the first electrode 110 is an anode, a material for forming the first electrode 110 may be a high-work function material that facilitates injection of holes.

The first electrode 110 may be a reflective electrode, a semi-transmissive electrode, or a transmissive electrode. When the first electrode 110 is a transmissive electrode, a material for forming the first electrode 110 may include indium tin oxide (ITO), indium zinc oxide (IZO), tin oxide ($SnO_2$), zinc oxide (ZnO), or any combination thereof. In embodiments, when the first electrode 110 is a semi-transmissive electrode or a reflective electrode, a material for forming the first electrode 110 may include magnesium (Mg), silver (Ag), aluminum (Al), aluminum-lithium (Al—Li), calcium (Ca), magnesium-indium (Mg—In), magnesium-silver (Mg—Ag), or any combination thereof.

The first electrode 110 may have a structure consisting of a single layer or a structure including multiple layers. For example, the first electrode 110 may have a three-layered structure of ITO/Ag/ITO.
[Interlayer 130]

The interlayer 130 may be located on the first electrode 110. The interlayer 130 may include an emission layer.

The interlayer 130 may further include a hole transport region located between the first electrode 110 and the emission layer, and an electron transport region located between the emission layer and the second electrode 150.

The interlayer 130 may further include, in addition to various organic materials, a metal-containing compound such as an organometallic compound, an inorganic material such as quantum dots, or the like.

In embodiments, the interlayer 130 may include two or more emitting units stacked between the first electrode 110 and the second electrode 150, and at least one charge generation unit located between the two or more emitting units. When the interlayer 130 includes the two or more emitting units and the at least one charge generation unit as described above, the light-emitting device 10 may be a tandem light-emitting device.
[Hole Transport Region in Interlayer 130]

The hole transport region may have a structure consisting of a layer consisting of a single material, a structure consisting of a layer consisting of different materials, or a structure including multiple layers including different materials.

The hole transport region may include a hole injection layer, a hole transport layer, an emission auxiliary layer, an electron blocking layer, or any combination thereof.

For example, the hole transport region may have a multi-layered structure including a hole injection layer/hole transport layer structure, a hole injection layer/hole transport layer/emission auxiliary layer structure, a hole injection layer/emission auxiliary layer structure, a hole transport layer/emission auxiliary layer structure, or a hole injection layer/hole transport layer/electron blocking layer structure, wherein the layers of each structure may be stacked from the first electrode 110 in its respective stated order, but the structure of the hole transport region is not limited thereto.

The hole transport region may include a compound represented by Formula 201, a compound represented by Formula 202, or any combination thereof:

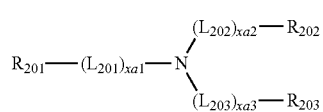

[Formula 201]

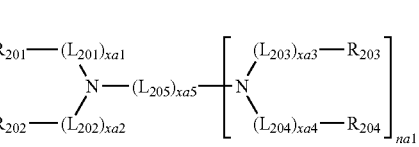

[Formula 202]

In Formulae 201 and 202, $L_{201}$ to $L_{204}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, $L_{205}$ may be *—O—*', *—S—*', *—N($Q_{201}$)—*', a $C_1$-$C_{20}$ alkylene group unsubstituted or substituted with at least one $R_{10a}$, a $C_2$-$C_{20}$ alkenylene group unsubstituted or substituted with at least one $R_{10a}$, a $C_3$-$C_{60}$ carbocyclic group unsubstituted or substituted with at least one $R_{10a}$, or a $C_1$-$C_{60}$ heterocyclic group unsubstituted or substituted with at least one $R_{10a}$, xa1 to xa4 may each independently be an integer from 0 to 5, xa5 may be an integer from 1 to 10, $R_{201}$ to $R_{204}$ and $Q_{201}$ may each independently be a $C_3$-$C_{60}$ carbocyclic group unsubstituted or substituted with at least one $R_{10a}$, or a $C_1$-$C_{60}$ heterocyclic group unsubstituted or substituted with at least one $R_{10a}$, $R_{201}$ and $R_{202}$ may optionally be linked to each other via a single bond, a $C_1$-$C_5$ alkylene group unsubstituted or substituted with at least one $R_{10a}$, or a $C_2$-$C_5$ alkenylene group unsubstituted or substituted with at least one $R_{10a}$, to form a $C_8$-$C_{60}$ polycyclic group (for example, a carbazole group or the like) unsubstituted or substituted with at least one $R_{10a}$ (for example, Compound HT16), $R_{203}$ and $R_{204}$ may optionally be linked to each other via a single bond, a $C_1$-$C_5$ alkylene group unsubstituted or substituted with at least one $R_{10a}$, or a $C_2$-$C_5$ alkenylene group unsubstituted or substituted with at least one $R_{10a}$, to form a $C_8$-$C_{60}$ polycyclic group unsubstituted or substituted with at least one $R_{10a}$, and na1 may be an integer from 1 to 4.

For example, each of Formulae 201 and 202 may include at least one of groups represented by Formulae CY201 to CY217:

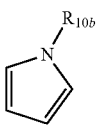
CY201

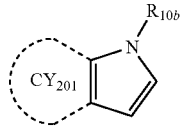
CY202

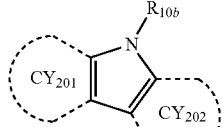
CY203

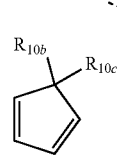
CY204

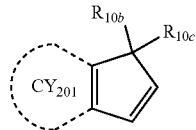
CY205

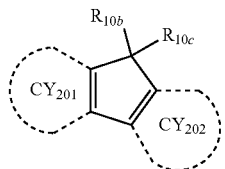
CY206

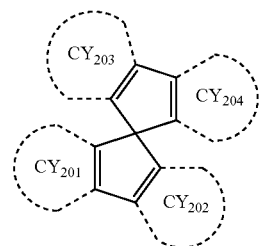
CY207

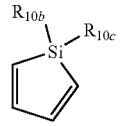
CY208

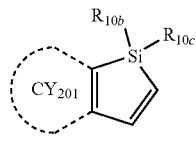
CY209

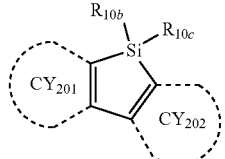
CY210

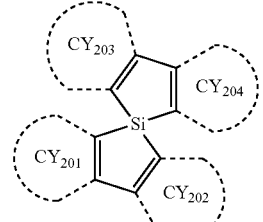
CY211

CY212

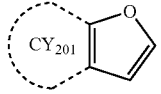
CY213

-continued

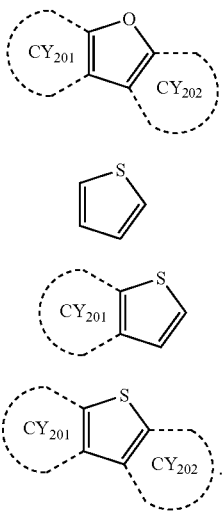

CY214

CY215

CY216

CY217

In Formulae CY201 to CY217, $R_{10b}$ and $R_{10c}$ may each independently be the same as described with respect to $R_{10a}$, ring $CY_{201}$ to ring $CY_{204}$ may each independently be a $C_3$-$C_{20}$ carbocyclic group or a $C_1$-$C_{20}$ heterocyclic group, and at least one hydrogen in Formulae CY201 to CY217 may be unsubstituted or substituted with $R_{10a}$ as described herein.

In an embodiment, ring $CY_{201}$ to ring $CY_{204}$ in Formulae CY201 to CY217 may each independently be a benzene group, a naphthalene group, a phenanthrene group, or an anthracene group.

In embodiments, each of Formulae 201 and 202 may include at least one of groups represented by Formulae CY201 to CY203.

In embodiments, Formula 201 may include at least one of the groups represented by Formulae CY201 to CY203 and at least one of the groups represented by Formulae CY204 to CY217.

In embodiments, in Formula 201, xa1 may be 1, $R_{201}$ may be a group represented by one of Formulae CY201 to CY203, xa2 may be 0, and $R_{202}$ may be a group represented by one of Formulae CY204 to CY207.

In embodiments, each of Formulae 201 and 202 may not include a group represented by one of Formulae CY201 to CY203.

In embodiments, each of Formulae 201 and 202 may not include a group represented by one of Formulae CY201 to CY203, and may include at least one of the groups represented by Formulae CY204 to CY217.

In embodiments, each of Formulae 201 and 202 may not include a group represented by one of Formulae CY201 to CY217.

In an embodiment, the hole transport region may include one of Compounds HT1 to HT46, m-MTDATA, TDATA, 2-TNATA, NPB(NPD), β-NPB, TPD, Spiro-TPD, Spiro-NPB, methylated NPB, TAPC, HMTPD, 4,4',4"-tris(N-carbazolyl)triphenylamine (TCTA), polyaniline/dodecylbenzenesulfonic acid (PANI/DBSA), poly(3,4-ethylenedioxythiophene)/poly(4-styrenesulfonate) (PEDOT/PSS), polyaniline/camphor sulfonic acid (PANI/CSA), polyaniline/poly(4-styrenesulfonate) (PANI/PSS), or any combination thereof:

HT1

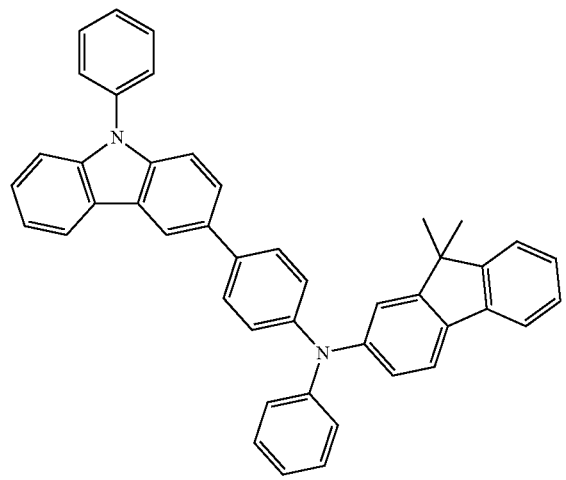

HT2

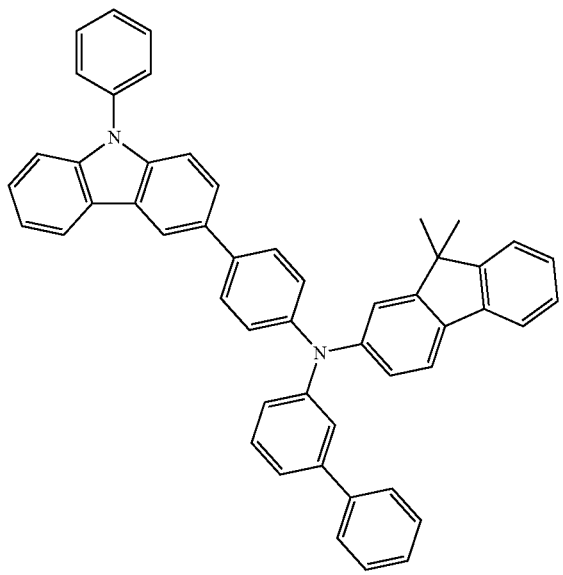

-continued
HT3
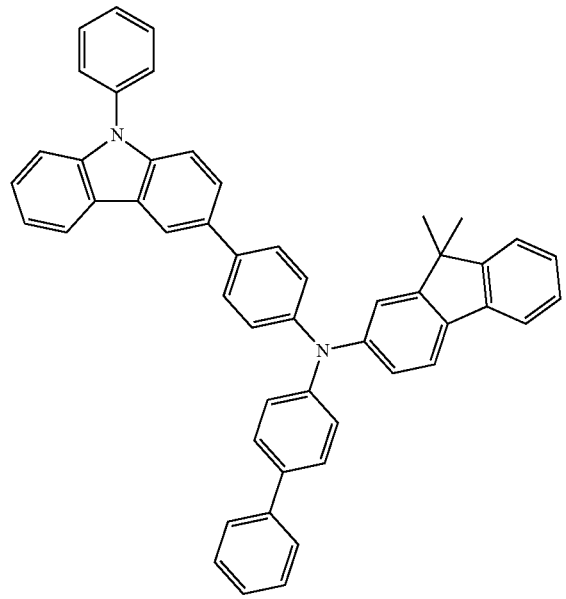
HT4
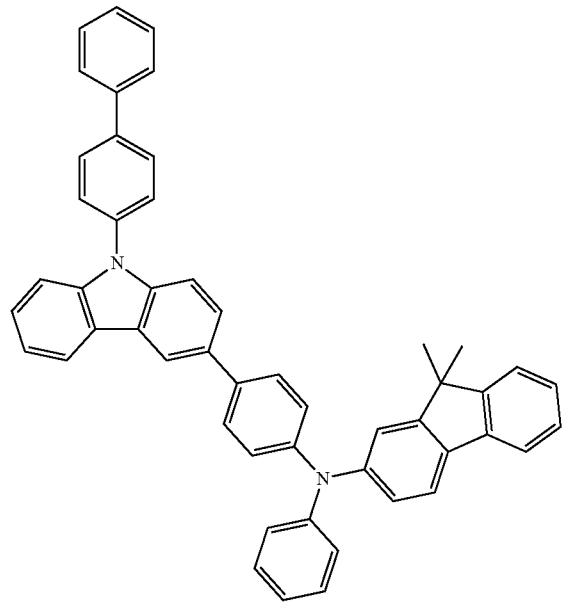
HT5
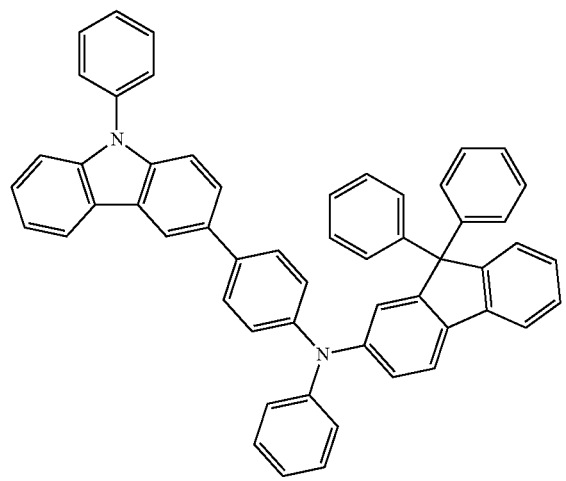
HT6
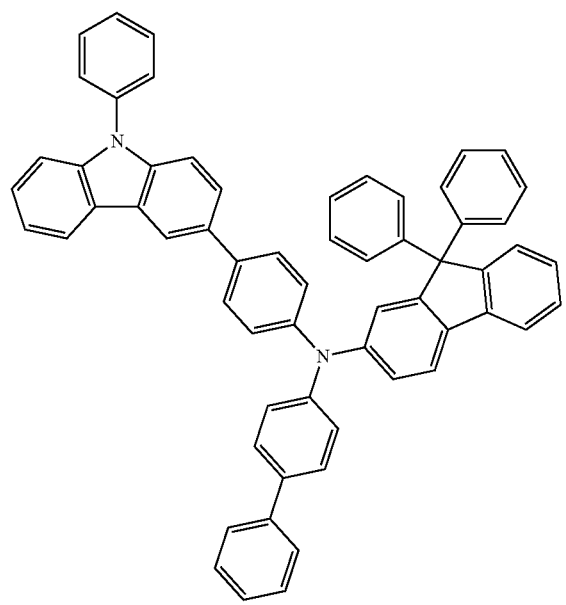

-continued
HT7
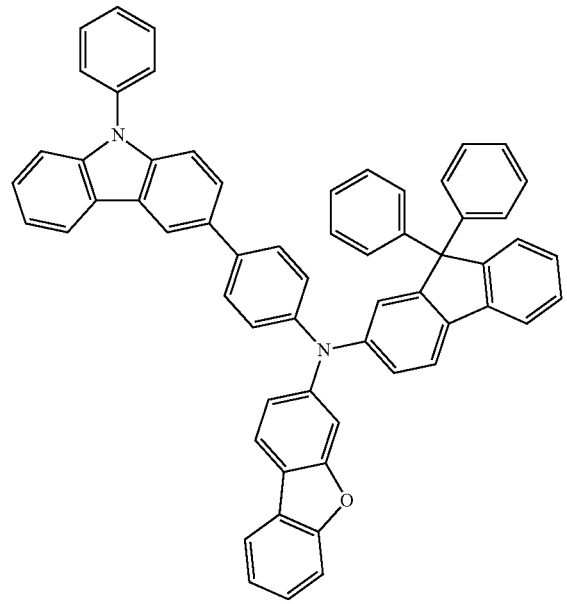
HT8
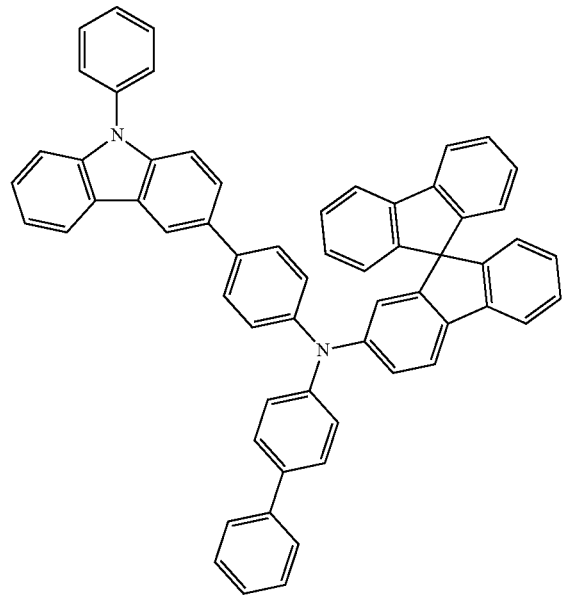
HT9
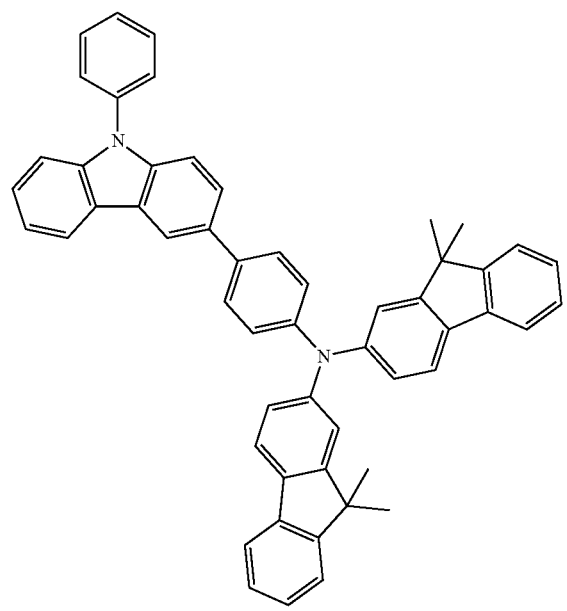
HT10
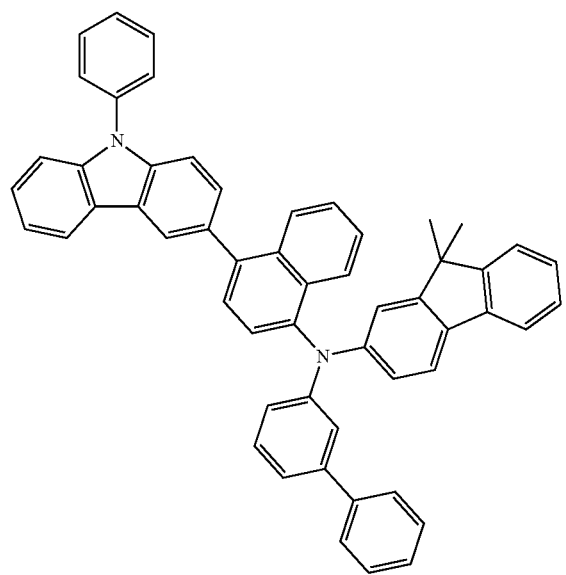

-continued
HT11
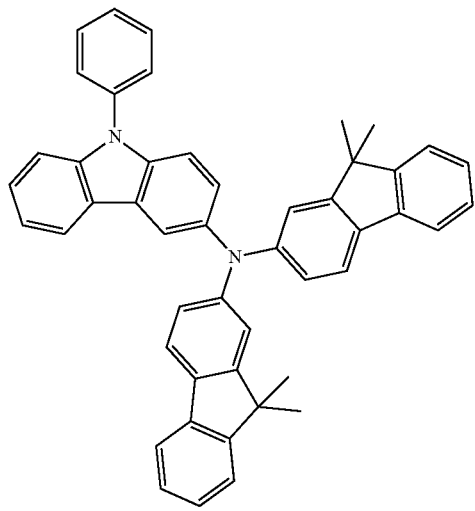
HT12
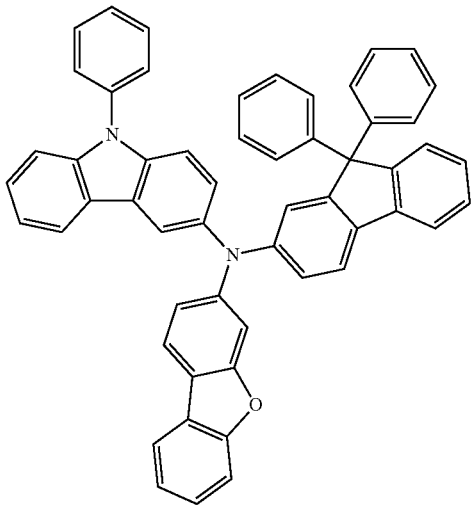
HT13
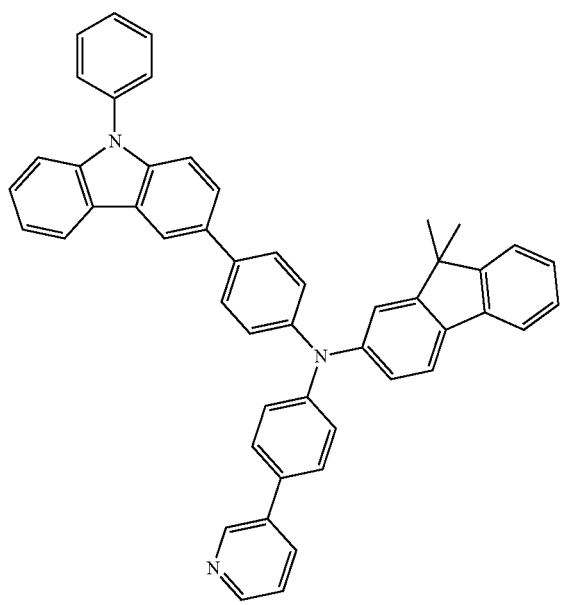
HT14
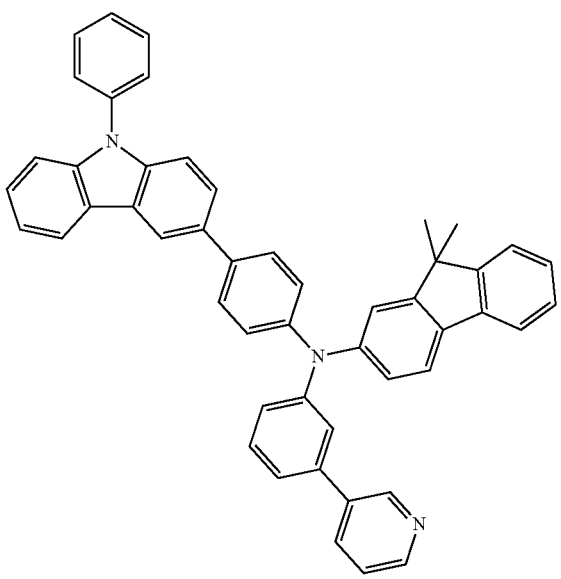
HT15
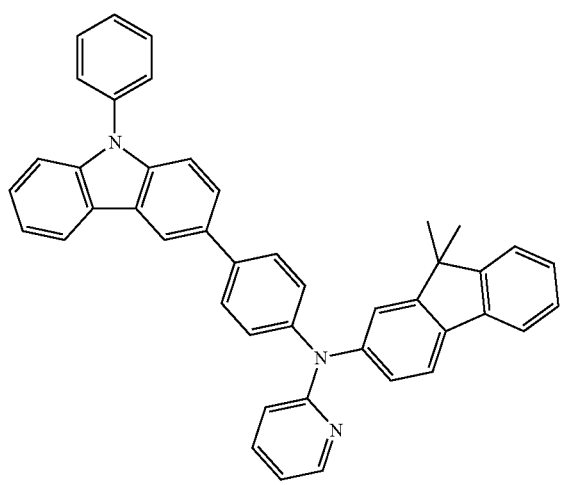
HT16
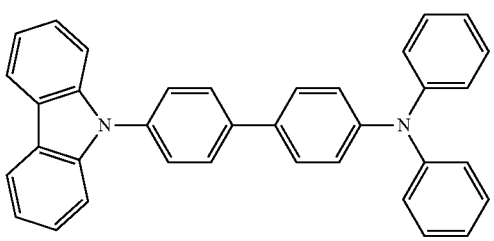

-continued
HT17
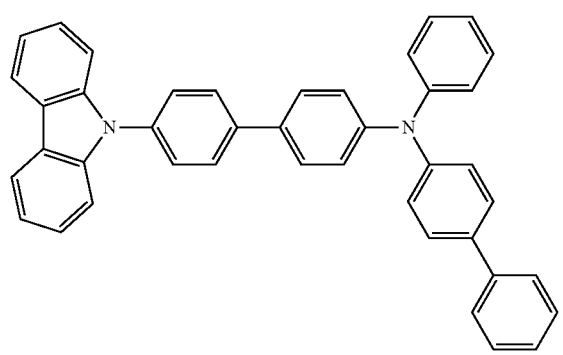
HT18
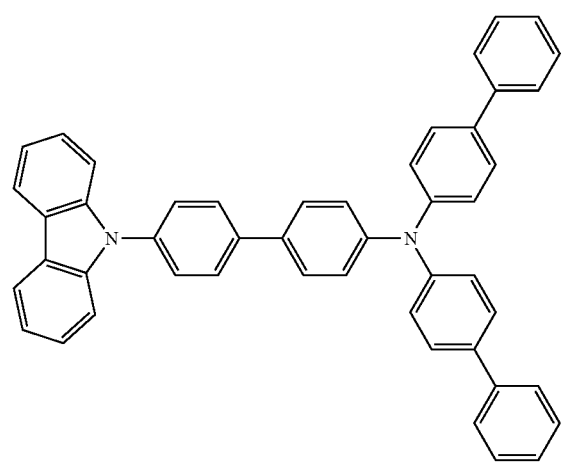
HT19
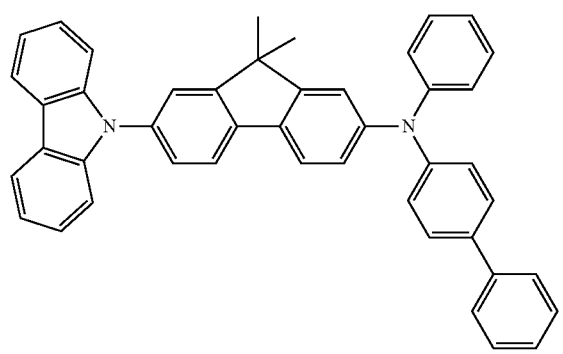
HT20
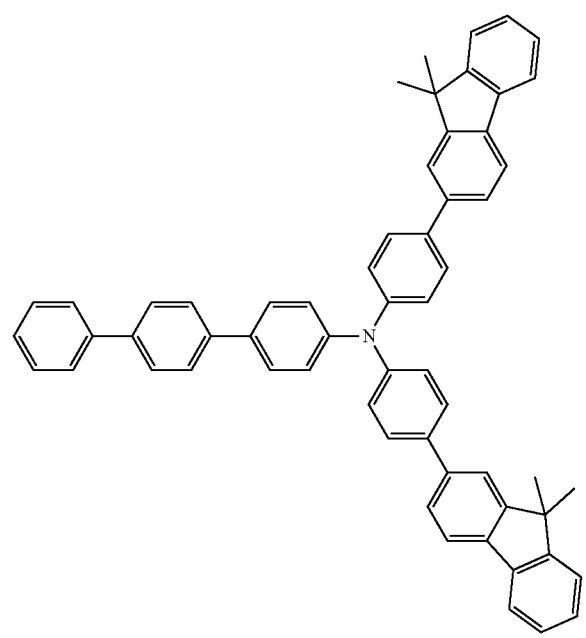

-continued
HT21
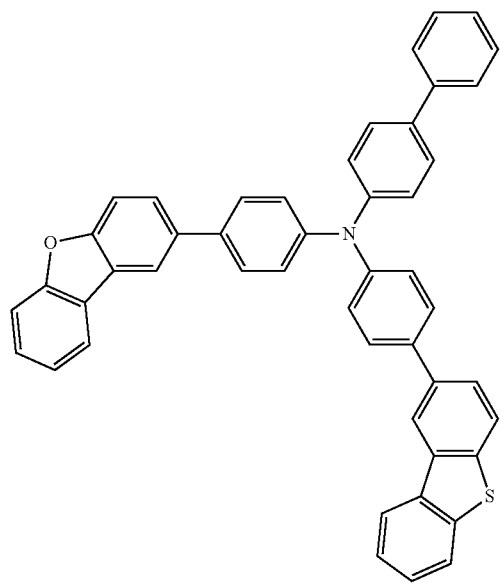
HT22
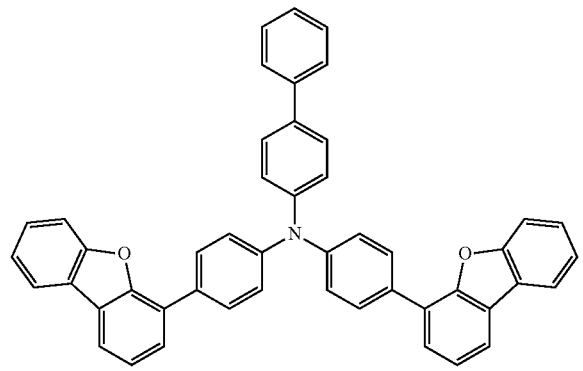
HT23
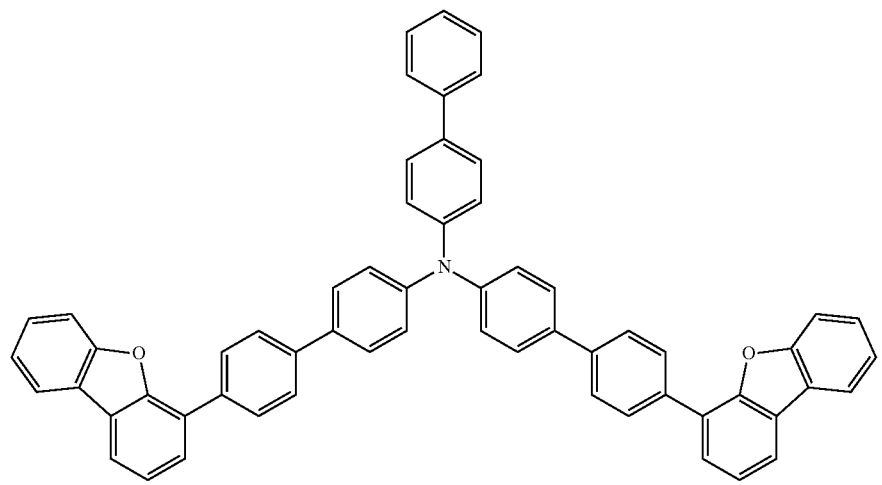

-continued
HT24
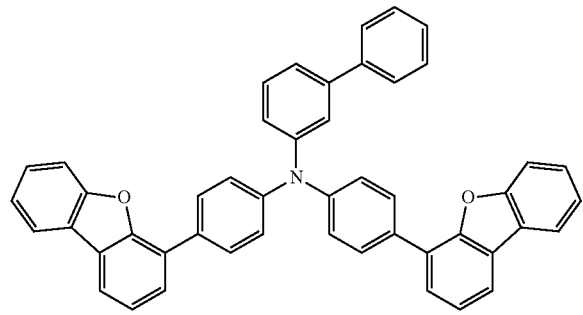
HT25
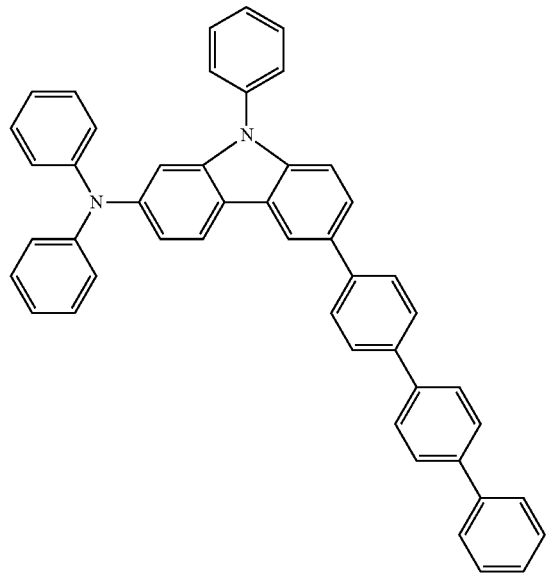
HT26
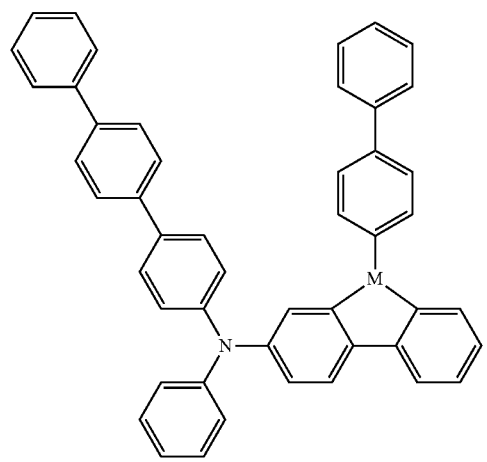
HT27
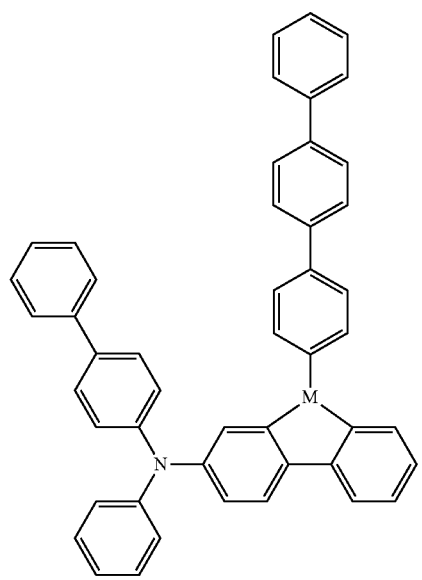
HT28
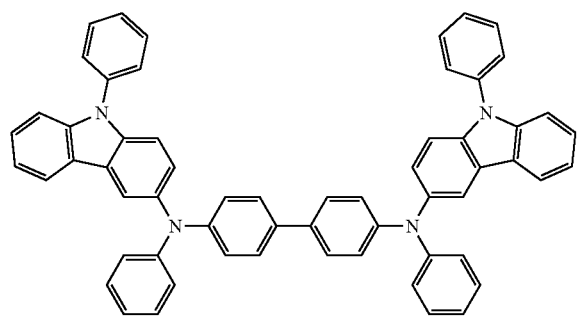
HT29
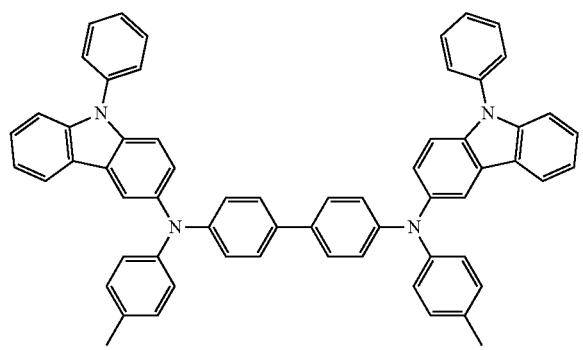

-continued
HT30
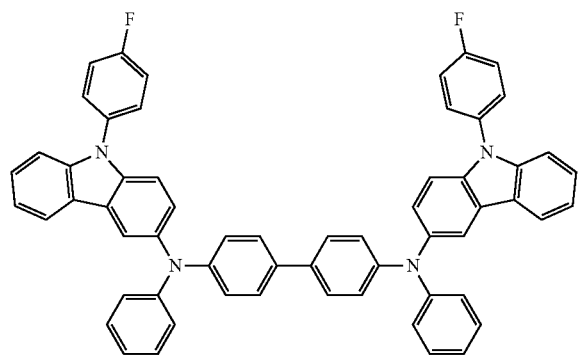
HT31
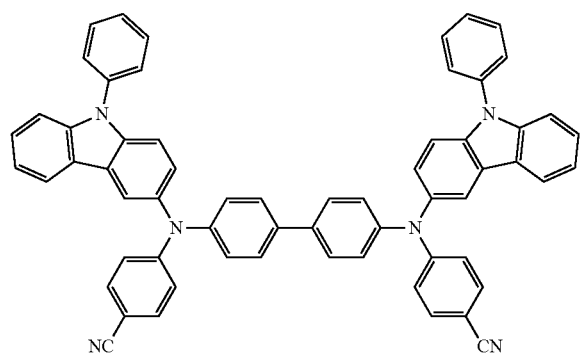
HT32
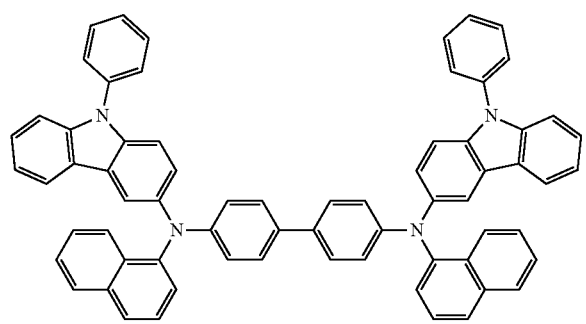
HT33
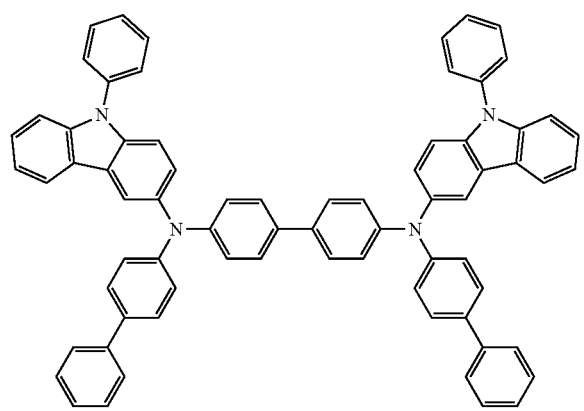
HT34
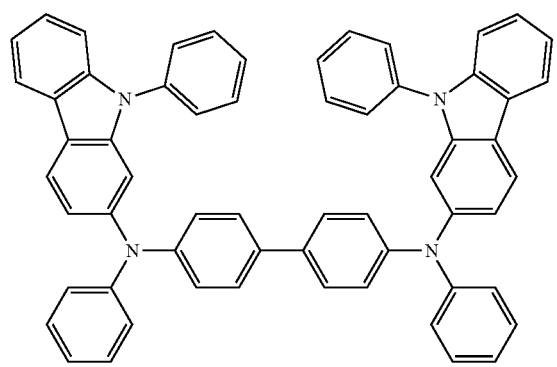
HT35
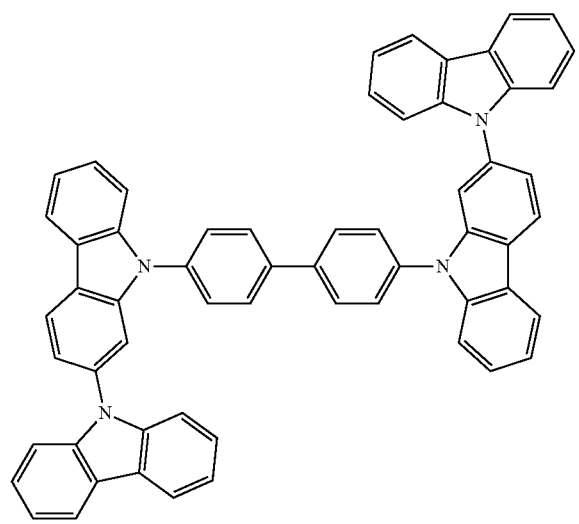

HT36
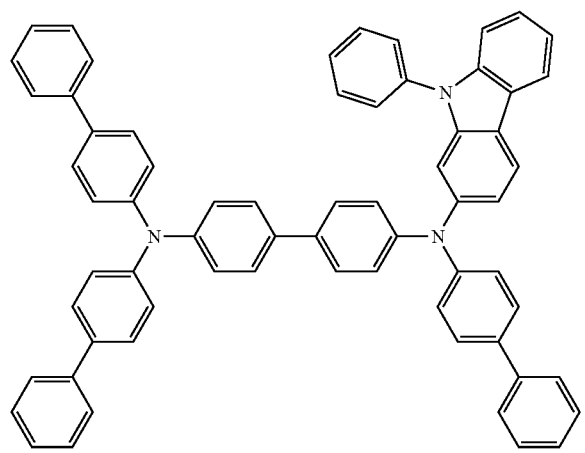
HT37
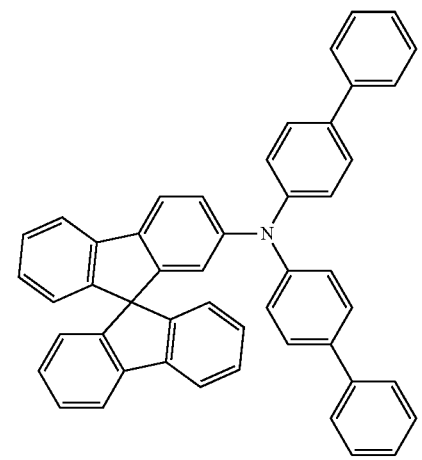
HT38
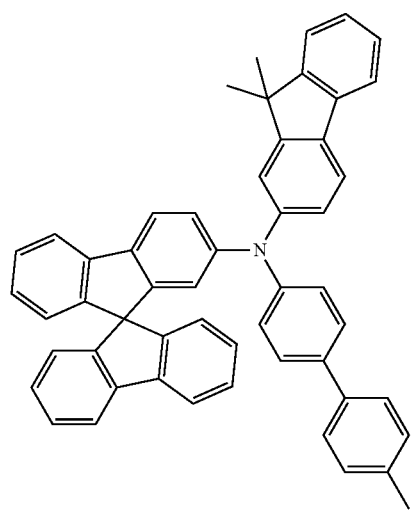
HT39
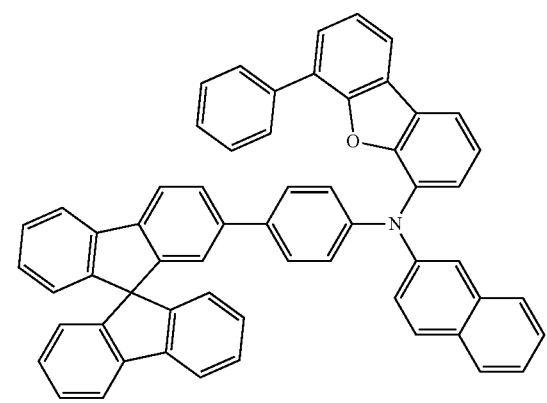
HT40
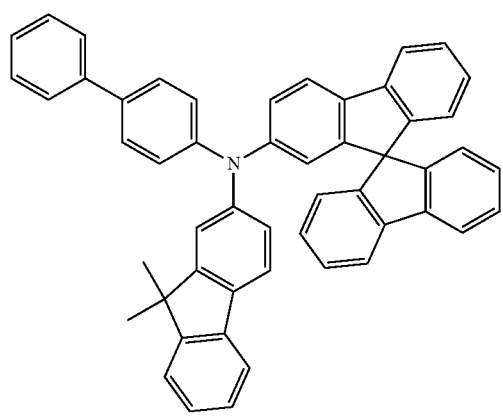
HT41
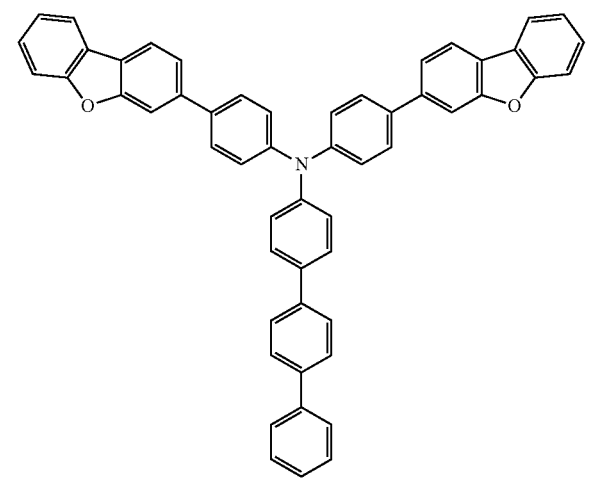

HT42
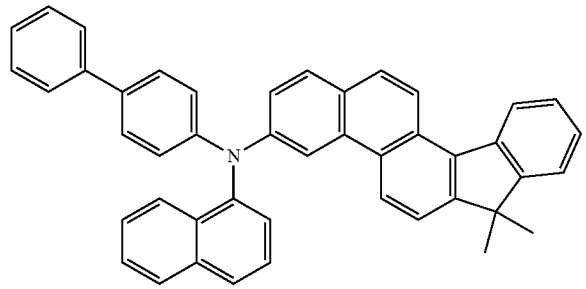
HT43
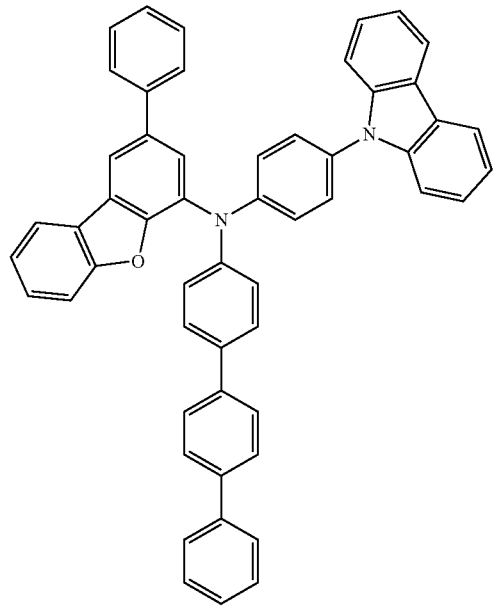
HT44
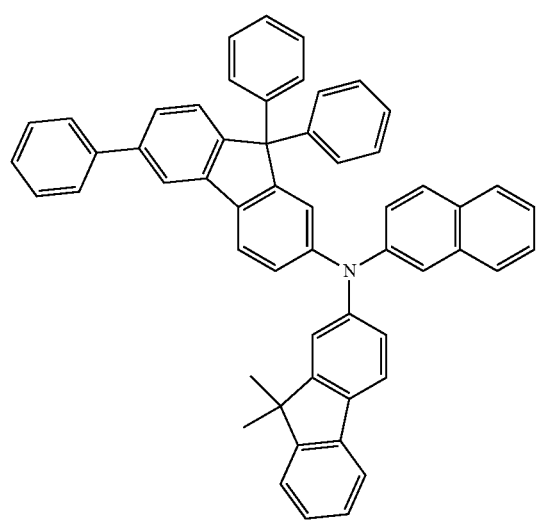
HT45
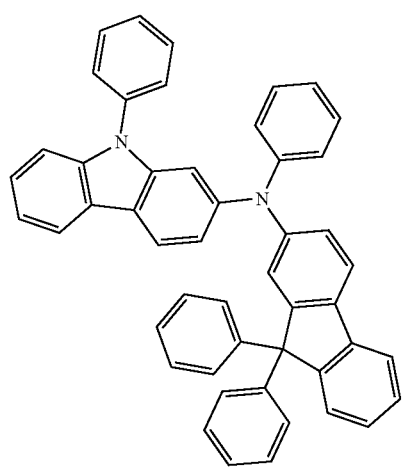

-continued
HT46
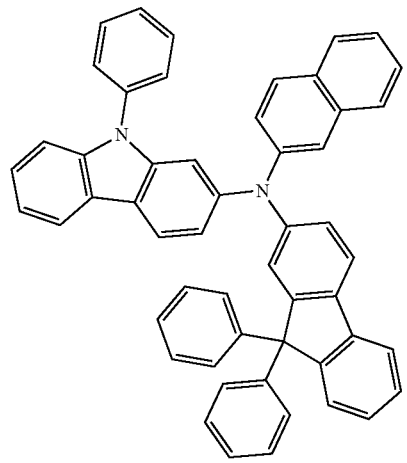
m-MTDATA
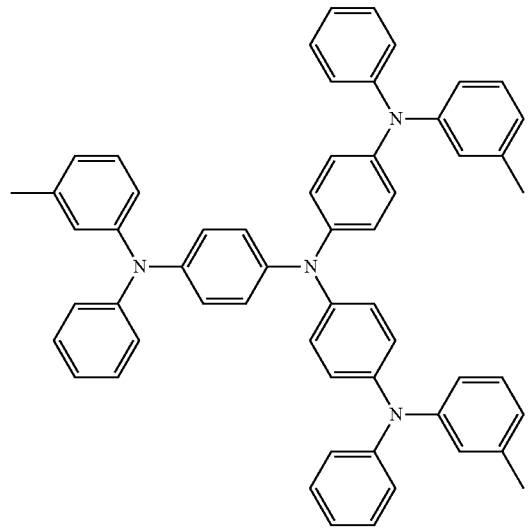
TDATA
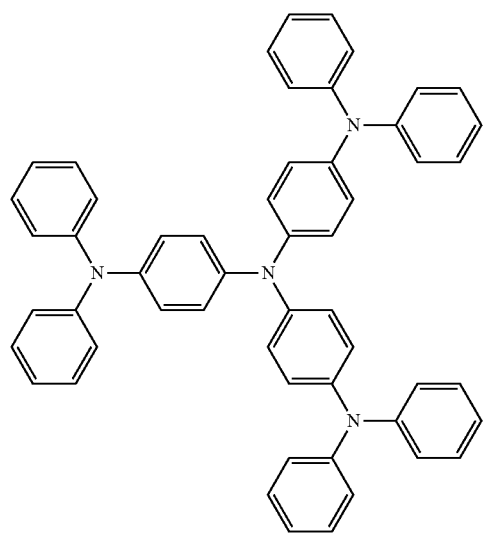
2-TNATA
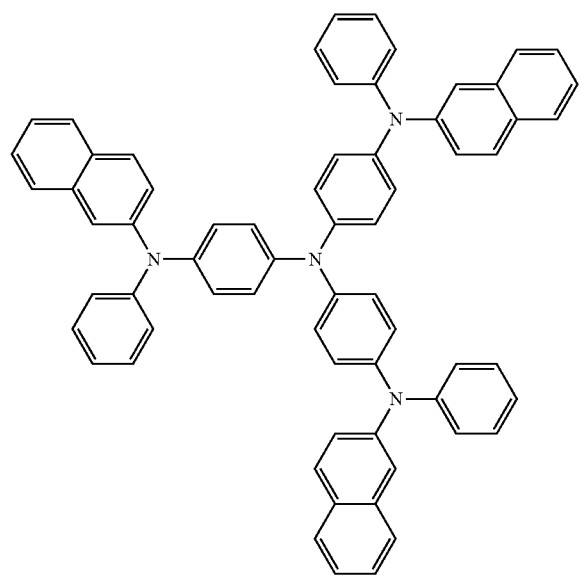
NPB
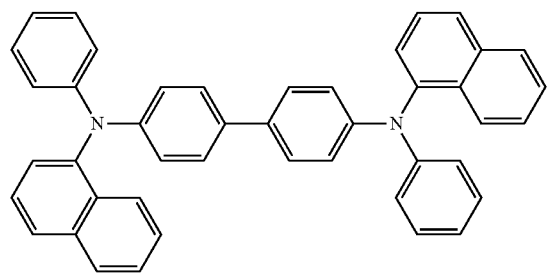
β-NPB
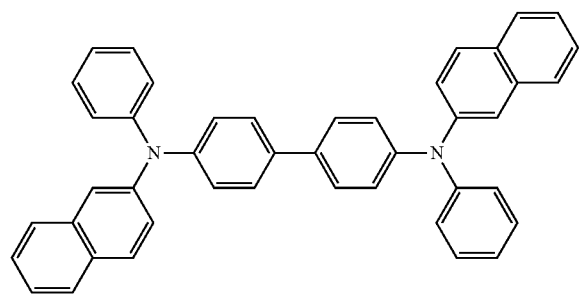

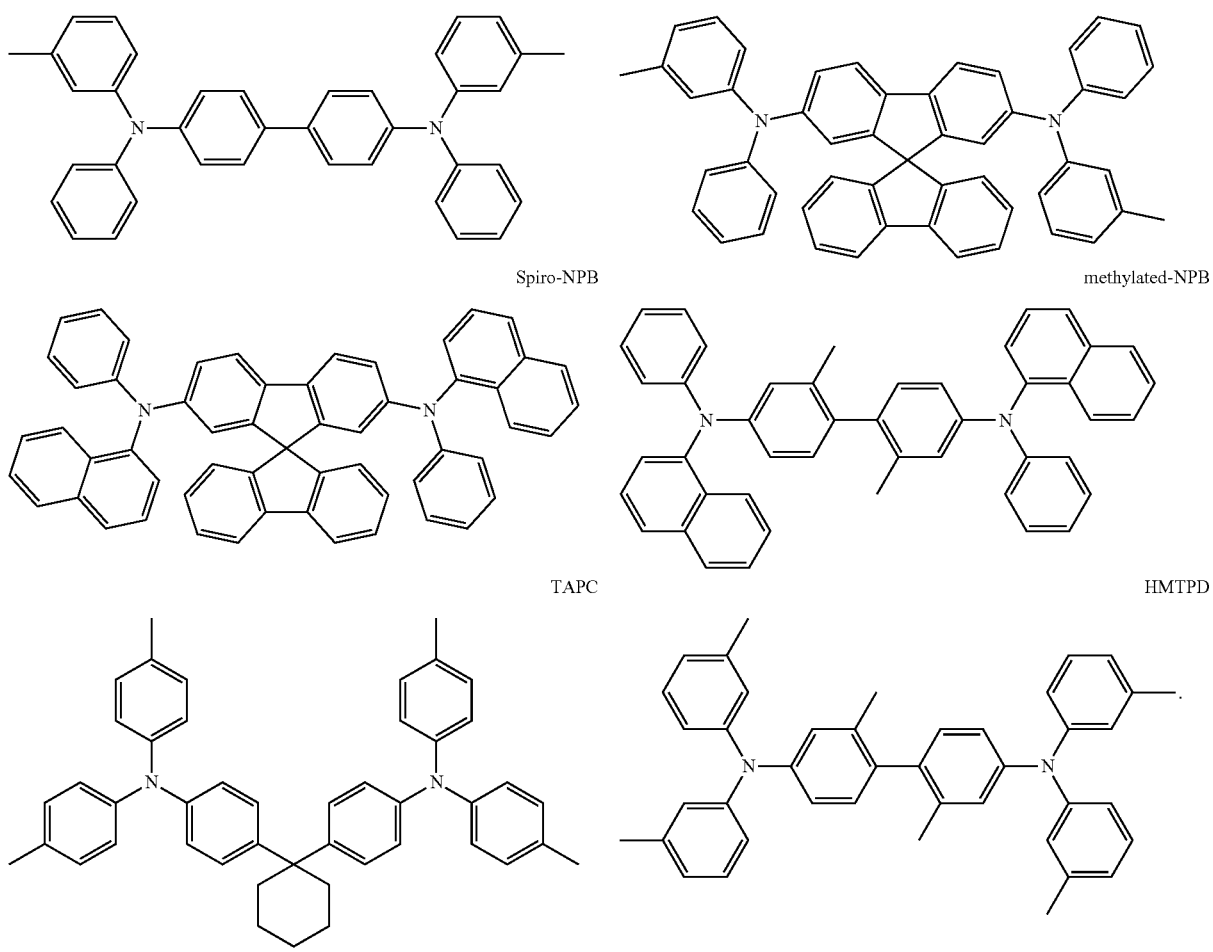

A thickness of the hole transport region may be in a range of about 50 Å to about 10,000 Å. For example, the thickness of the hole transport region may be in a range of about 100 Å to about 4,000 Å. When the hole transport region includes a hole injection layer, a hole transport layer, or any combination thereof, a thickness of the hole injection layer may be in a range of about 100 Å to about 9,000 Å, and a thickness of the hole transport layer may be in a range of about 50 Å to about 2,000 Å. For example, the thickness of the hole injection layer may be in a range of about 100 Å to about 1,000 Å. For example, the thickness of the hole transport layer may be in a range of about 100 Å to about 1,500 Å. When the thicknesses of the hole transport region, the hole injection layer, and the hole transport layer are within these ranges, satisfactory hole transporting characteristics may be obtained without a substantial increase in driving voltage.

The emission auxiliary layer may increase light-emission efficiency by compensating for an optical resonance distance according to a wavelength of light emitted by an emission layer, and the electron blocking layer may block the leakage of electrons from an emission layer to a hole transport region. Materials that may be included in the hole transport region may be included in the emission auxiliary layer and the electron blocking layer.

[p-Dopant]

The hole transport region may further include, in addition to these materials, a charge generation material for the improvement of conductive properties. The charge generation material may be uniformly or non-uniformly dispersed in the hole transport region (for example, in the form of a single layer consisting of a charge generation material).

The charge generation material may be, for example, a p-dopant.

For example, the lowest unoccupied molecular orbital (LUMO) energy level of the p-dopant may be equal to or less than about −3.5 eV.

In embodiments, the p-dopant may include a quinone derivative, a cyano group-containing compound, a compound including element EL1 and element EL2, or any combination thereof.

Examples of the quinone derivative may include TCNQ, F4-TCNQ, etc.

Examples of the cyano group-containing compound may include HAT-CN, and a compound represented by Formula 221:

TCNQ

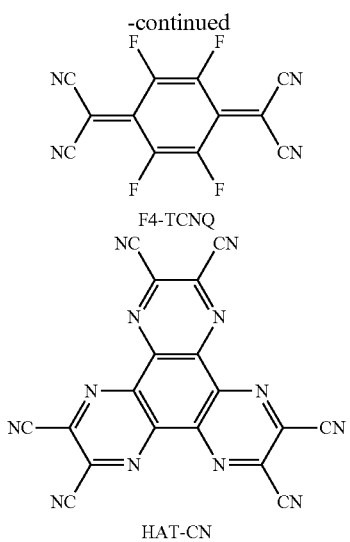

F4-TCNQ

HAT-CN

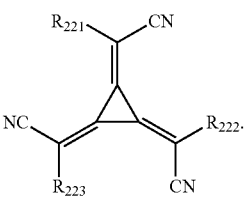

[Formula 221]

In Formula 221, $R_{221}$ to $R_{223}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, and at least one of $R_{221}$ to $R_{223}$ may each independently be a $C_3$-$C_{60}$ carbocyclic group or a $C_1$-$C_{60}$ heterocyclic group, each substituted with a cyano group; —F; —Cl; —Br; —I; a $C_1$-$C_{20}$ alkyl group substituted with a cyano group, —F, —Cl, —Br, —I, or any combination thereof; or any combination thereof.

In the compound including element EL1 and element EL2, element EL1 may be a metal, a metalloid, or any combination thereof, and element EL2 may be a non-metal, a metalloid, or any combination thereof.

Examples of the metal may include: an alkali metal (for example, lithium (Li), sodium (Na), potassium (K), rubidium (Rb), cesium (Cs), etc.); an alkaline earth metal (for example, beryllium (Be), magnesium (Mg), calcium (Ca), strontium (Sr), barium (Ba), etc.); a transition metal (for example, titanium (Ti), zirconium (Zr), hafnium (Hf), vanadium (V), niobium (Nb), tantalum (Ta), chromium (Cr), molybdenum (Mo), tungsten (W), manganese (Mn), technetium (Tc), rhenium (Re), iron (Fe), ruthenium (Ru), osmium (Os), cobalt (Co), rhodium (Rh), iridium (Ir), nickel (Ni), palladium (Pd), platinum (Pt), copper (Cu), silver (Ag), gold (Au), etc.); a post-transition metal (for example, zinc (Zn), indium (In), tin (Sn), etc.); and a lanthanide metal (for example, lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), lutetium (Lu), etc.).

Examples of the metalloid may include silicon (Si), antimony (Sb), and tellurium (Te).

Examples of the non-metal may include oxygen (O) and a halogen (for example, F, Cl, Br, I, etc.).

Examples of the compound including element EL1 and element EL2 may include a metal oxide, a metal halide (for example, a metal fluoride, a metal chloride, a metal bromide, or a metal iodide), a metalloid halide (for example, a metalloid fluoride, a metalloid chloride, a metalloid bromide, or a metalloid iodide), a metal telluride, or any combination thereof.

Examples of the metal oxide may include tungsten oxide (for example, $WO$, $W_2O_3$, $WO_2$, $WO_3$, $W_2O_5$, etc.), vanadium oxide (for example, $VO$, $V_2O_3$, $VO_2$, $V_2O_5$, etc.), molybdenum oxide ($MoO$, $Mo_2O_3$, $MoO_2$, $MoO_3$, $Mo_2O_5$, etc.), and rhenium oxide (for example, $ReO_3$, etc.).

Examples of the metal halide may include an alkali metal halide, an alkaline earth metal halide, a transition metal halide, a post-transition metal halide, and a lanthanide metal halide.

Examples of the alkali metal halide may include LiF, NaF, KF, RbF, CsF, LiCl, NaCl, KCl, RbCl, CsCl, LiBr, NaBr, KBr, RbBr, CsBr, LiI, NaI, KI, RbI, and CsI.

Examples of the alkaline earth metal halide may include $BeF_2$, $MgF_2$, $CaF_2$, $SrF_2$, $BaF_2$, $BeC_{l2}$, $MgC_{l2}$, $CaCl_2$, $SrCl_2$, $BaCl_2$, $BeBr_2$, $MgBr_2$, $CaBr_2$, $SrBr_2$, $BaBr_2$, $BeI_2$, $MgI_2$, $CaI_2$, $SrI_2$, and $BaI_2$.

Examples of the transition metal halide may include a titanium halide (for example, $TiF_4$, $TiCl_4$, $TiBr_4$, $TiI_4$, etc.), a zirconium halide (for example, $ZrF_4$, $ZrCl_4$, $ZrBr_4$, $ZrI_4$, etc.), a hafnium halide (for example, $HfF_4$, $HfCl_4$, $HfBr_4$, $HfI_4$, etc.), a vanadium halide (for example, $VF_3$, $VCl_3$, $VBr_3$, $VI_3$, etc.), a niobium halide (for example, $NbF_3$, $NbCl_3$, $NbBr_3$, $NbI_3$, etc.), a tantalum halide (for example, $TaF_3$, $TaCl_3$, $TaBr_3$, $TaI_3$, etc.), a chromium halide (for example, $CrF_3$, $CrCl_3$, $CrBr_3$, $CrI_3$, etc.), a molybdenum halide (for example, $MoF_3$, $MoCl_3$, $MoBr_3$, MoI3, etc.), a tungsten halide (for example, $WF_3$, $WCl_3$, $WBr_3$, $WI_3$, etc.), a manganese halide (for example, $MnF_2$, $MnCl_2$, $MnBr_2$, $MnI_2$, etc.), a technetium halide (for example, $TcF_2$, $TcCl_2$, $TcBr_2$, $TcI_2$, etc.), a rhenium halide (for example, $ReF_2$, $ReCl_2$, $ReBr_2$, $ReI_2$, etc.), an iron halide (for example, $FeF_2$, $FeCl_2$, $FeBr_2$, $FeI_2$, etc.), a ruthenium halide (for example, $RuF_2$, $RuCl_2$, $RuBr_2$, $RuI_2$, etc.), an osmium halide (for example, $OsF_2$, $OsCl_2$, $OsBr_2$, $OsI_2$, etc.), a cobalt halide (for example, $CoF_2$, $CoCl_2$, $CoBr_2$, $CoI_2$, etc.), a rhodium halide (for example, $RhF_2$, $RhCl_2$, $RhBr_2$, $RhI_2$, etc.), an iridium halide (for example, $IrF_2$, $IrCl_2$, $IrBr_2$, $IrI_2$, etc.), a nickel halide (for example, $NiF_2$, $NiCl_2$, $NiBr_2$, $NiI_2$, etc.), a palladium halide (for example, $PdF_2$, $PdCl_2$, $PdBr_2$, $PdI_2$, etc.), a platinum halide (for example, $PtF_2$, $PtCl_2$, $PtBr_2$, $PtI_2$, etc.), a copper halide (for example, CuF, CuCl, CuBr, CuI, etc.), a silver halide (for example, AgF, AgCl, AgBr, AgI, etc.), and a gold halide (for example, AuF, AuCl, AuBr, AuI, etc.).

Examples of the post-transition metal halide may include a zinc halide (for example, $ZnF_2$, $ZnCl_2$, $ZnBr_2$, $ZnI_2$, etc.), an indium halide (for example, $InI_3$, etc.), and a tin halide (for example, $SnI_2$, etc.).

Examples of the lanthanide metal halide may include YbF, $YbF_2$, $YbF_3$, $SmF_3$, YbCl, $YbCl_2$, $YbCl_3$ $SmCl_3$, YbBr, $YbBr_2$, $YbBr_3$ $SmBr_3$, YbI, $YbI_2$, $YbI_3$, and $SmI_3$.

Examples of the metalloid halide may include an antimony halide (for example, $SbCl_5$, etc.).

Examples of the metal telluride may include an alkali metal telluride (for example, $Li_2Te$, a $Na_2Te$, $K_2Te$, $Rb_2Te$, $Cs_2Te$, etc.), an alkaline earth metal telluride (for example, BeTe, MgTe, CaTe, SrTe, BaTe, etc.), a transition metal telluride (for example, $TiTe_2$, $ZrTe_2$, $HfTe_2$, $V_2Te_3$, $Nb_2Te_3$, $Ta_2Te_3$, $Cr_2Te_3$, $Mo_2Te_3$, $W_2Te_3$, MnTe, TcTe, ReTe, FeTe, RuTe, OsTe, CoTe, RhTe, IrTe, NiTe, PdTe, PtTe, $Cu_2Te$, CuTe, $Ag_2Te$, AgTe, $Au_2Te$, etc.), a post-transition metal telluride (for example, ZnTe, etc.), and a lanthanide metal telluride (for example, LaTe, CeTe, PrTe, NdTe, PmTe, EuTe, GdTe, TbTe, DyTe, HoTe, ErTe, TmTe, YbTe, LuTe, etc.).

[Emission Layer in Interlayer 130]

When the light-emitting device 10 is a full-color light-emitting device, the emission layer may be patterned into a red emission layer, a green emission layer, and/or a blue emission layer, according to a subpixel. In embodiments, the emission layer may have a stacked structure of two or more layers of a red emission layer, a green emission layer, and a blue emission layer, in which the two or more layers may contact each other or may be separated from each other to emit white light. In embodiments, the emission layer may include two or more materials of a red light-emitting material, a green light-emitting material, and a blue light-emitting material, in which the two or more materials are mixed with each other in a single layer to emit white light.

The emission layer may include a host and a dopant. The dopant may include a phosphorescent dopant, a fluorescent dopant, or any combination thereof.

An amount of the dopant in the emission layer may be in a range of about 0.01 part by weight to about 15 parts by weight, based on 100 parts by weight of the host.

In embodiments, the emission layer may include a quantum dot.

In an embodiment, the emission layer may include a delayed fluorescence material. The delayed fluorescence material may serve as a host or as a dopant in the emission layer.

A thickness of the emission layer may be in a range of about 100 Å to about 1,000 Å. For example, the thickness of the emission layer may be in a range of about 200 Å to about 600 Å. When the thickness of the emission layer is within these ranges, excellent light-emission characteristics may be obtained without a substantial increase in driving voltage.

[Host]

In embodiments, the host may include a compound represented by Formula 301:

[$Ar_{301}$]$_{xb11}$-[($L_{301}$)$_{xb1}$-$R_{301}$]$_{xb21}$  [Formula 301]

In Formula 301, $Ar_{301}$ and $L_{301}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, xb11 may be 1, 2, or 3, xb1 may be an integer from 0 to 5, $R_{301}$ may be hydrogen, deuterium, —F, —Cl, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, —Si($Q_{301}$)($Q_{302}$)($Q_{303}$), —N($Q_{301}$)($Q_{302}$), —B($Q_{301}$)($Q_{302}$), —C(=O)($Q_{301}$), —S(=O)$_2$($Q_{301}$), or —P(=O)($Q_{301}$)($Q_{302}$), xb21 may be an integer from 1 to 5, and $Q_{301}$ to $Q_{303}$ are each independently the same as described herein with respect to $Q_1$.

For example, when xb11 in Formula 301 is 2 or more, two or more of $Ar_{301}$(s) may be linked to each other via a single bond.

In embodiments, the host may include a compound represented by Formula 301-1, a compound represented by Formula 301-2, or any combination thereof:

[Formula 301-1]

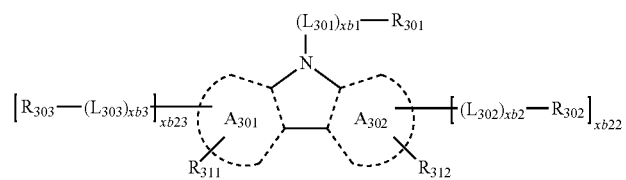

[Formula 301-2]

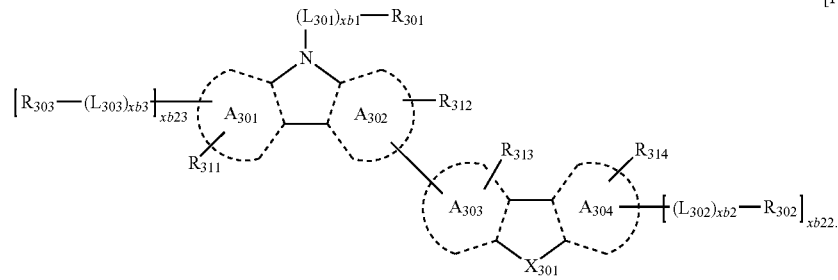

In Formulae 301-1 and 301-2, ring $A_{301}$ to ring $A_{304}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, $X_{301}$ may be O, S, N-[($L_{304}$)$_{xb4}$-$R_{304}$], C($R_{304}$)($R_{305}$), or Si($R_{304}$)($R_{305}$), xb22 and xb23 may each independently be 0, 1, or 2, $L_{301}$, xb1, and $R_{301}$ are each the same as described herein, $L_{302}$ to $L_{304}$ are each independently the same as described herein with respect to with $L_{301}$, xb2 to xb4 are each independently the same as described herein with respect to xb1, and $R_{302}$ to $R_{305}$ and $R_{311}$ to $R_{314}$ are each independently the same as described herein with respect to $R_{301}$.

In embodiments, the host may include an alkali earth metal complex, a post-transition metal complex, or any combination thereof. For example, the host may include a Be complex (for example, Compound H55), an Mg complex, a Zn complex, or any combination thereof.

In an embodiment, the host may include one of Compounds H1 to H124, 9,10-di(2-naphthyl)anthracene (ADN), 2-methyl-9,10-bis(naphthalen-2-yl)anthracene (MADN), 9,10-di-(2-naphthyl)-2-t-butyl-anthracene (TBADN), 4,4'-bis(N-carbazolyl)-1,1'-biphenyl (CBP), 1,3-di-9-carbazolyl-benzene (mCP), 1,3,5-tri(carbazol-9-yl)benzene (TCP), or any combination thereof:

H1

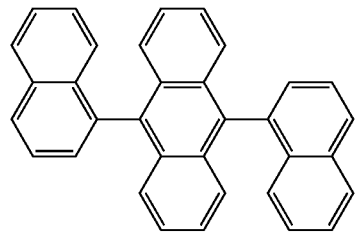

H2

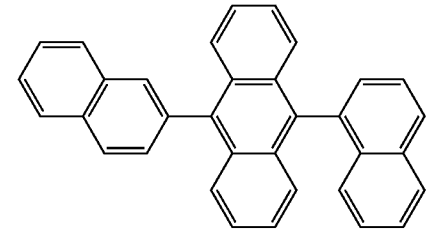

H3

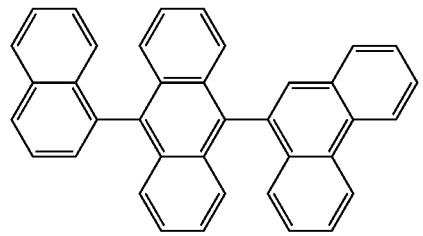

H4

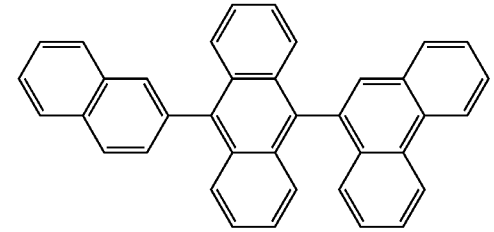

H5

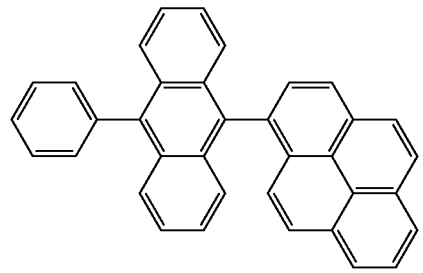

H6

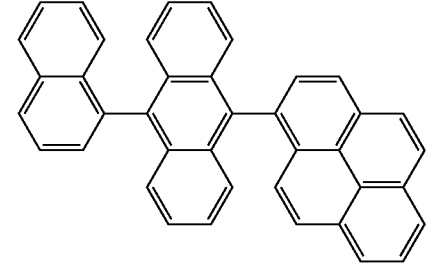

H7

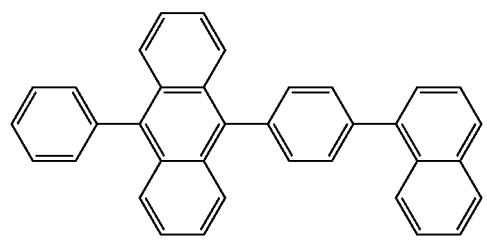

H8

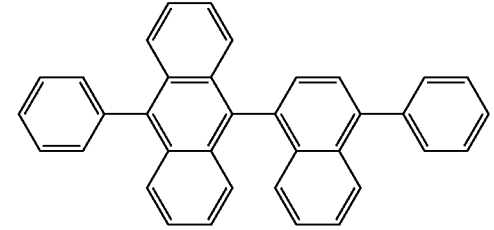

H9

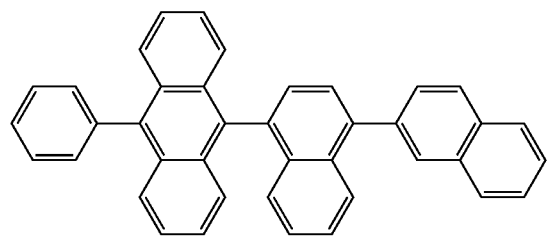

H10

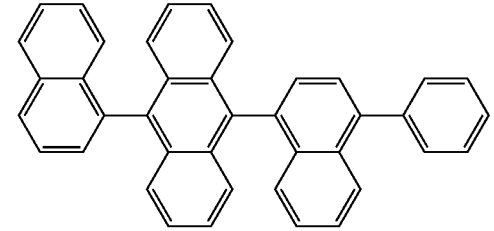

-continued
H11
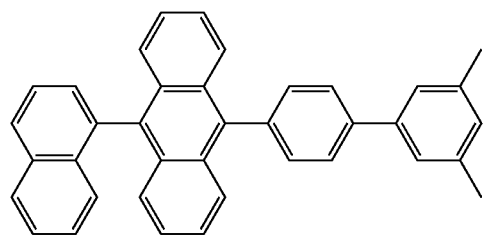
H12
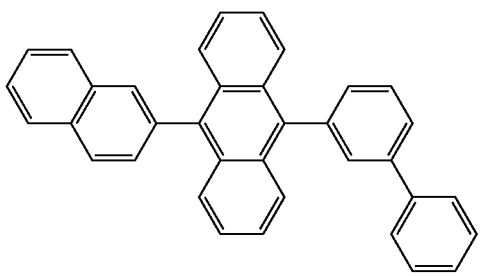
H13
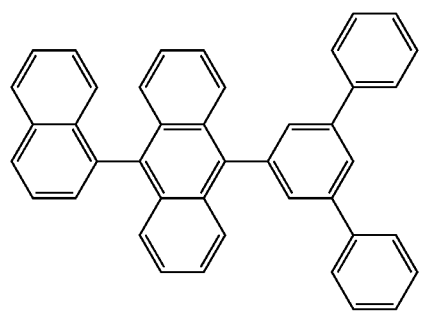
H14
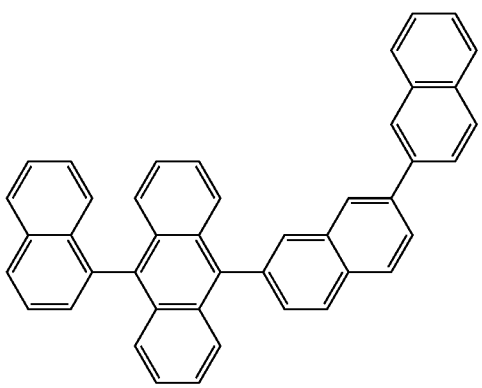
H15
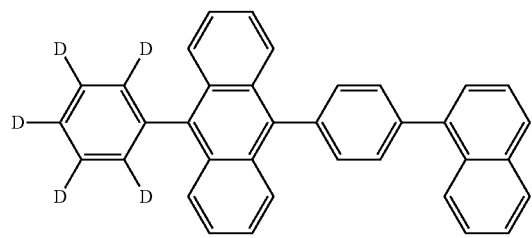
H16
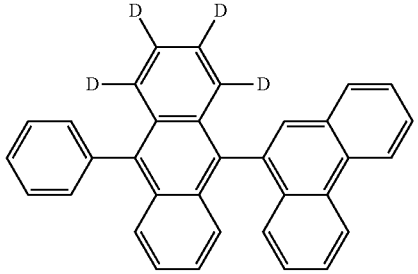
H17
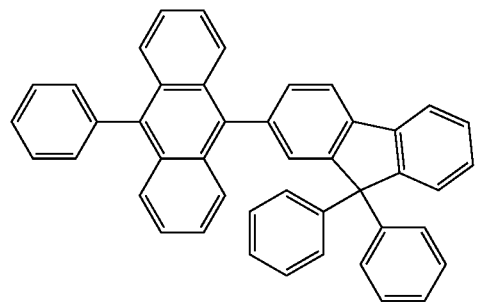
H18
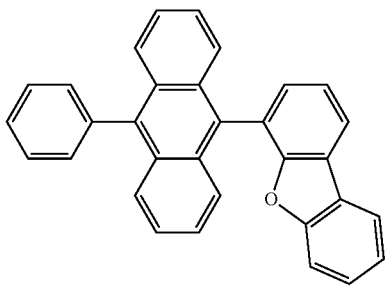
H19
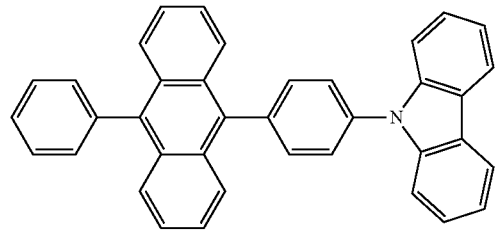
H20
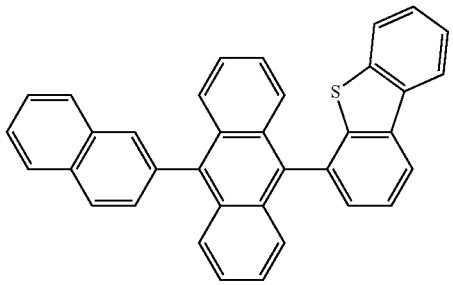

-continued
H21
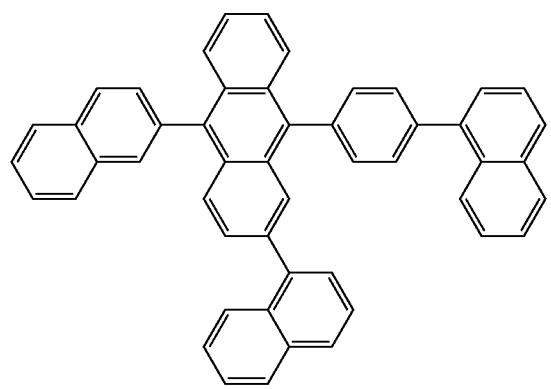
H22
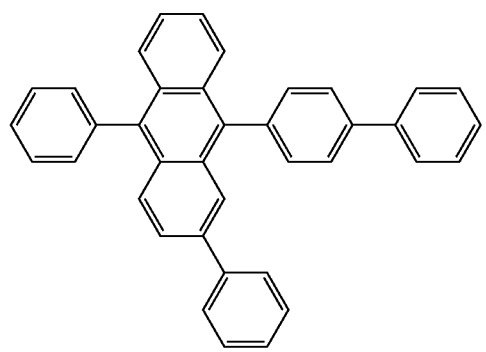
H23
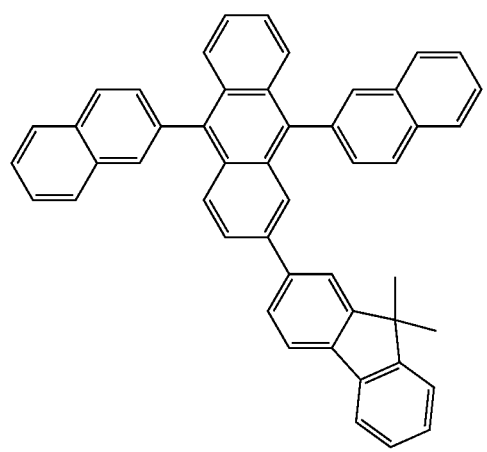
H24
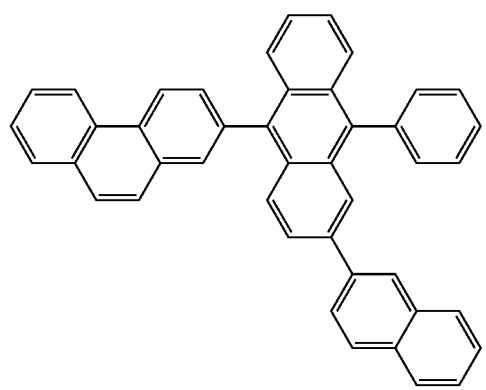
H25
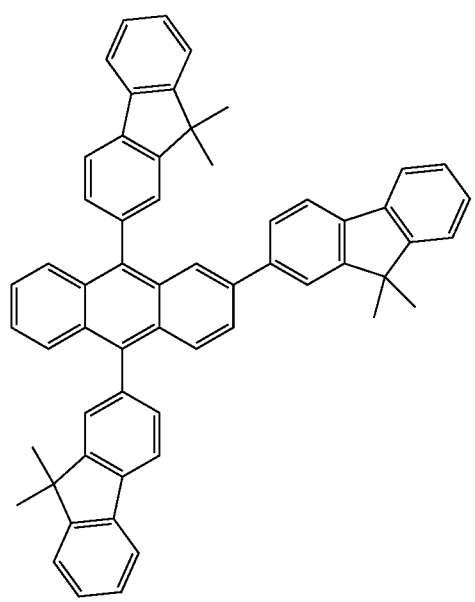
H26
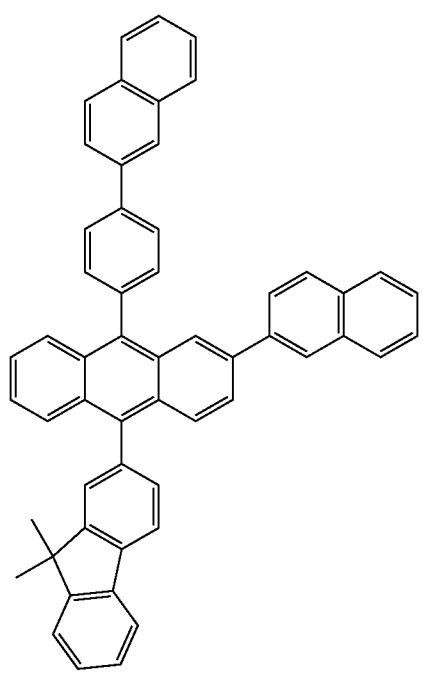

-continued
H27
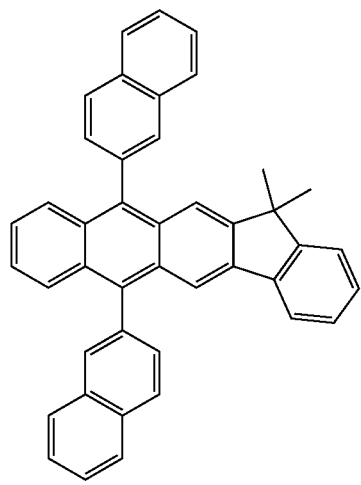
H28
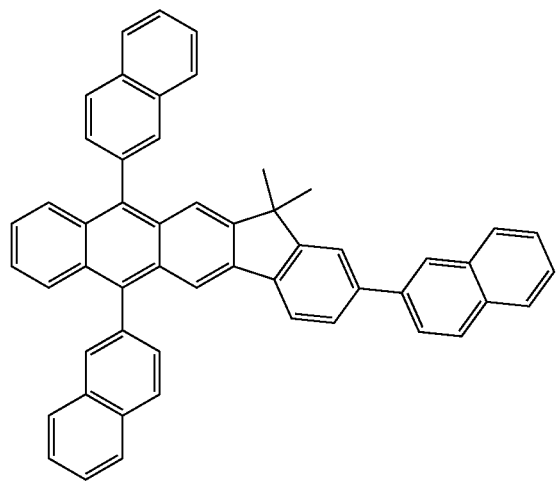
H29
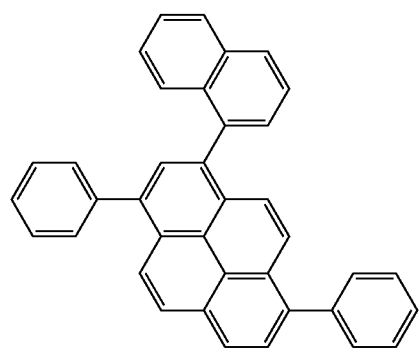
H30
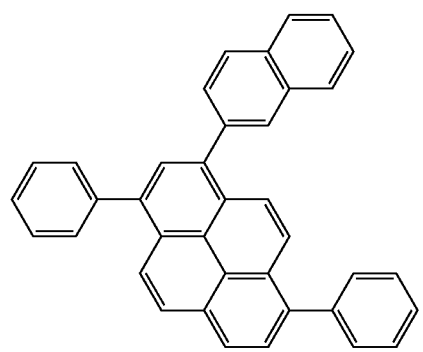
H31
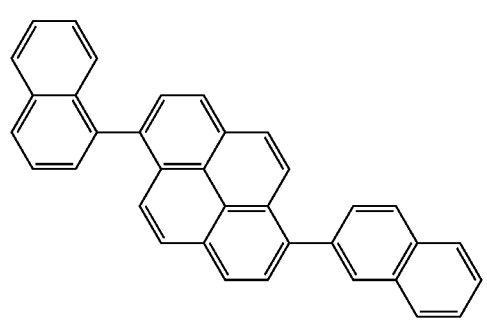
H32
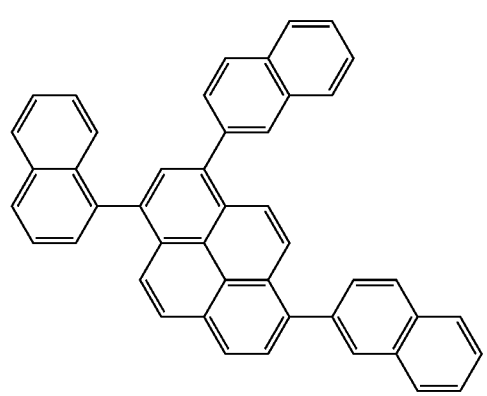
H33
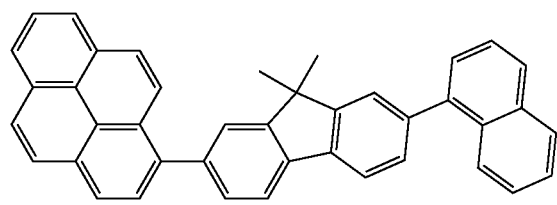
H34
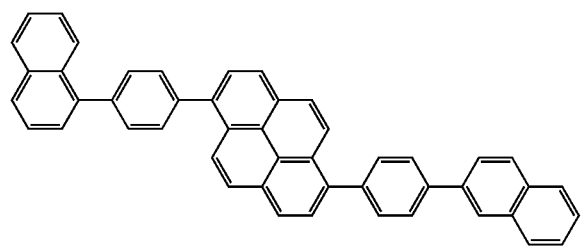

-continued
H35
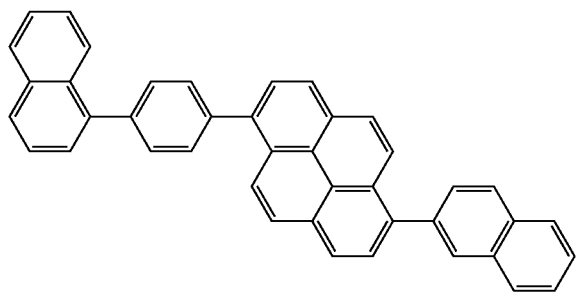
H36
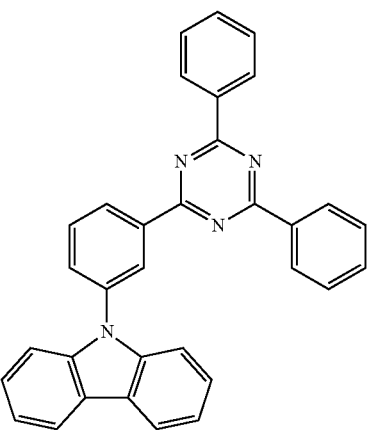
H37
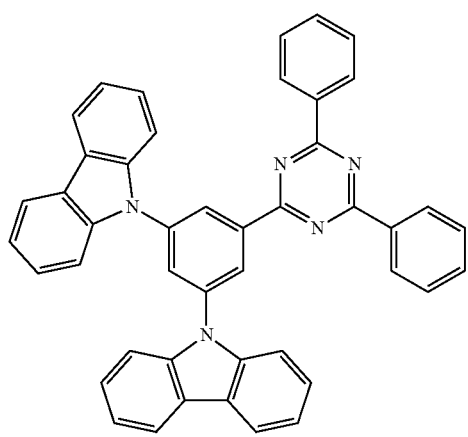
H38
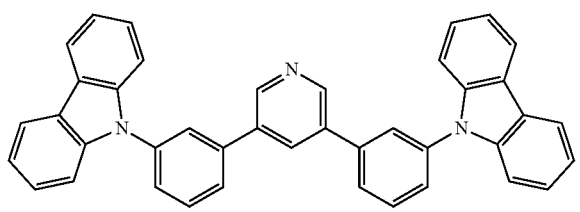
H39
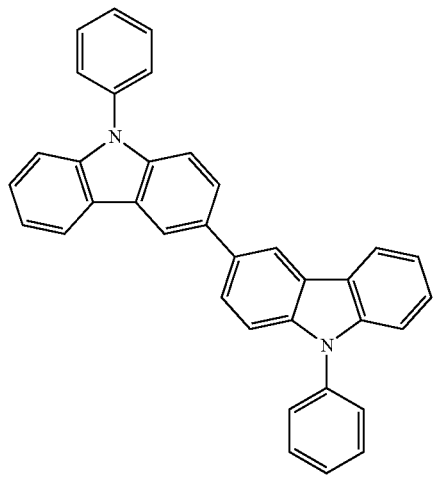
H40
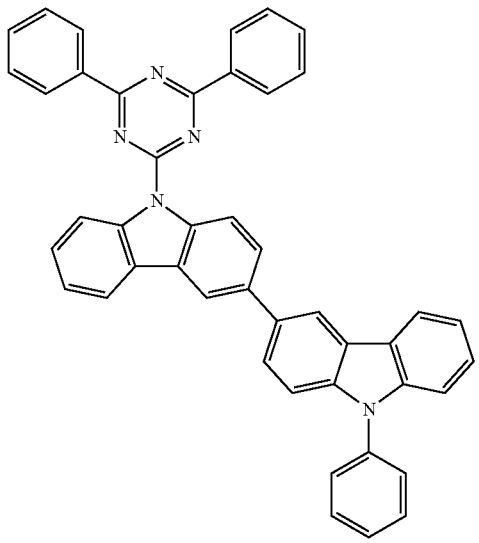

-continued
H41
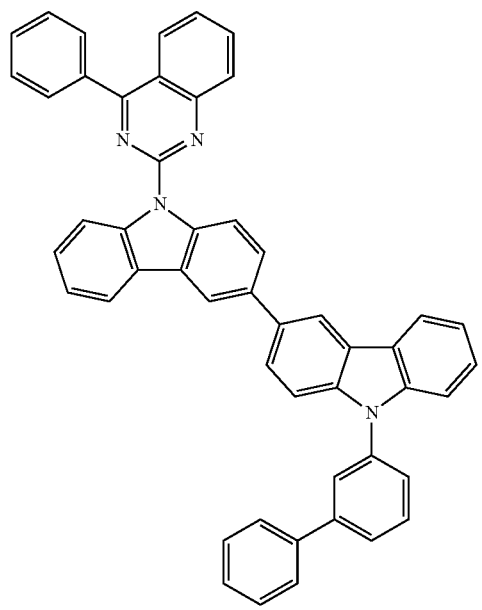
H42
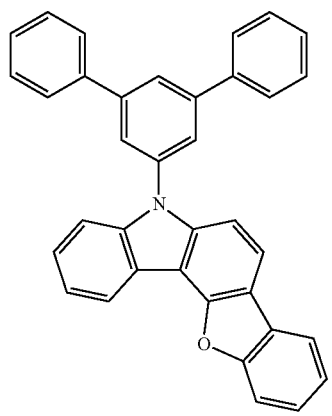
H43
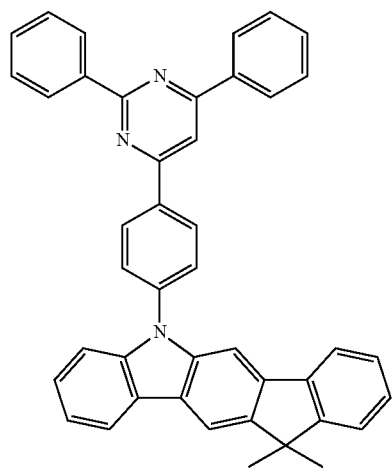
H44
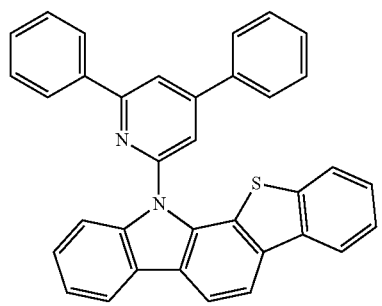
H45
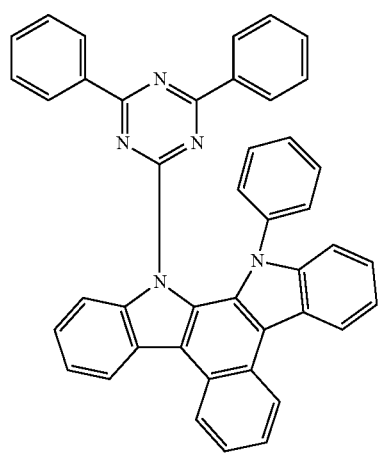
H46
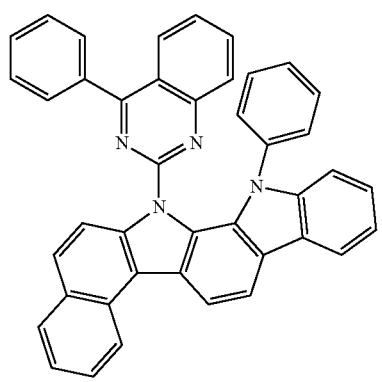

-continued
H47
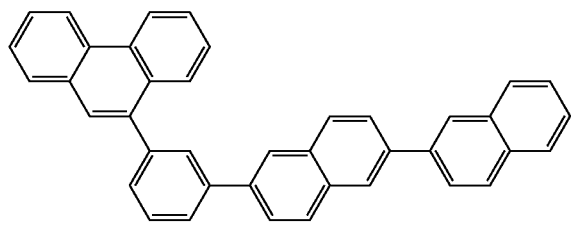
H48
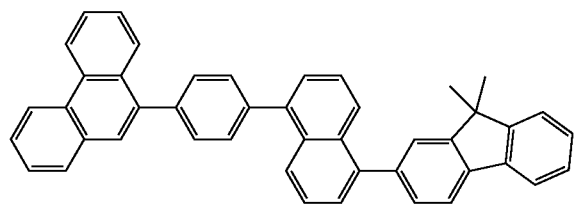
H49
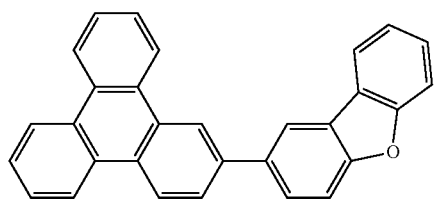
H50
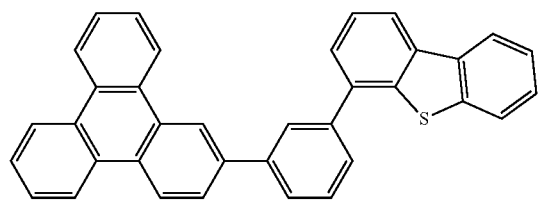
H51
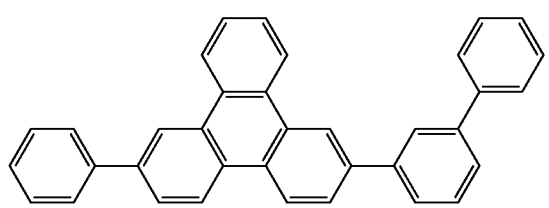
H52
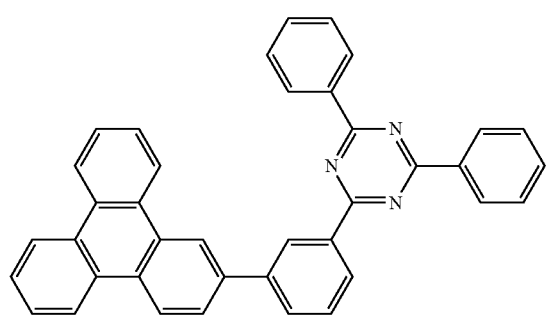
H53
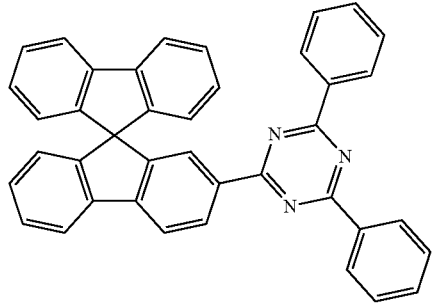
H54
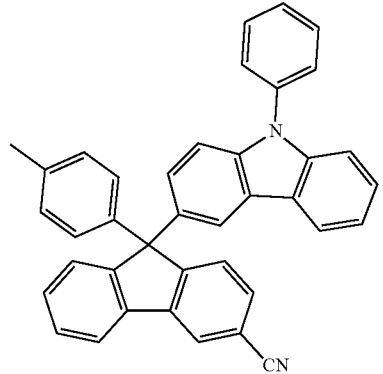
H55
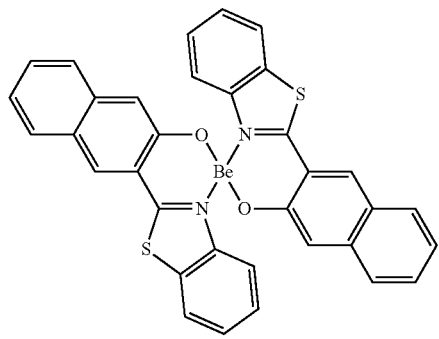
H56
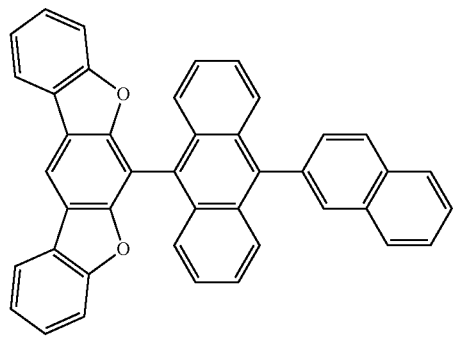

-continued
H57
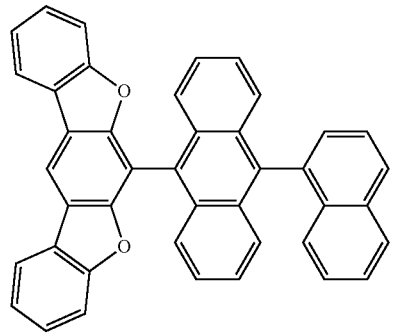
H58
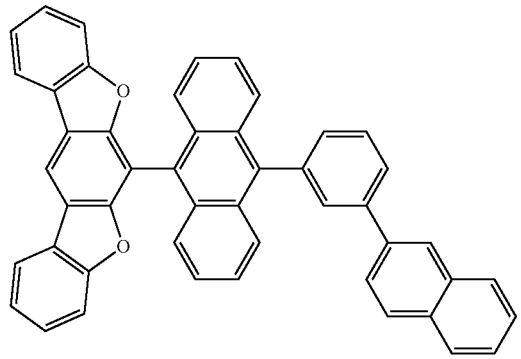
H59
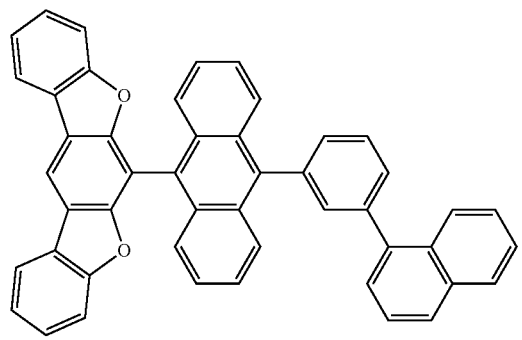
H60
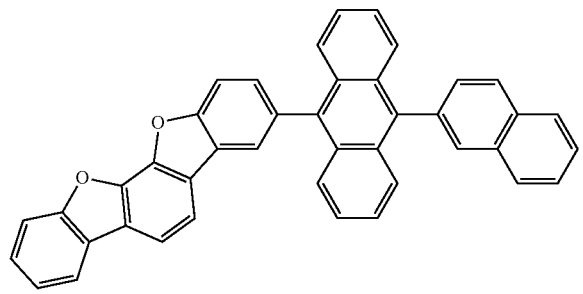
H61
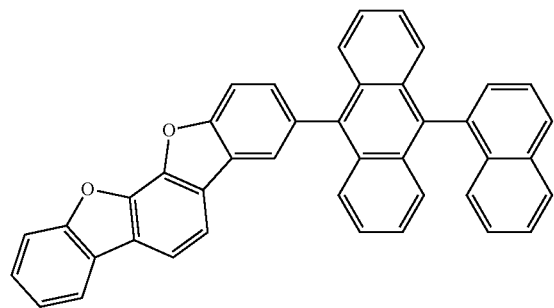
H62
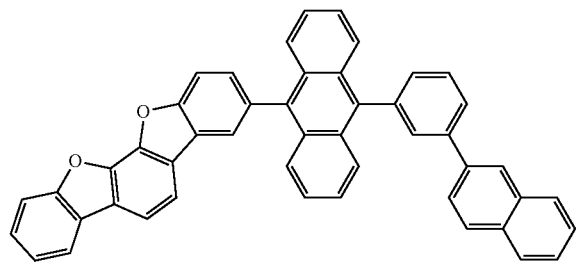
H63
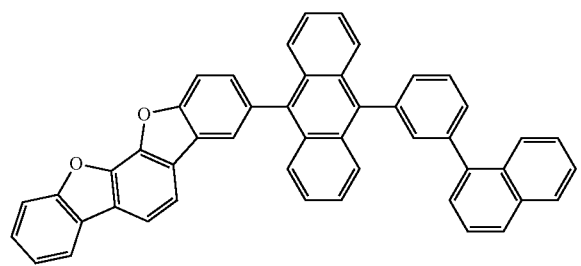
H64
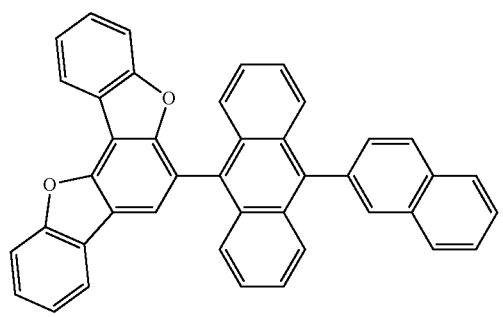

-continued
H65
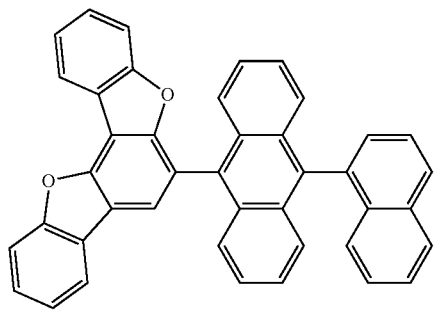
H66
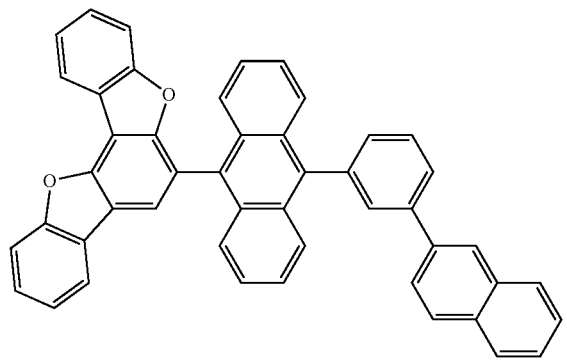
H67
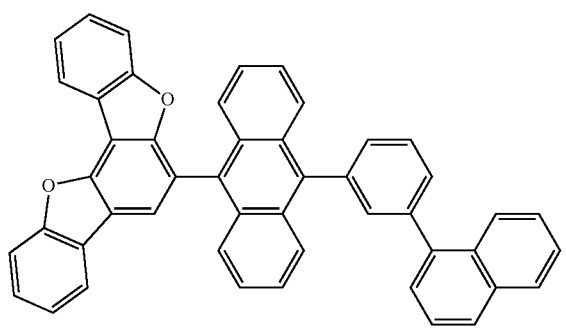
H68
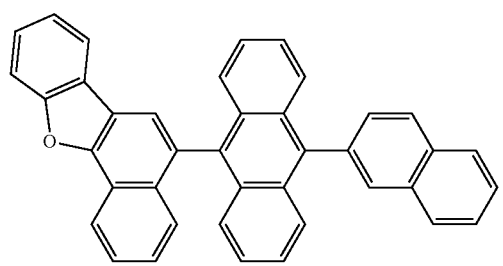
H69
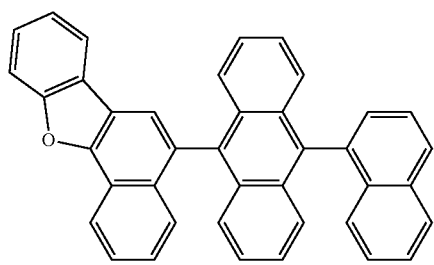
H70
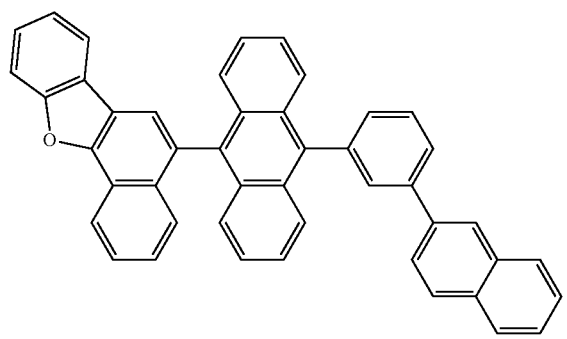
H71
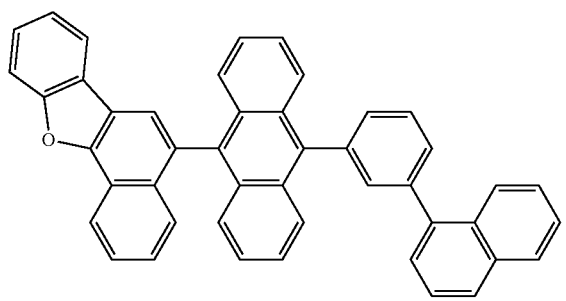
H72
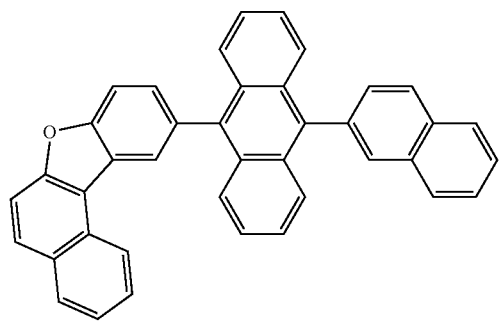

-continued
H73
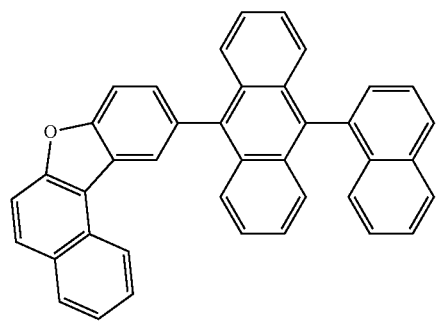
H74
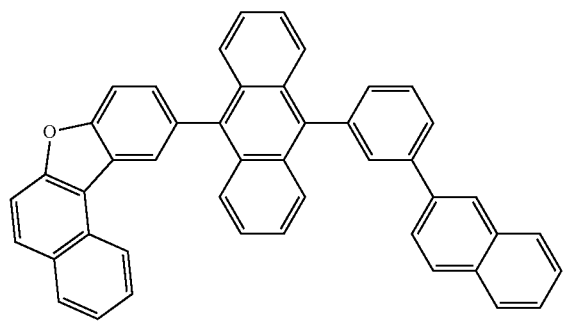
H75
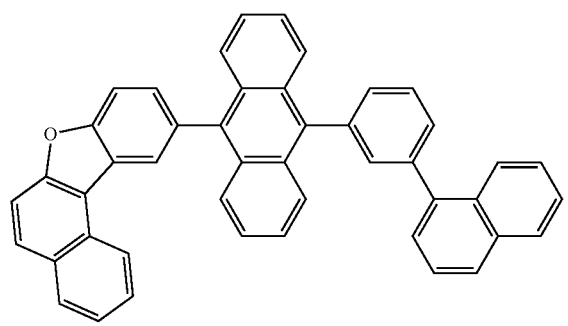
H76
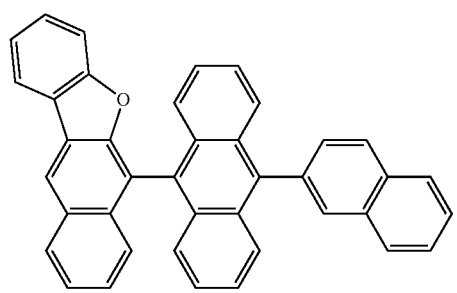
H77
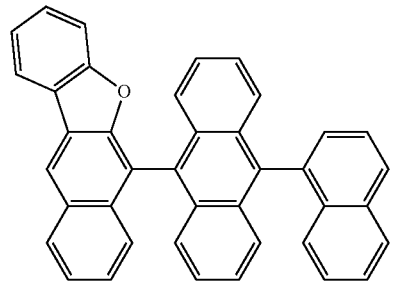
H78
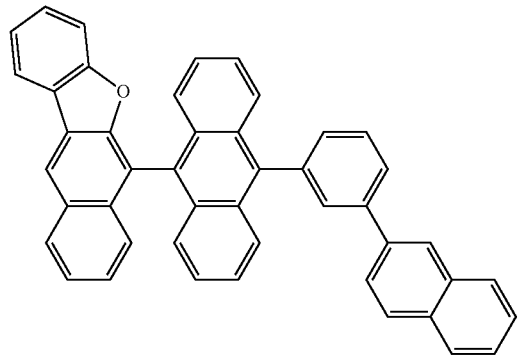
H79
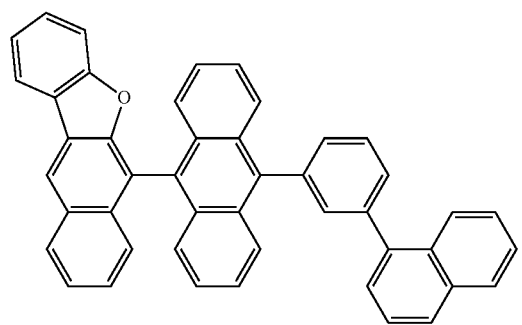
H80
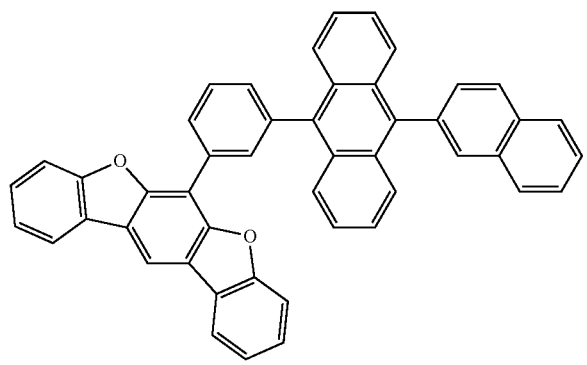

-continued
H81
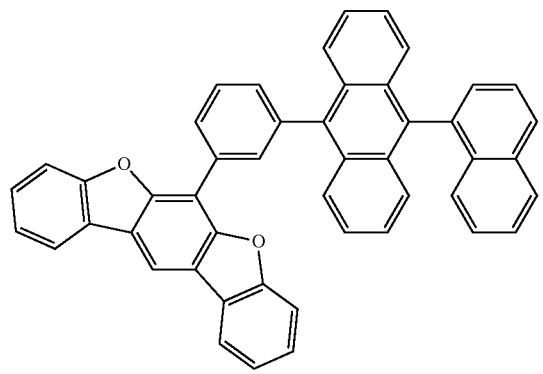
H82
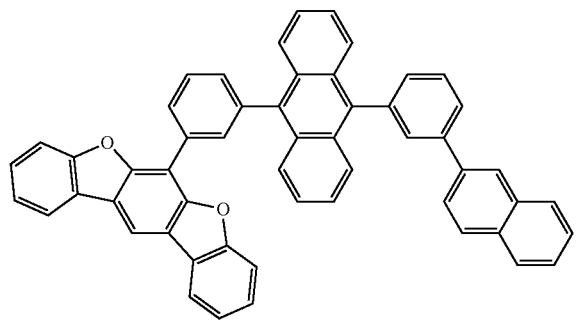
H83
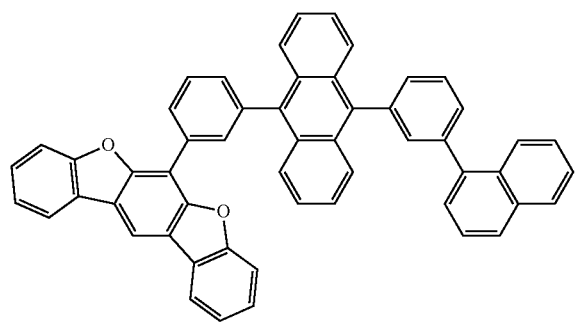
H84
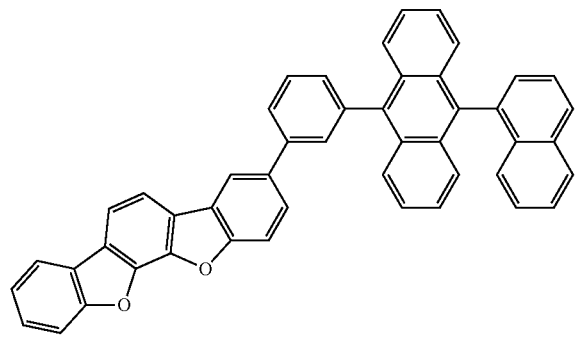
H85
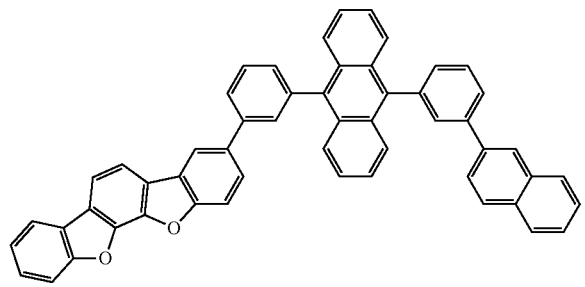
H86
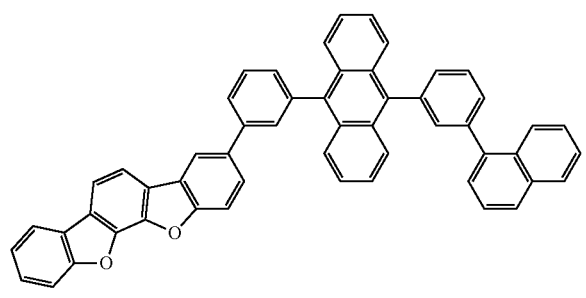
H87
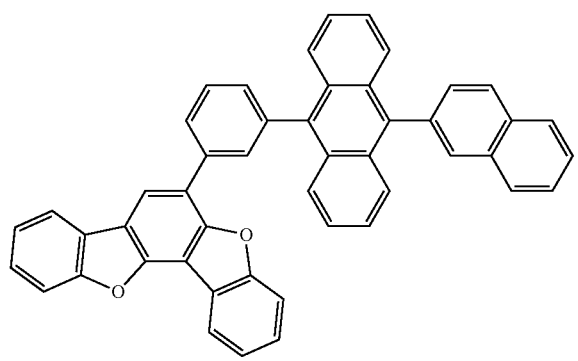
H88

-continued
H89
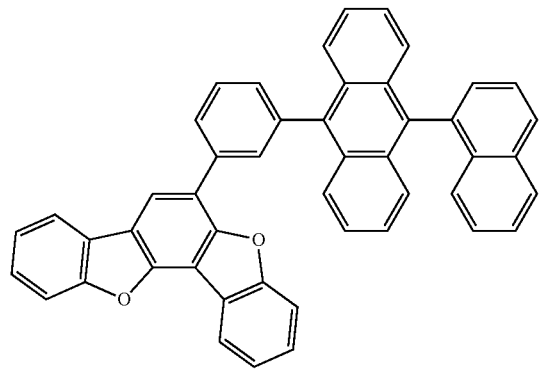
H90
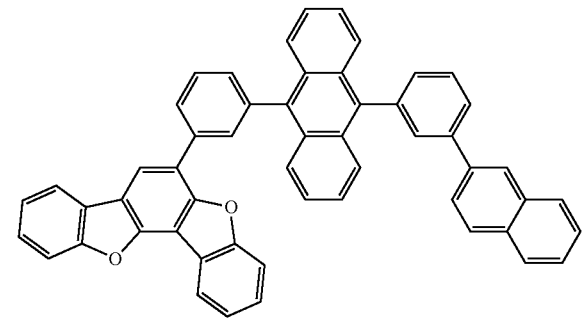
H91
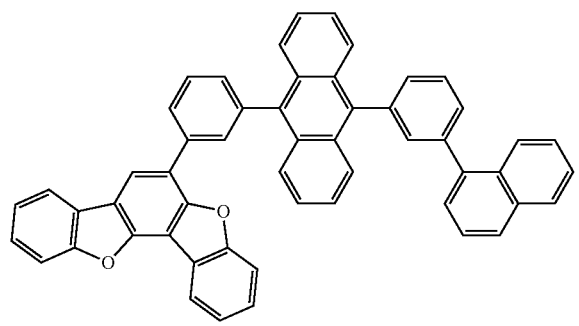
H92
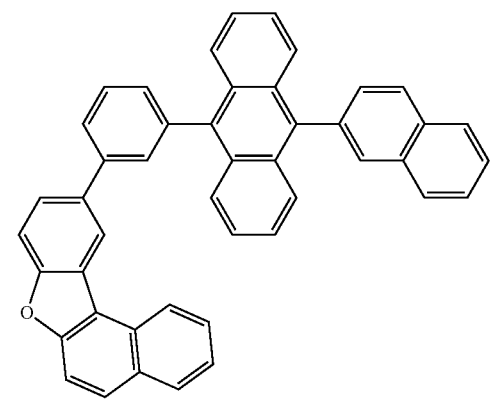
H93
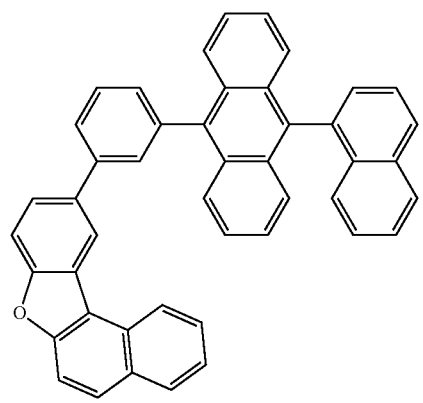
H94
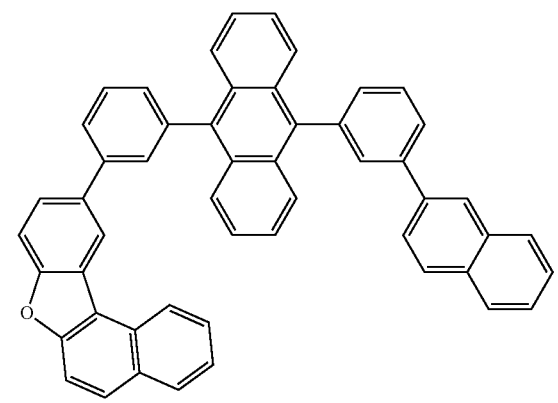
H95
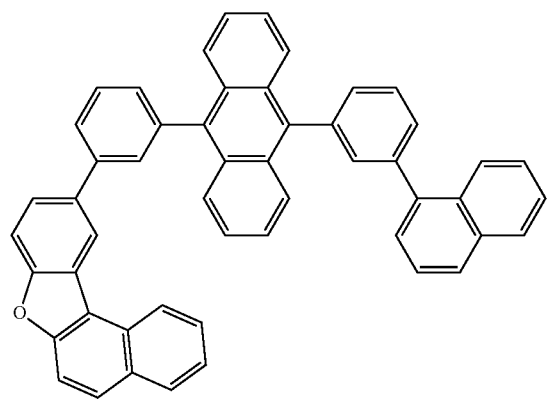
H96
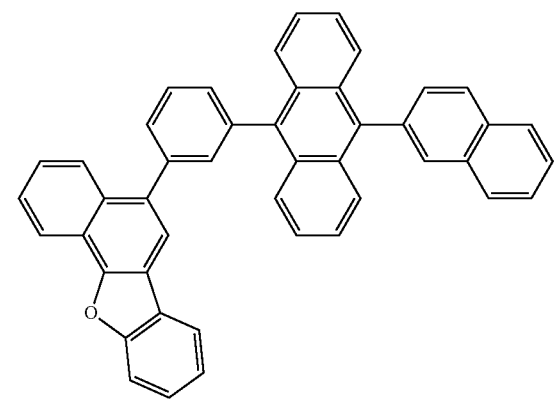

-continued
H97
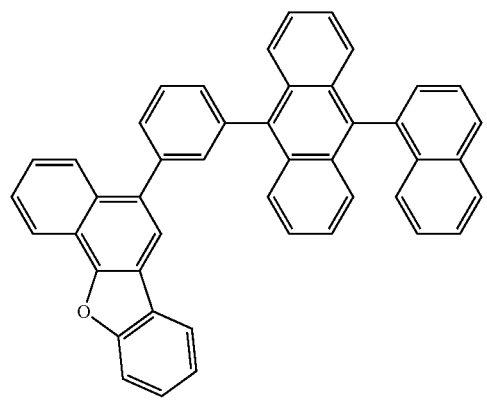
H98
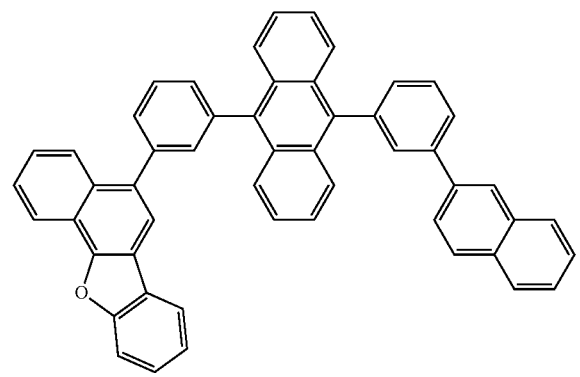
H99
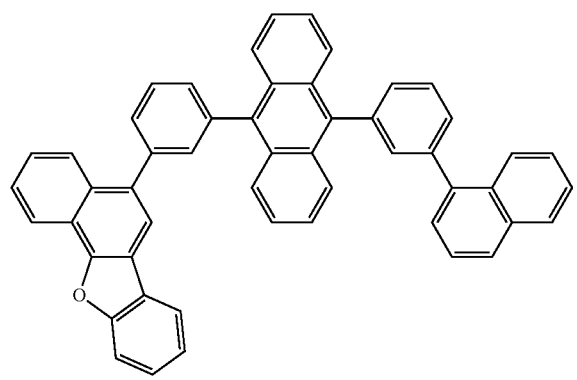
H100
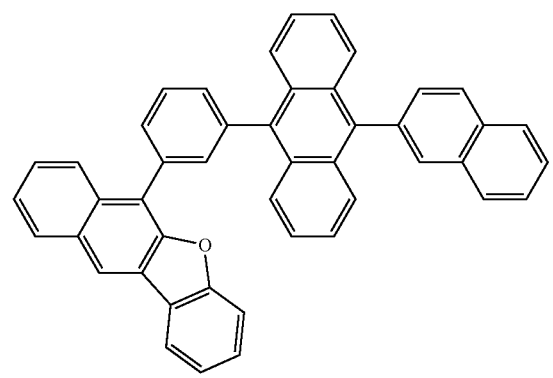
H101
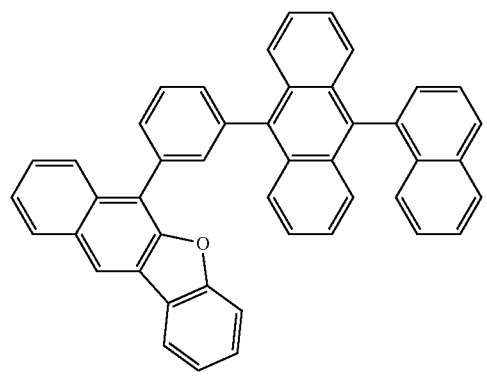
H102
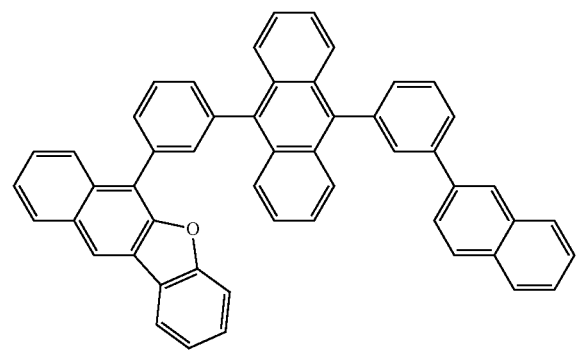

-continued
H103
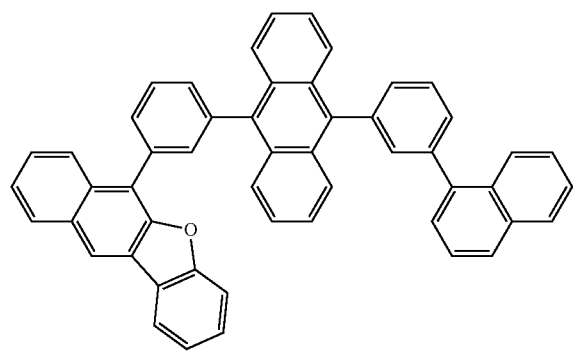
H104
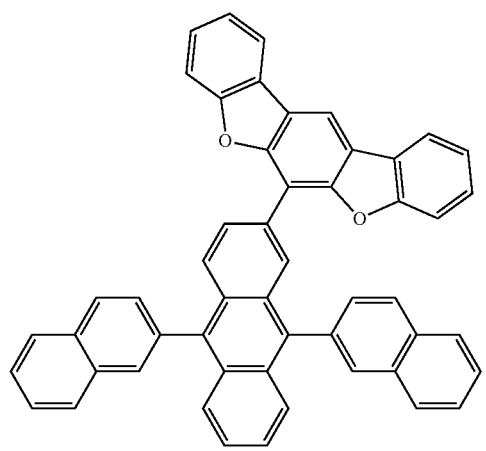
H105
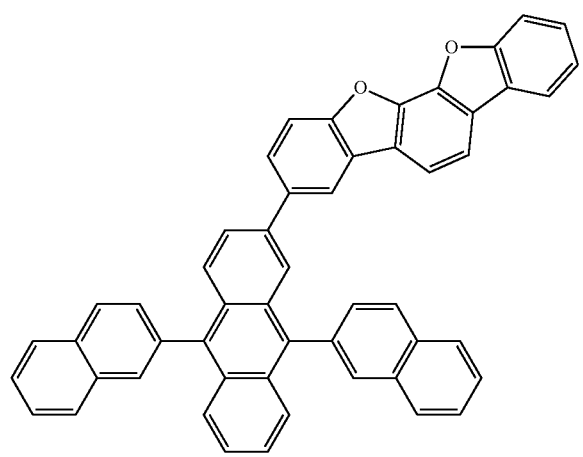
H106
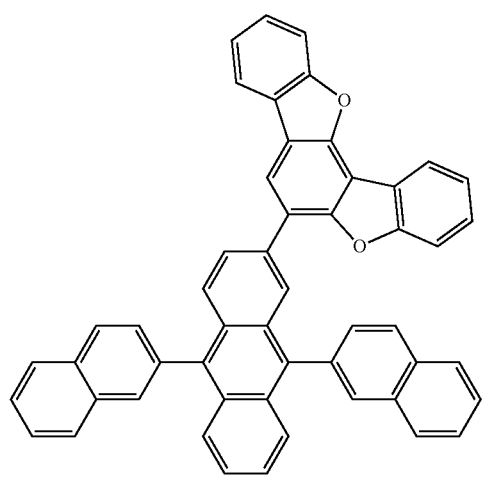
H107
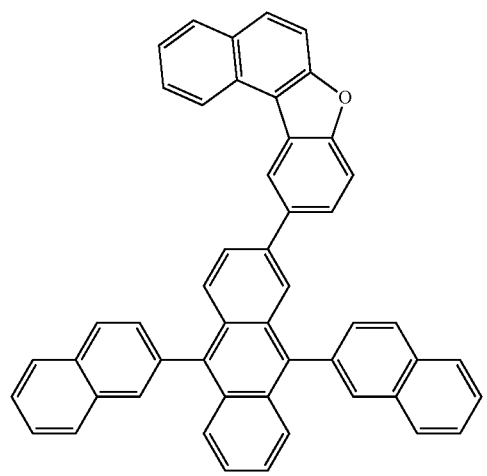
H108
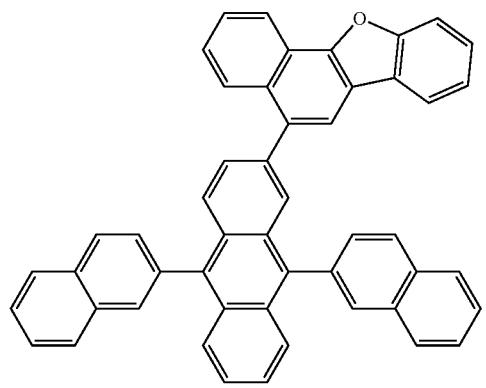

-continued
H109
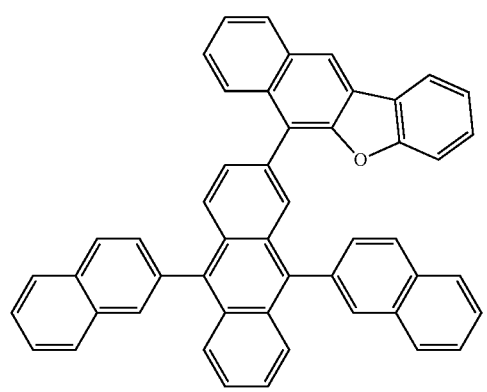
H110
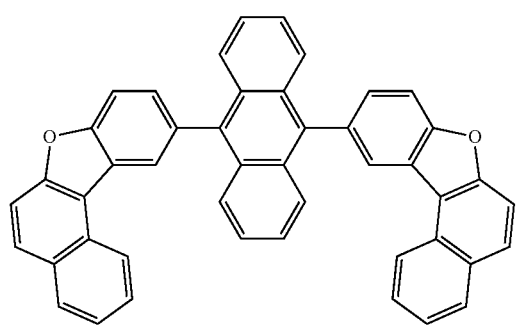
H111
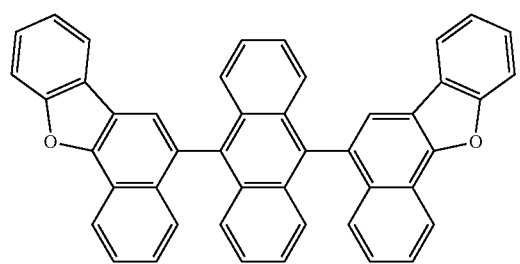
H112
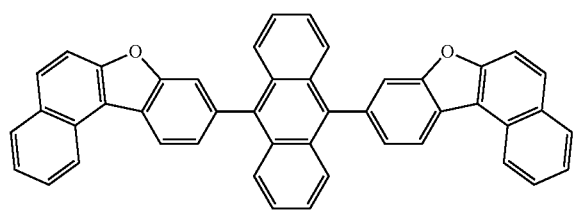
H113
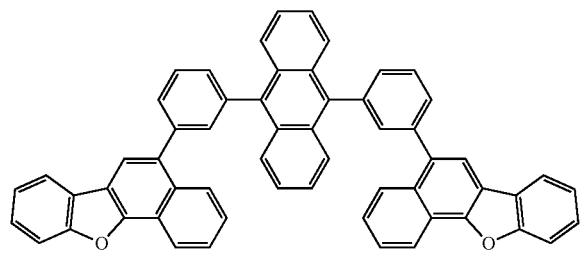
H114
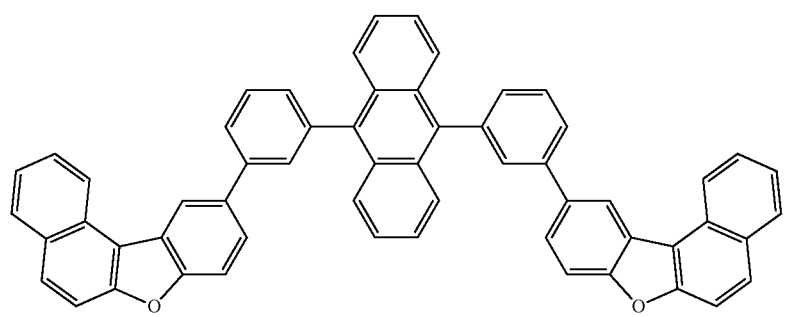

-continued
H115
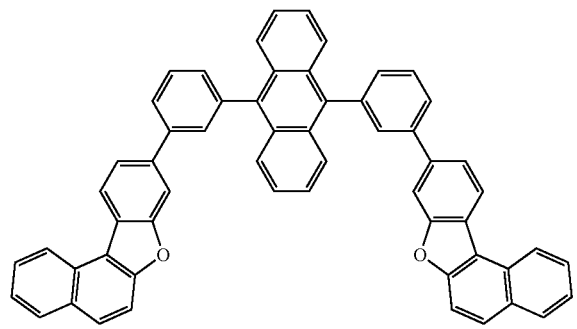
H116
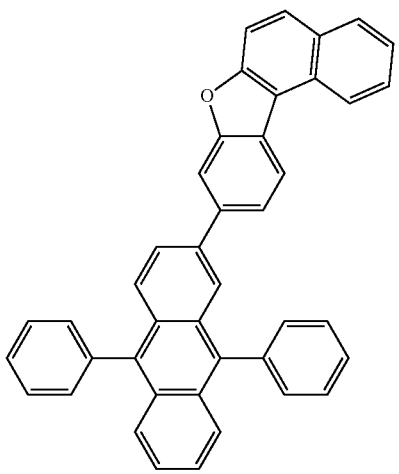
H117
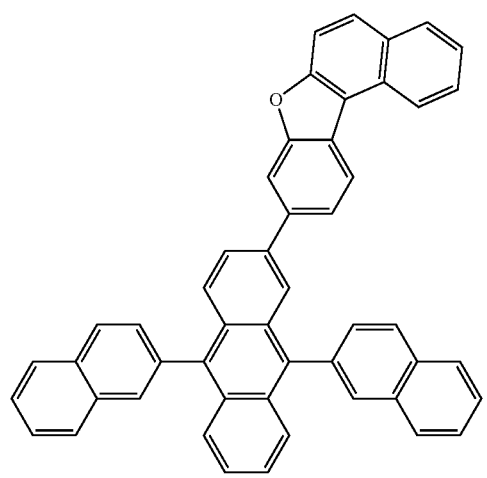
H118
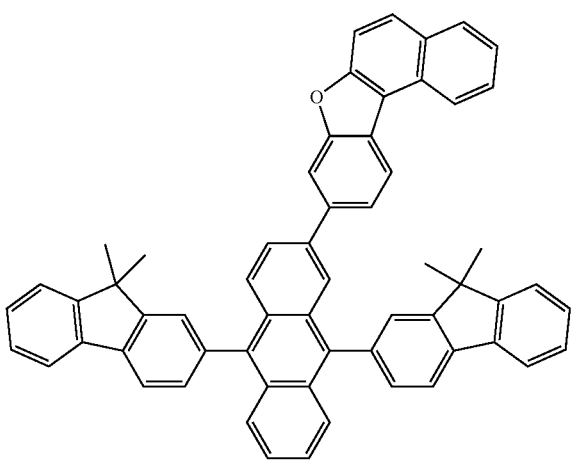
H119
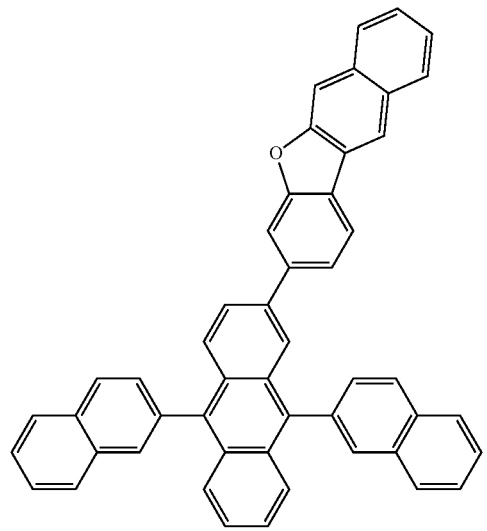
H120
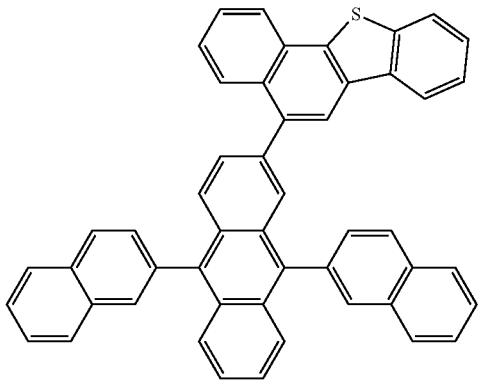

H121

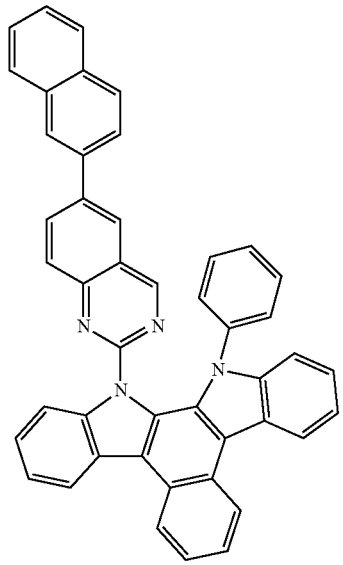

H122

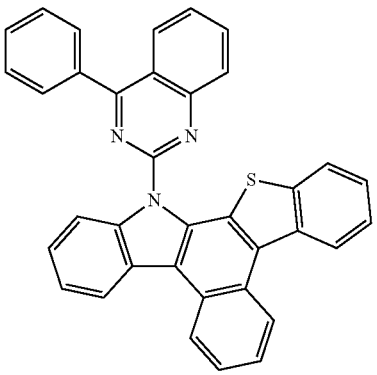

H123

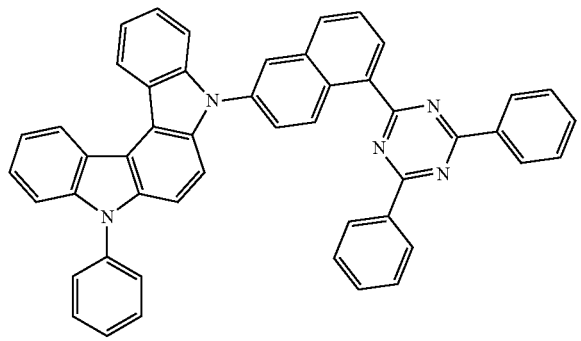

H124

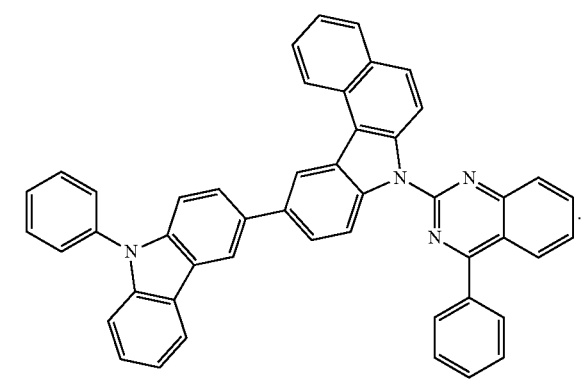

[Phosphorescent Dopant]

In embodiments, the phosphorescent dopant may include at least one transition metal as a central metal.

The phosphorescent dopant may include a monodentate ligand, a bidentate ligand, a tridentate ligand, a tetradentate ligand, a pentadentate ligand, a hexadentate ligand, or any combination thereof.

The phosphorescent dopant may be electrically neutral.

For example, the phosphorescent dopant may include an organometallic compound represented by Formula 401:

[Formula 401]
$$M(L_{401})_{xc1}(L_{402})_{xc2}$$

[Formula 402]

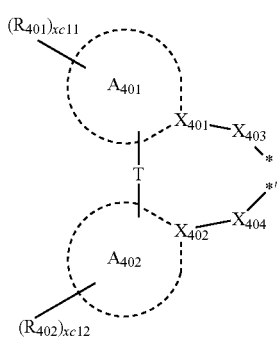

In Formulae 401 and 402,

M may be a transition metal (for example, iridium (Ir), platinum (Pt), palladium (Pd), osmium (Os), titanium (Ti), gold (Au), hafnium (Hf), europium (Eu), terbium (Tb), rhodium (Rh), rhenium (Re), or thulium (Tm)), $L_{401}$ may be a ligand represented by Formula 402, and xc1 may be 1, 2, or 3, wherein when xc1 is two or more, two or more of $L_{401}$(s) may be identical to or different from each other, $L_{402}$ may be an organic ligand, and xc2 may be 0, 1, 2, 3, or 4, and when xc2 is 2 or more, two or more of $L_{402}$(s) may be identical to or different from each other, $X_{401}$ and $X_{402}$ may each independently be nitrogen or carbon, ring $A_{401}$ and ring $A_{402}$ may each independently be a $C_3$-$C_{60}$ carbocyclic group or a $C_1$-$C_{60}$ heterocyclic group, $T_{401}$ may be a single bond, *—O—*', *—S*', *—C(=O)—*', *—N($Q_{411}$)—*', *—C($Q_{411}$)($Q_{412}$)-*', *—C($Q_{411}$)=C($Q_{412}$)-*', *—C($Q_{411}$)=*', or *=C=*', $X_{403}$ and $X_{404}$ may each independently be a chemical bond (for example, a covalent bond or a coordination bond), O, S, N($Q_{413}$), B($Q_{413}$), P($Q_{413}$), C($Q_{413}$)($Q_{414}$), or Si($Q_{413}$)($Q_{414}$), $Q_{411}$ to $Q_{414}$ may each independently be the same as described herein with respect to $Q_1$, $R_{401}$ and $R_{402}$ may each independently be hydrogen, deuterium, —F, —Cl, —Br, —I, a hydroxyl group, a cyano group, a nitro group, a $C_1$-$C_{20}$ alkyl group unsubstituted or substituted with at least one $R_{10a}$, a $C_1$-$C_{20}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, —Si($Q_{401}$)($Q_{402}$)($Q_{403}$), —N($Q_{401}$)($Q_{402}$), —B($Q_{401}$)($Q_{402}$), —C(=O)($Q_{401}$), —S(=O)$_2$($Q_{401}$), or —P(=O)($Q_{401}$)($Q_{402}$), $Q_{401}$ to $Q_{403}$ may each independently be the same as described herein with respect to $Q_1$, xc11 and xc12 may each independently be an integer from 0 to 10, and

* and *' in Formula 402 each indicate a binding site to M in Formula 401.

For example, in Formula 402, $X_{401}$ may be nitrogen and $X_{402}$ may be carbon, or each of $X_{401}$ and $X_{402}$ may be nitrogen.

In embodiments, when xc1 in Formula 401 is 2 or more, two ring $A_{401}$(s) in two or more of $L_{401}$(s) may be optionally linked to each other via $T_{402}$, which is a linking group, and two ring $A_{402}$ may be optionally linked to each other via $T_{403}$, which is a linking group (see Compounds PD1 to PD4 and PD7). $T_{402}$ and $T_{403}$ may each independently be the same as described herein with respect to $T_{401}$.

In Formula 401, $L_{402}$ may be an organic ligand. For example, $L_{402}$ may include a halogen group, a diketone group (for example, an acetylacetonate group), a carboxylic acid group (for example, a picolinate group), —C(=O), an isonitrile group, —CN group, a phosphorus group (for example, a phosphine group, a phosphite group, etc.), or any combination thereof.

The phosphorescent dopant may include, for example, one of compounds PD1 to PD39, or any combination thereof:

PD1

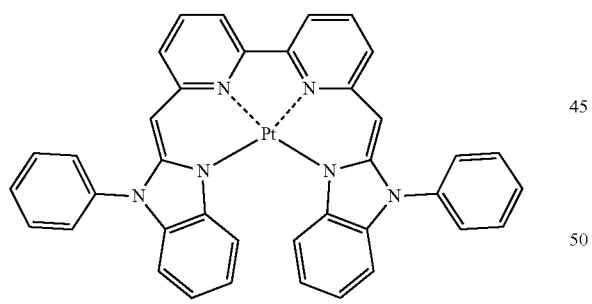

PD2

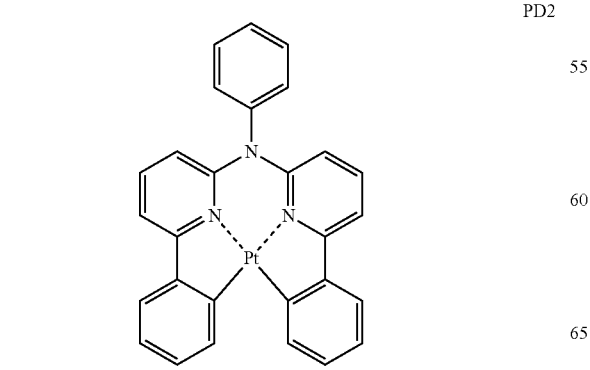

PD3

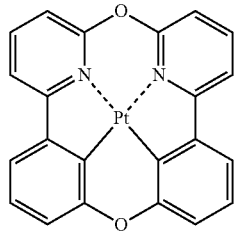

PD4

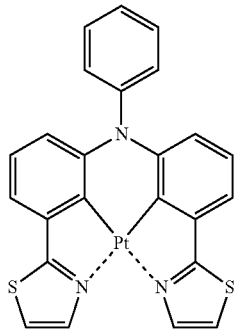

PD5

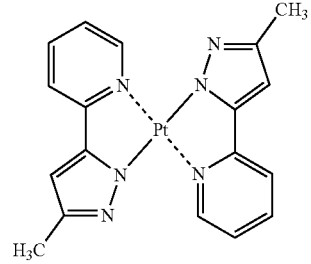

PD6

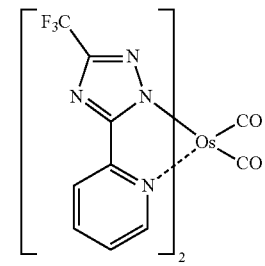

PD7

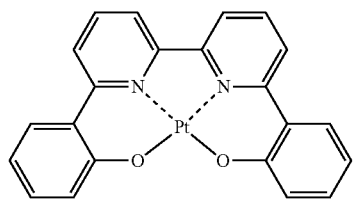

PD8

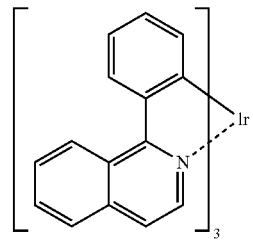

PD9 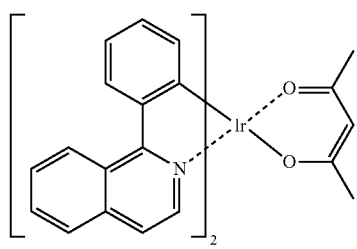
PD10 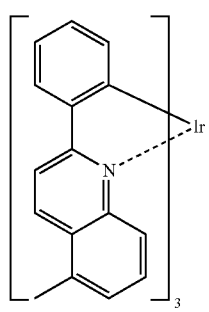
PD11 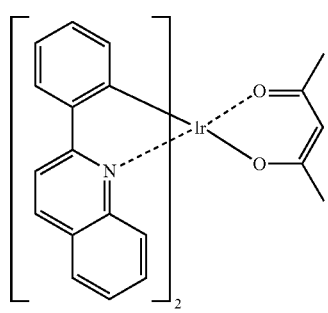
PD12 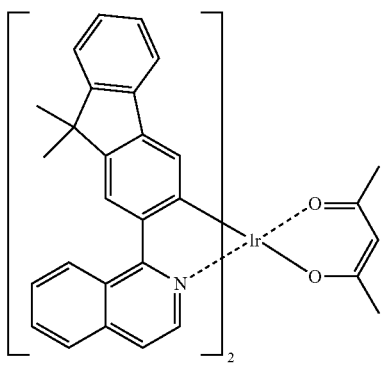
PD13 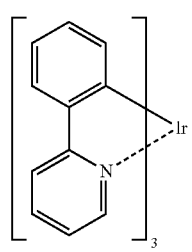
PD14 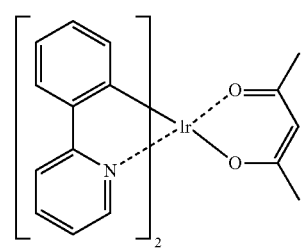
PD15 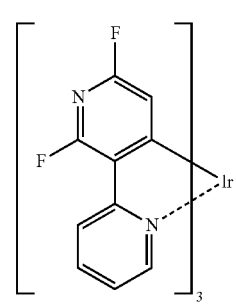
PD16 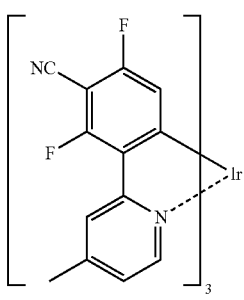
PD17 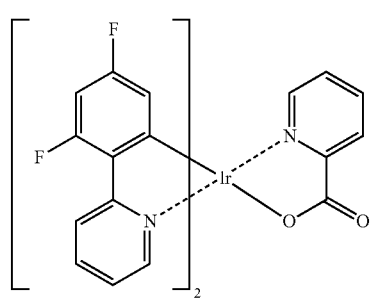
PD18 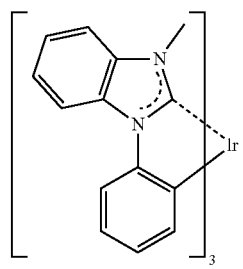

PD19
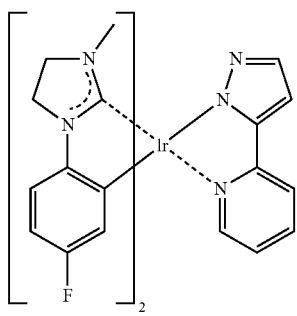
PD23
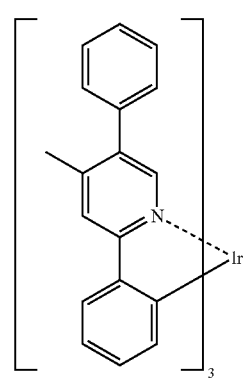
PD20
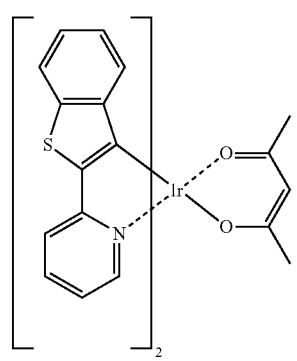
PD24
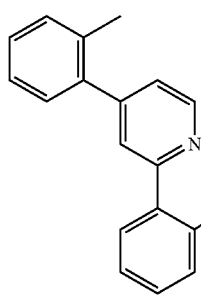
PD21
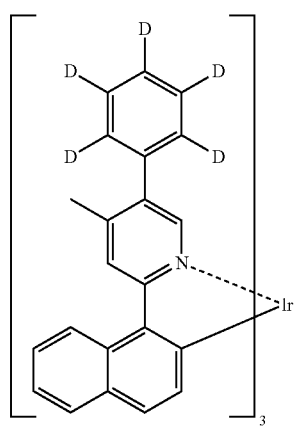
PD25
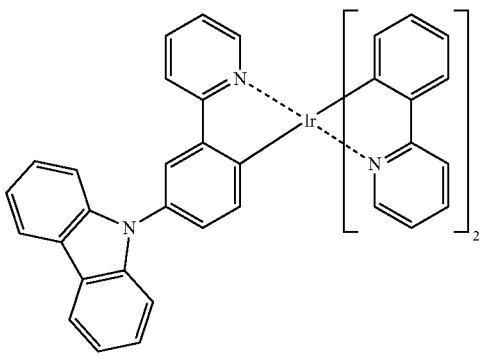
PD22
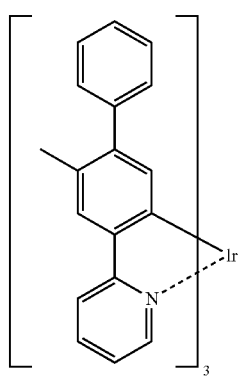
PD26
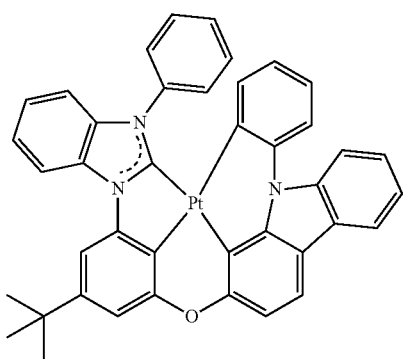

PD27
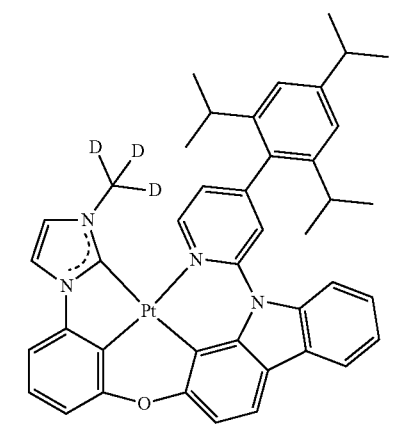
PD28
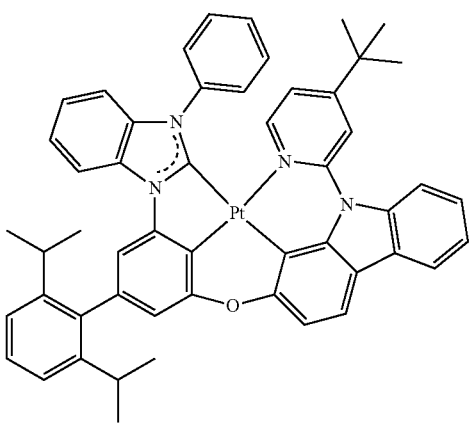
PD29
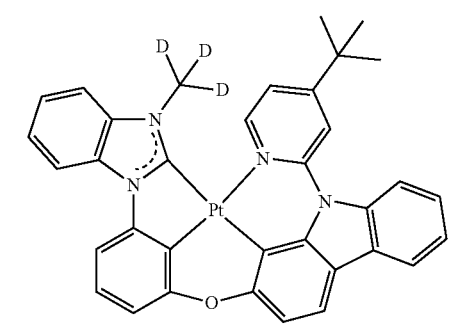
PD30
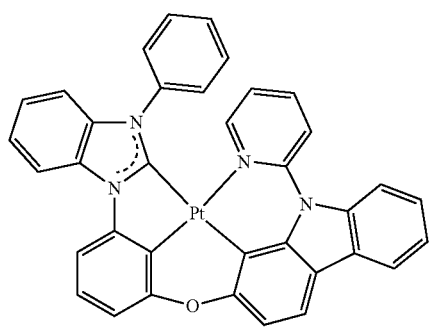
PD31
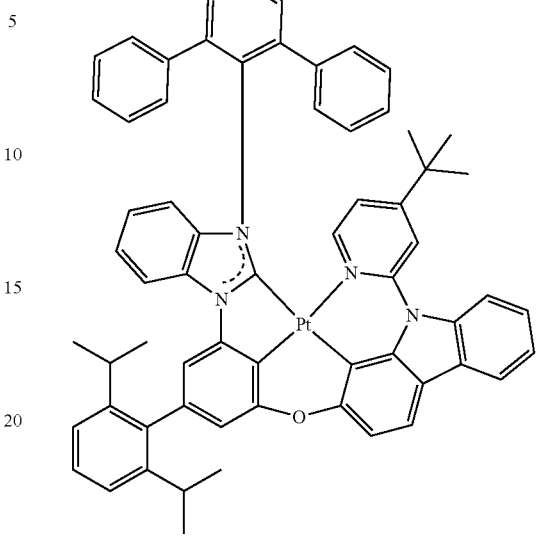
PD32
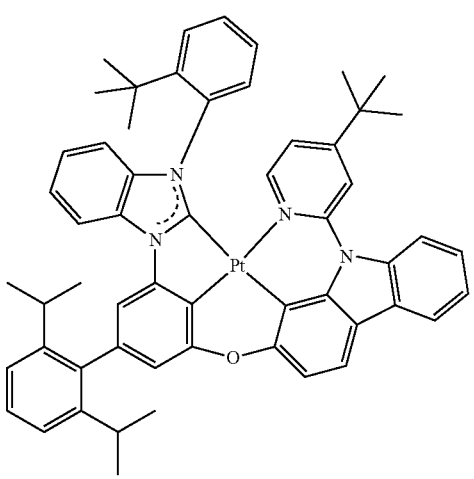
PD33
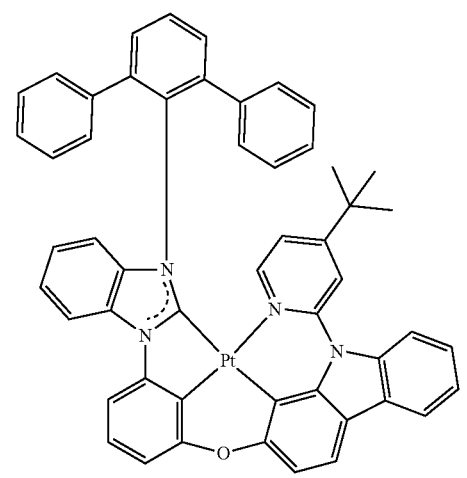

PD34
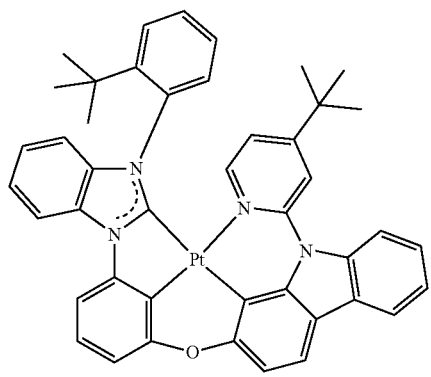
PD35
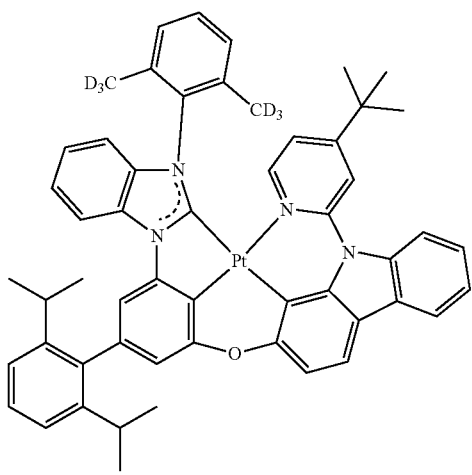
PD36
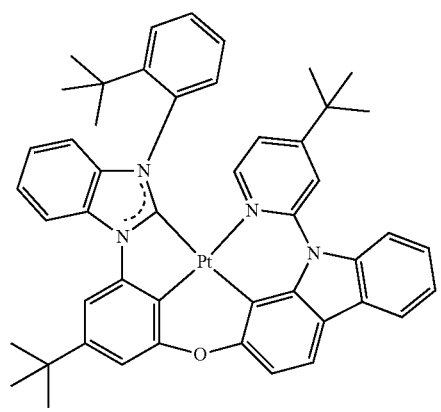
PD37
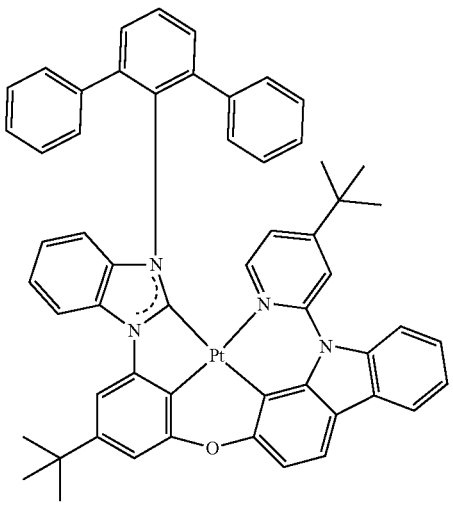
PD38
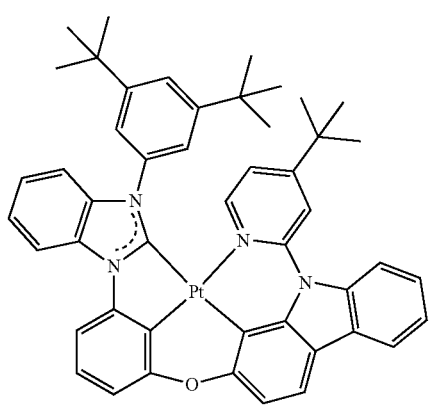
PD39
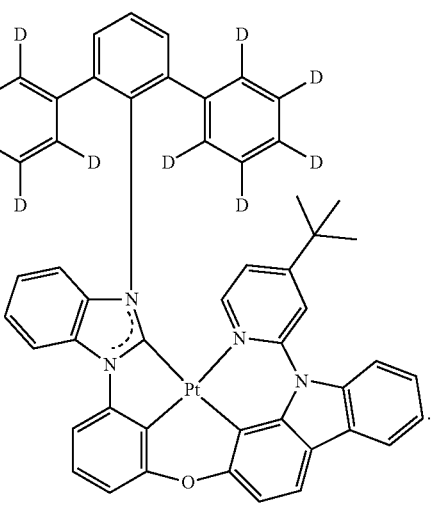
[Fluorescent Dopant]
The fluorescent dopant may include an amine group-containing compound, a styryl group-containing compound, or any combination thereof.
For example, the fluorescent dopant may include a compound represented by Formula 501:

[Formula 501]

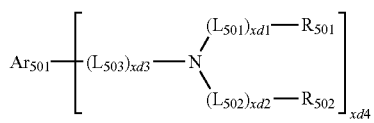

In Formula 501, $Ar_{501}$, $L_{501}$ to $L_{503}$, $R_{501}$, and $R_{502}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, xd1 to xd3 may each independently be 0, 1, 2, or 3, and xd4 may be 1, 2, 3, 4, 5, or 6.

In an embodiment, $Ar_{501}$ in Formula 501 may be a condensed cyclic group (for example, an anthracene group, a chrysene group, or a pyrene group) in which three or more monocyclic groups are condensed together.

In embodiments, xd4 in Formula 501 may be 2.

In an embodiment, the fluorescent dopant may include one of Compounds FD1 to FD36, DPVBi, DPAVBi, or any combination thereof:

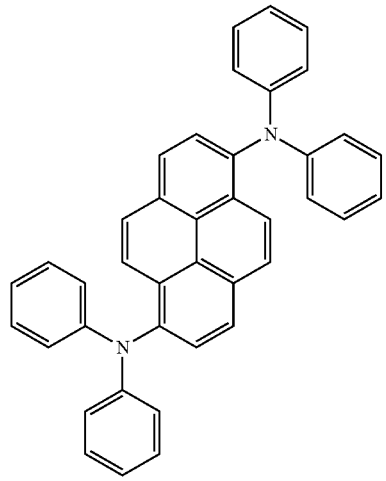

FD1

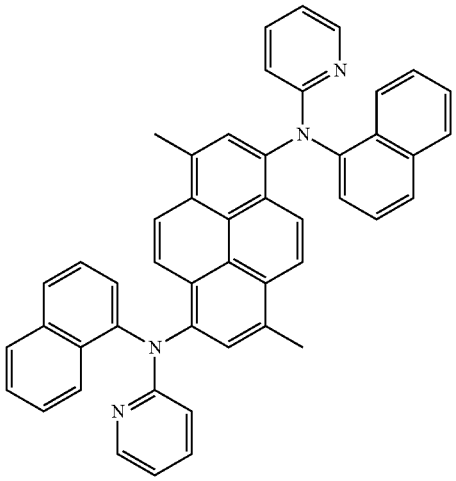

FD2

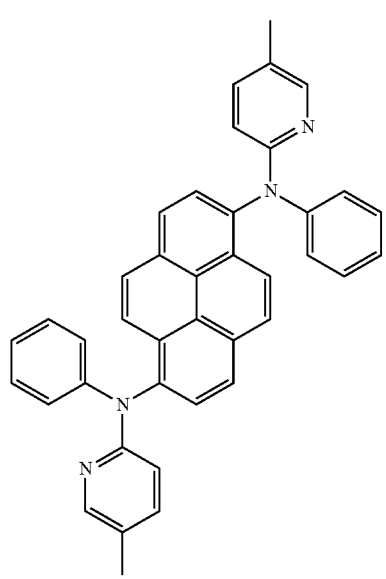

FD3

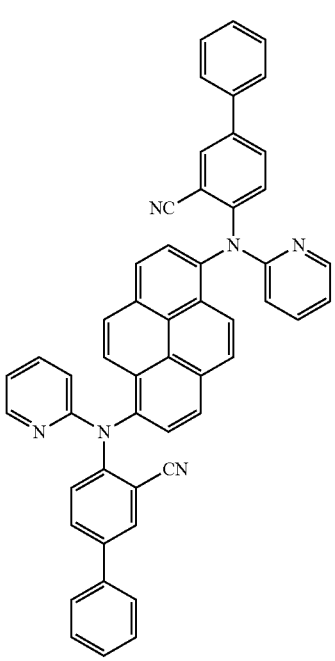

FD4

-continued
FD5
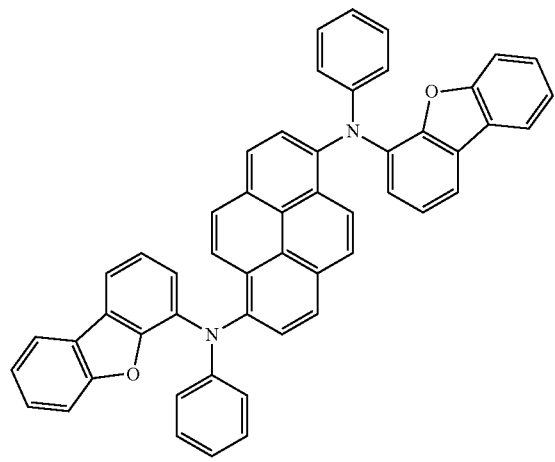
FD6
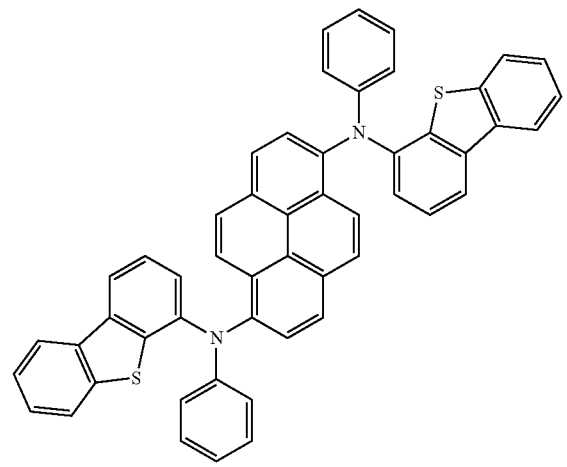
FD7
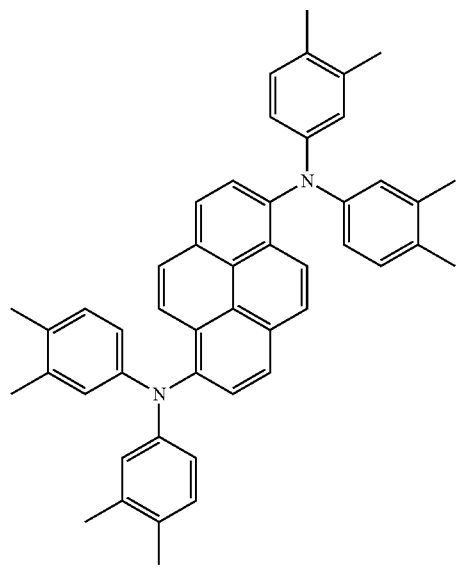
FD8
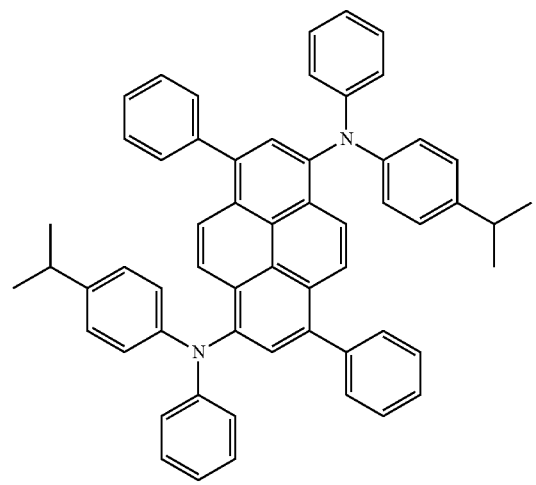
FD9
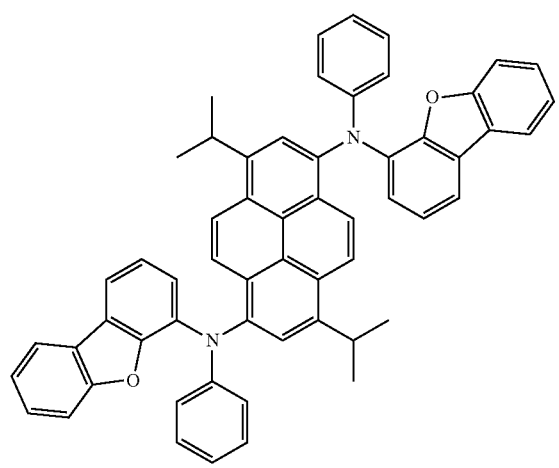
FD10
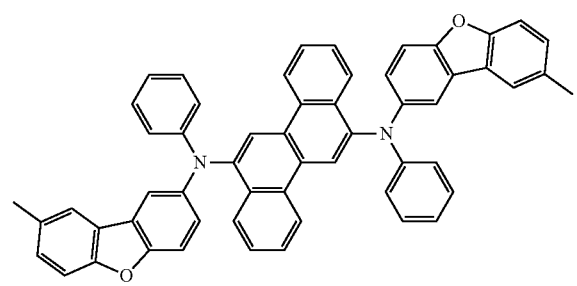

-continued
FD11
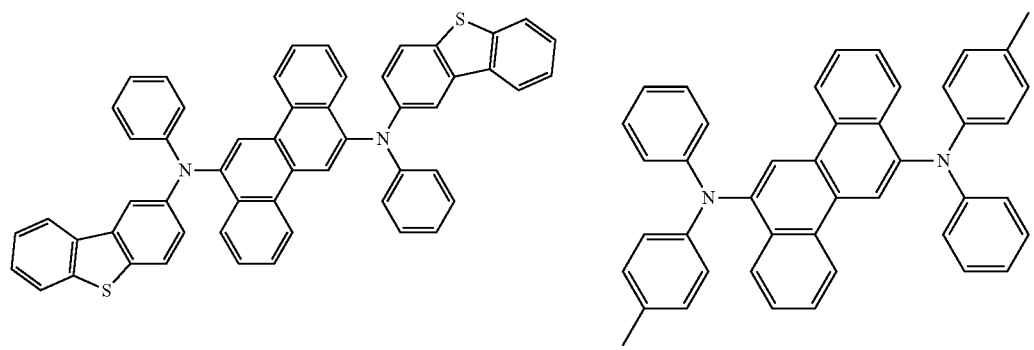
FD12
FD13
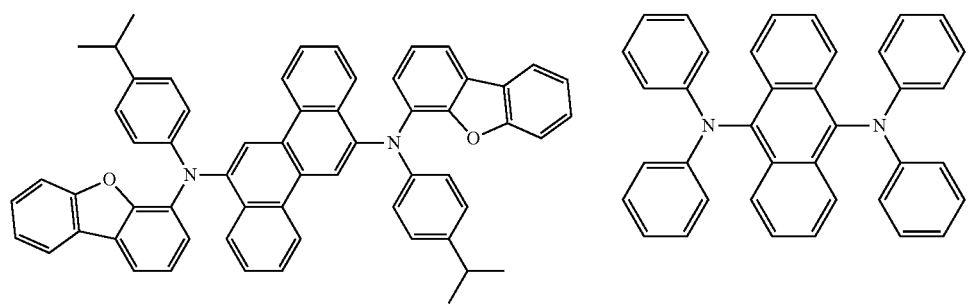
FD14
FD15
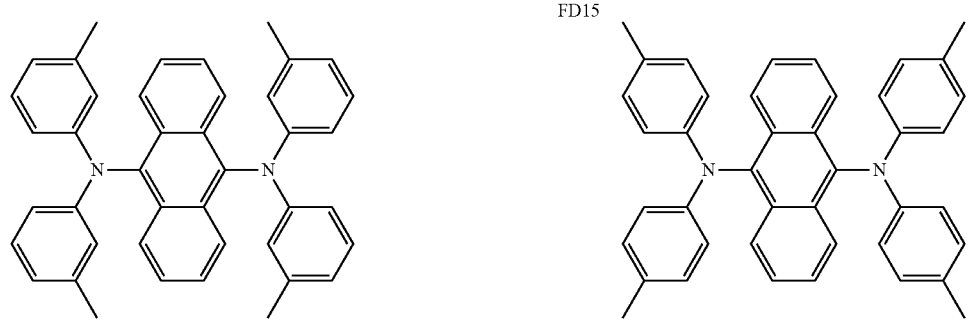
FD16
FD17
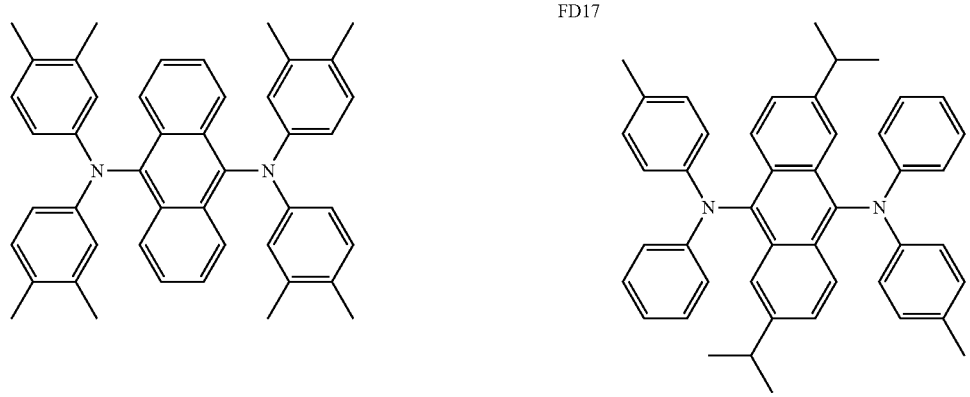
FD18

-continued
FD19
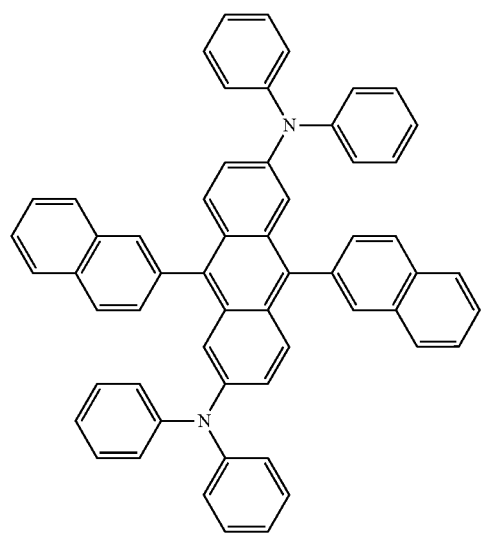
FD20
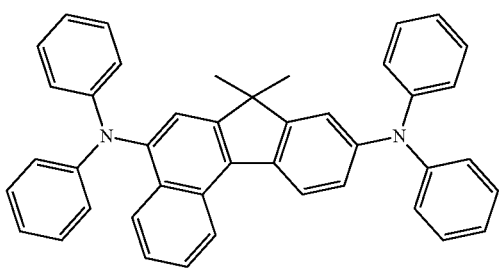
FD21
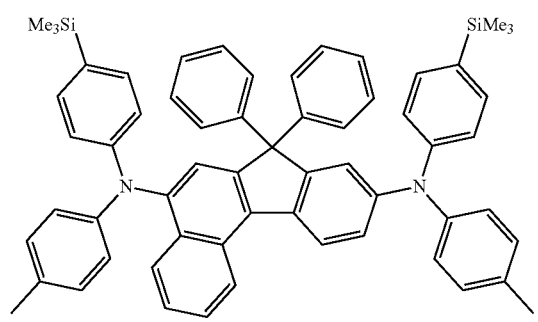
FD22
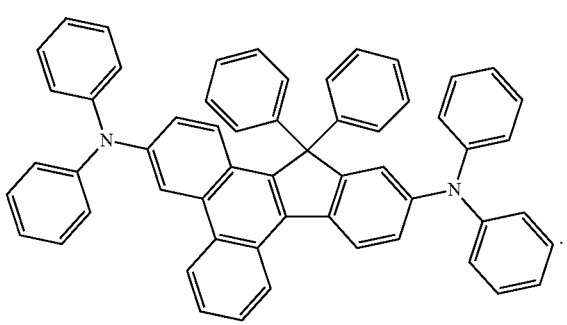
FD23
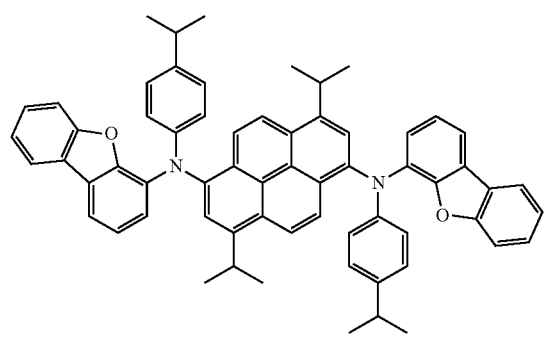
FD24
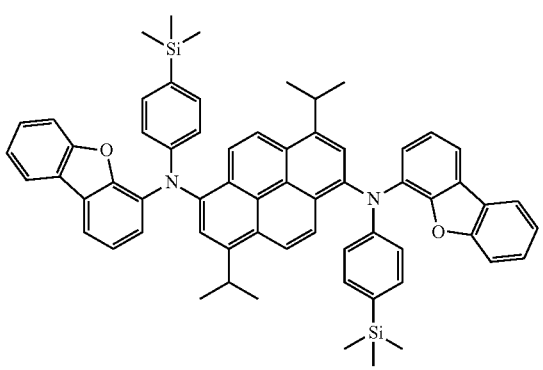
FD25
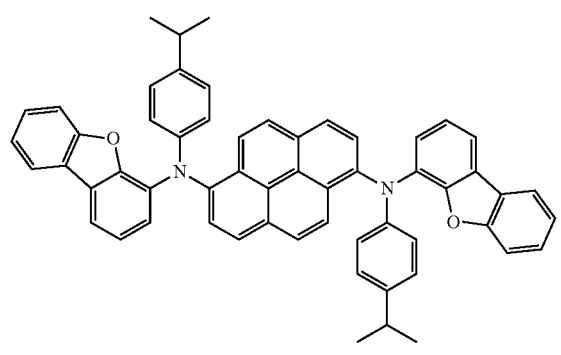
FD26
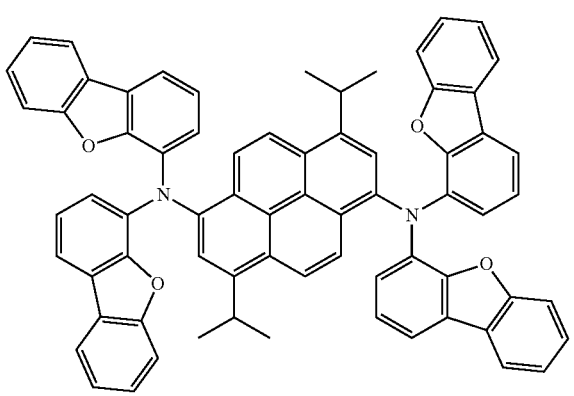

-continued
FD27
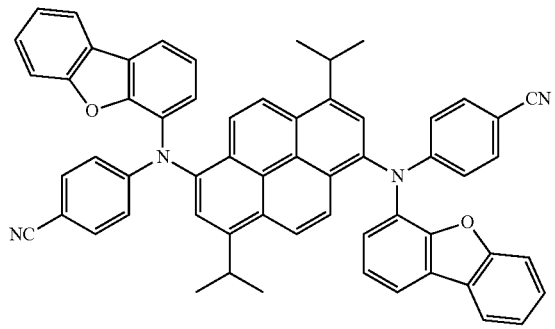
FD28
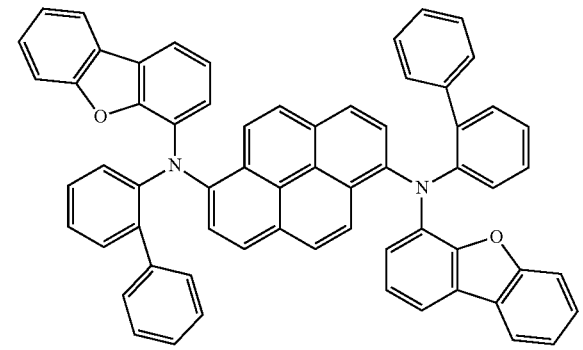
FD29
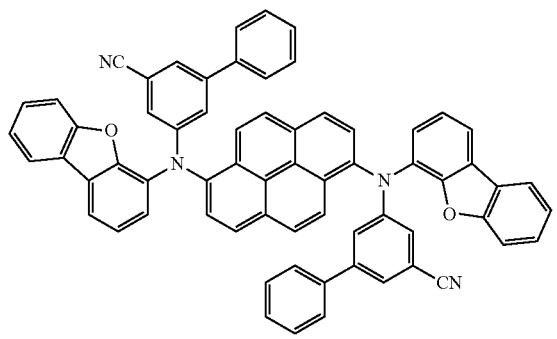
FD30
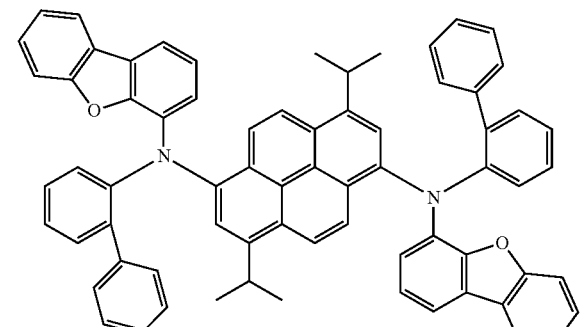
FD31
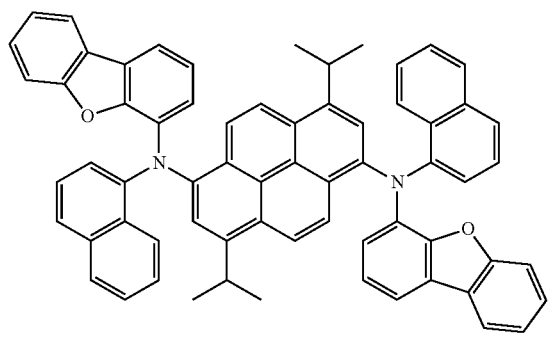
FD32
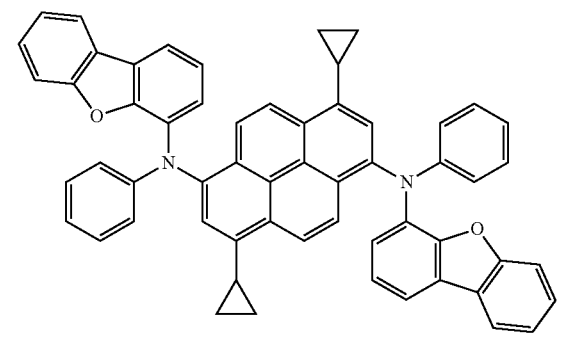
FD33
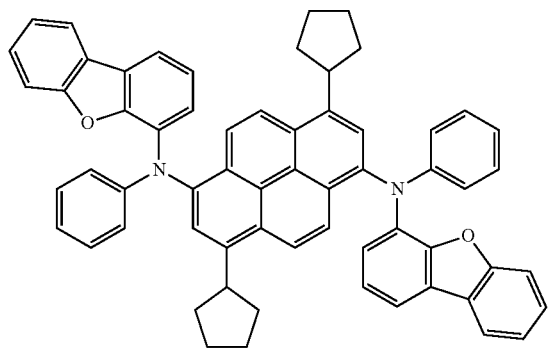
FD34
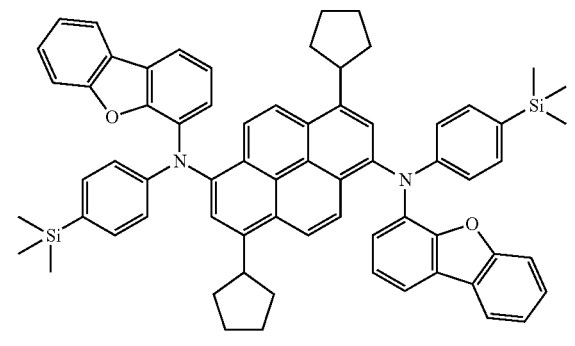

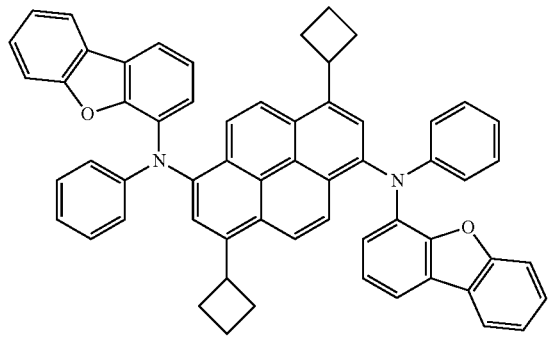

FD35

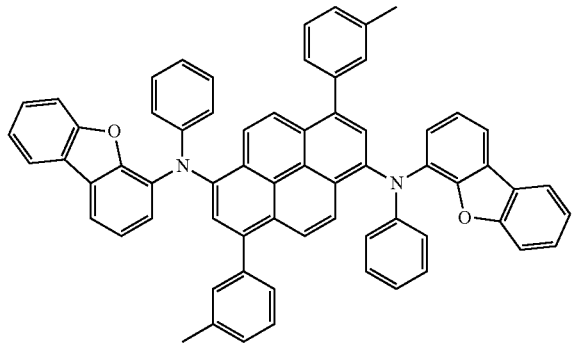

FD36

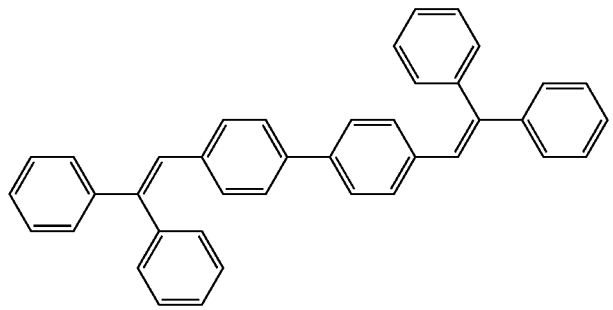

DPVBi

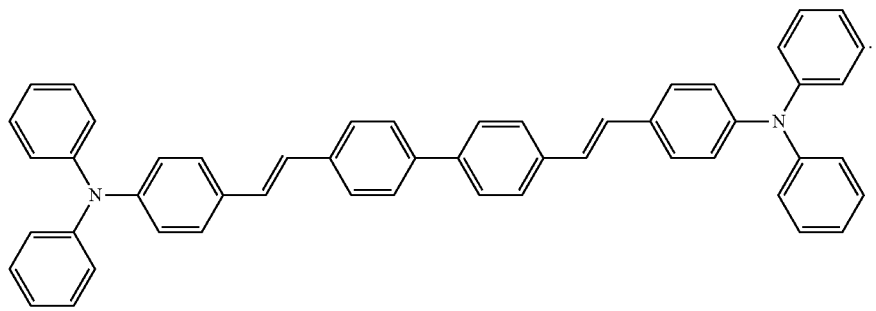

DPAVBi

[Delayed Fluorescence Material]

The emission layer may include a delayed fluorescence material.

In the specification, the delayed fluorescence material may be selected from compounds capable of emitting delayed fluorescence based on a delayed fluorescence emission mechanism.

The delayed fluorescence material included in the emission layer may serve as a host or as a dopant, depending on the type of other materials included in the emission layer.

In embodiments, a difference between the triplet energy level (eV) of the delayed fluorescence material and a singlet energy level (eV) of the delayed fluorescence material may be greater than or equal to about 0 eV and less than or equal to about 0.5 eV. When the difference between the triplet energy level (eV) of the delayed fluorescence material and the singlet energy level (eV) of the delayed fluorescence material satisfies the above-described range, up-conversion from the triplet state to the singlet state of the delayed fluorescence materials may effectively occur, and thus, the luminescence efficiency of the light-emitting device 10 may be improved.

In an embodiment, the delayed fluorescence material may include a material including at least one electron donor (for example, a π electron-rich $C_3$-$C_{60}$ cyclic group, such as a carbazole group) and at least one electron acceptor (for example, a sulfoxide group, a cyano group, or a π electron-deficient nitrogen-containing $C_1$-$C_{60}$ cyclic group); or a material including a $C_8$-$C_{60}$ polycyclic group in which two or more cyclic groups are condensed while sharing boron (B).

Examples of the delayed fluorescence material may include at least one of compounds DF1 to DF9:

-continued
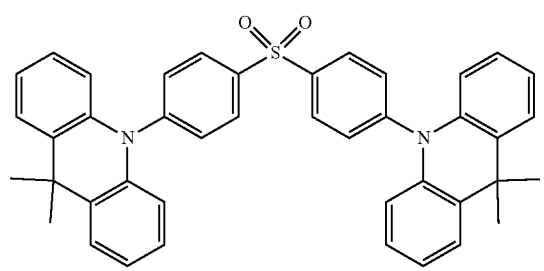
(DMAC-OPS) DF1
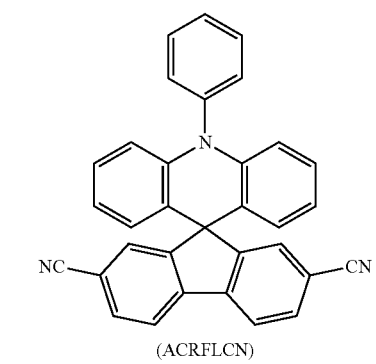
(ACRFLCN) DF2
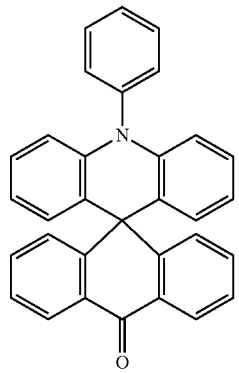
(ACRSA) DF3
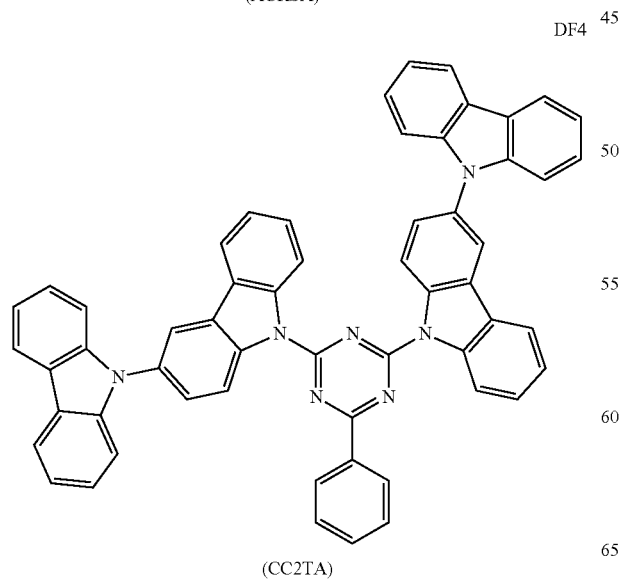
(CC2TA) DF4
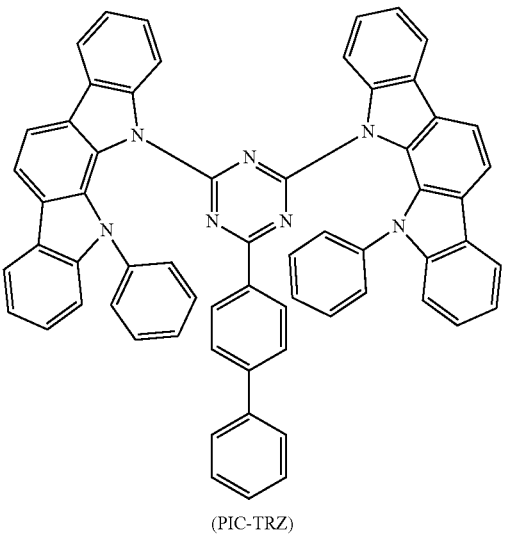
(PIC-TRZ) DF5
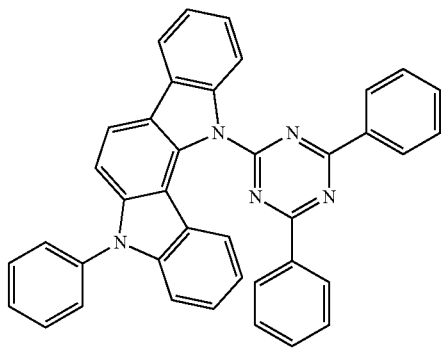
(PIC-TRZ2) DF6
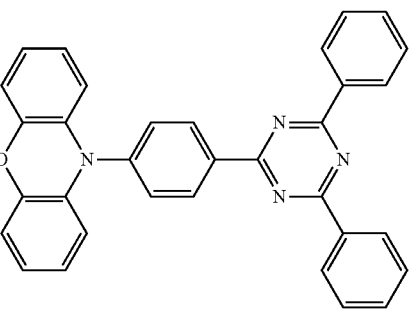
(PXZ-TRZ) DF7
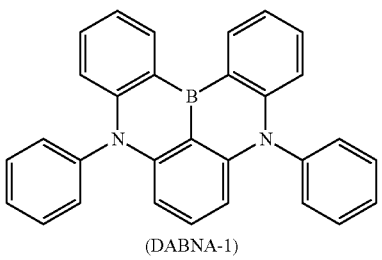
(DABNA-1) DF8

-continued

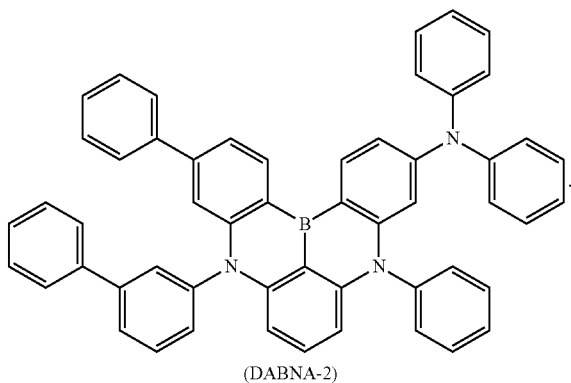

(DABNA-2)

[Quantum Dot]

The emission layer may include a quantum dot.

In the specification, a quantum dot may be a crystal of a semiconductor compound, and may include any material capable of emitting light of various emission wavelengths according to a size of the crystal.

A diameter of the quantum dot may be, for example, in a range of about 1 nm to about 10 nm.

The quantum dot may be synthesized by a wet chemical process, a metal organic chemical vapor deposition process, a molecular beam epitaxy process, or any process similar thereto.

The wet chemical process is a method including mixing a precursor material with an organic solvent and growing a quantum dot particle crystal. When the crystal grows, the organic solvent naturally acts as a dispersant coordinated on the surface of the quantum dot crystal and controls the growth of the crystal so that the growth of quantum dot particles can be controlled through a process with lower costs and is more readily performed than vapor deposition methods, such as metal organic chemical vapor deposition (MOCVD) or molecular beam epitaxy (MBE), The quantum dot may include Group II-VI semiconductor compounds, Group III-V semiconductor compounds, Group III-VI semiconductor compounds, Group I-III-VI semiconductor compounds, Group IV-VI semiconductor compounds, a Group IV element or compound, or any combination thereof.

Examples of the Group II-VI semiconductor compound may include: a binary compound, such as CdSe, CdTe, ZnS, ZnSe, ZnTe, ZnO, HgS, HgSe, HgTe, MgSe, or MgS; a ternary compound, such as CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, or MgZnS; a quaternary compound, such as CdZnSeS, CdZnSeTe, CdZnSTe, CdHgSeS, CdHgSeTe, CdHgSTe, HgZnSeS, HgZnSeTe, or HgZnSTe; or any combination thereof.

Examples of the Group III-V semiconductor compound may include: a binary compound, such as GaN, GaP, GaAs, GaSb, AlN, AlP, AlAs, AlSb, InN, InP, InAs, or InSb; a ternary compound, such as GaNP, GaNAs, GaNSb, GaPAs, GaPSb, AlNP, AlNAs, AlNSb, AlPAs, AlPSb, InGaP, InNP, InAlP, InNAs, InNSb, InPAs, or InPSb; a quaternary compound, such as GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, or InAlPSb; or any combination thereof. In an embodiment, the Group III-V semiconductor compound may further include a Group II element. Examples of the Group III-V semiconductor compound further including a Group II element are InZnP, InGaZnP, InAlZnP, etc.

Examples of the Group III-VI semiconductor compound may include: a binary compound, such as GaS, GaSe, $Ga_2Se_3$, GaTe, InS, InSe, $In_2S_3$, $In_2Se_3$, or InTe; a ternary compound, such as $InGaS_3$, or $InGaSe_3$; and any combination thereof.

Examples of the Group I-III-VI semiconductor compound may include: a ternary compound, such as AgInS, $AgInS_2$, CuInS, $CuInS_2$, $CuGaO_2$, $AgGaO_2$, or $AgAlO_2$; or any combination thereof.

Examples of the Group IV-VI semiconductor compound may include: a binary compound, such as SnS, SnSe, SnTe, PbS, PbSe, or PbTe; a ternary compound, such as SnSeS, SnSeTe, SnSTe, PbSeS, PbSeTe, PbSTe, SnPbS, SnPbSe, or SnPbTe; a quaternary compound, such as SnPbSSe, SnPbSeTe, or SnPbSTe; or any combination thereof.

Examples of the Group IV element or compound may include: a single element material, such as Si or Ge; a binary compound, such as SiC or SiGe; or any combination thereof.

Each element included in a multi-element compound such as a binary compound, a ternary compound, and a quaternary compound may be present in a particle at a uniform concentration or at a non-uniform concentration.

In an embodiment, the quantum dot may have a single structure, wherein a concentration of each element in the quantum dot may be uniform, or the quantum dot may have a core-shell structure. For example, when the quantum dot has a core-shell structure, a material included in the core and a material included in the shell may be different from each other.

The shell of the quantum dot may serve as a protective layer that prevents chemical degeneration of the core to maintain semiconductor characteristics, and/or may serve as a charging layer that imparts electrophoretic characteristics to the quantum dot. The shell may be a single layer or a multi-layer. An interface between the core and the shell may have a concentration gradient in which the concentration of an element existing in the shell decreases toward the core.

Examples of the shell of the quantum dot may include a metal oxide, a metalloid oxide, a non-metal oxide, a semiconductor compound, and any combination thereof. Examples of the metal oxide, the metalloid oxide, or the non-metal oxide may include: a binary compound, such as $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$, or NiO; a ternary compound, such as $MgAl_2O_4$, $CoFe_2O_4$, $NiFe_2O_4$, or $CoMn_2O_4$; and any combination thereof. Examples of the semiconductor compound may include, as described herein, Group II-VI semiconductor compounds; Group III-V semiconductor compounds; Group III-VI semiconductor compounds; Group I-III-VI semiconductor compounds; Group IV-VI semiconductor compounds; and any combination thereof. For example, the semiconductor compound may include CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, AlSb, or any combination thereof.

A full width at half maximum (FWHM) of an emission wavelength spectrum of the quantum dot may be equal to or less than about 45 nm. For example, a FWHM of an emission wavelength spectrum of the quantum dot may be equal to or less than about 40 nm. For example, a FWHM of an emission wavelength spectrum of the quantum dot may be equal to or less than about 30 nm. Within these ranges, color purity or color reproducibility may be increased. Light emitted through the quantum dot may be emitted in all directions, so that a wide viewing angle may be improved.

The quantum dot may be in the form of a spherical particle, a pyramidal particle, a multi-arm particle, a cubic nanoparticle, a nanotube particle, a nanowire particle, a nanofiber particle, or a nanoplate particle.

Since the energy band gap may be adjusted by controlling the size of the quantum dot, light having various wavelength bands may be obtained from the quantum dot emission layer. Accordingly, by using quantum dots of different sizes, a light-emitting device that emits light of various wavelengths may be implemented. In embodiments, the size of the quantum dot may be selected to emit red, green and/or blue light. The size of the quantum dot may be configured to emit white light by combination of light of various colors.

[Electron Transport Region in Interlayer 130]

The light-emitting device according to an embodiment may include the electron transport region in the interlayer. The electron transport region may be the same as in the description above, or as in the description of the light-emitting device below.

The electron transport region may have a structure consisting of a layer consisting of a single material, a structure consisting of a layer consisting of different materials, or a structure including multiple layers including different materials.

The electron-transporting region may include a buffer layer, a hole blocking layer, an electron control layer, an electron transport layer, an electron injection layer, or any combination thereof.

For example, the electron transport region may have an electron transport layer/electron injection layer structure, a hole blocking layer/electron transport layer/electron injection layer structure, an electron control layer/electron transport layer/electron injection layer structure, or a buffer layer/electron transport layer/electron injection layer structure, wherein the layers of each structure may be stacked from an emission layer in its respective stated order, but the structure of the electron transport region is not limited thereto.

In an embodiment, the electron transport region (for example, the buffer layer, the hole blocking layer, the electron control layer, or the electron transport layer in the electron transport region) may include a metal-free compound including at least one π electron-deficient nitrogen-containing $C_1$-$C_{60}$ cyclic group.

In an embodiment, the electron transport region may include a compound represented by Formula 601:

$[Ar_{601}]_{xe11}-[(L_{601})_{xe1}-R_{601}]_{xe21}$     [Formula 601]

In Formula 601,
$Ar_{601}$ and $L_{601}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$,
xe11 may be 1, 2, or 3,
xe1 may be 0, 1, 2, 3, 4, or 5,
$R_{601}$ may be a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, $-Si(Q_{601})(Q_{602})(Q_{603})$, $-C(=O)(Q_{601})$, $-S(=O)_2(Q_{601})$, or $-P(=O)(Q_{601})(Q_{602})$,
$Q_{601}$ to $Q_{603}$ may each independently be the same as described herein with respect to $Q_1$,
xe21 may be 1, 2, 3, 4, or 5, and at least one of $Ar_{601}$, $L_{601}$, and $R_{601}$ may each independently be a π electron-deficient nitrogen-containing $C_1$-$C_{60}$ cyclic group unsubstituted or substituted with at least one $R_{10a}$.

In an embodiment, in Formula 601, when xe11 is 2 or more, two or more of $Ar_{601}$ (s) may be linked to each other via a single bond.

In an embodiment, in Formula 601, $Ar_{601}$ may be a substituted or unsubstituted anthracene group.

In embodiments, the electron transport region may include a compound represented by Formula 601-1:

[Formula 601-1]

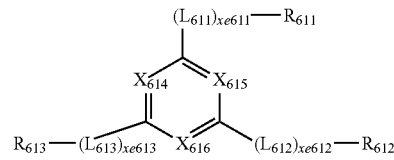

In Formula 601-1,
$X_{614}$ may be N or $C(R_{614})$, $X_{615}$ may be N or $C(R_{615})$, $X_{616}$ may be N or $C(R_{616})$, and at least one of $X_{614}$ to $X_{616}$ may be N,
$L_{611}$ to $L_{613}$ may each independently be the same as described herein with respect to $L_{601}$,
xe611 to xe613 may each independently be the same as described herein with respect to xe1,
$R_{611}$ to $R_{613}$ may each independently be the same as described herein with respect to $R_{601}$, and
$R_{614}$ to $R_{616}$ may each independently be hydrogen, deuterium, —F, —Cl, —Br, —I, a hydroxyl group, a cyano group, a nitro group, a $C_1$-$C_{20}$ alkyl group, a $C_1$-$C_{20}$ alkoxy group, a $C_3$-$C_{60}$ carbocyclic group unsubstituted or substituted with at least one $R_{10a}$, or a $C_1$-$C_{60}$ heterocyclic group unsubstituted or substituted with at least one $R_{10a}$.

In an embodiment, in Formulae 601 and 601-1, xe1 and xe611 to xe613 may each independently be 0, 1, or 2.

The electron transport region may include one of Compounds ET1 to ET45, 2,9-dimethyl-4,7-diphenyl-1,10-phenanthroline (BCP), 4,7-diphenyl-1,10-phenanthroline (Bphen), $Alq_3$, BAlq, TAZ, NTAZ, or any combination thereof:

ET1

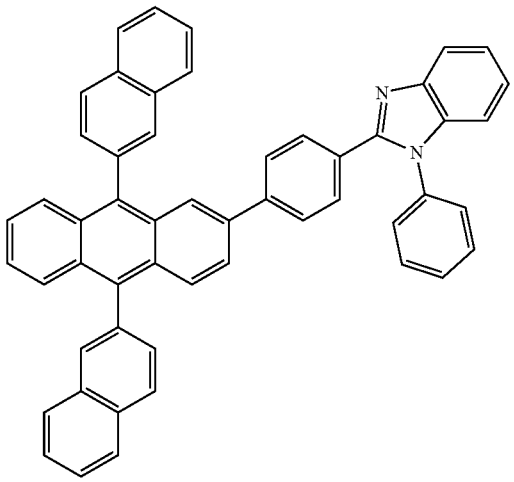

ET2
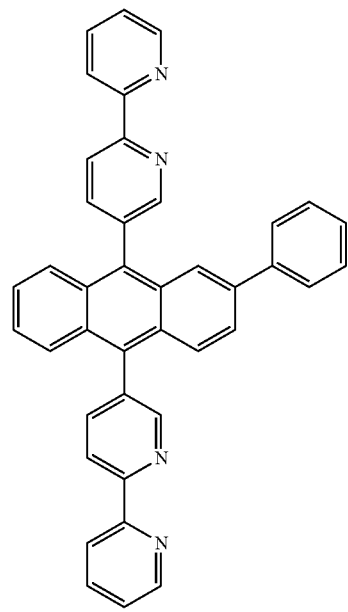
ET3
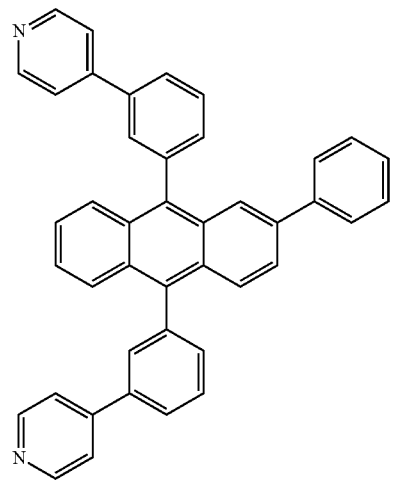
ET4
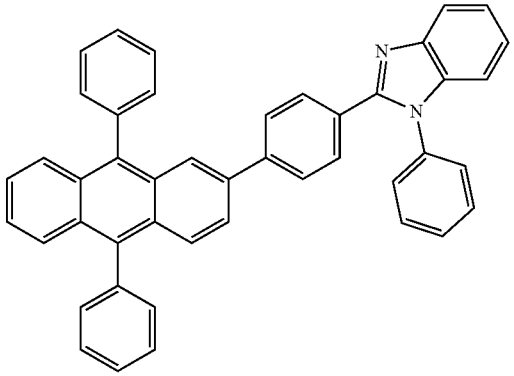
ET5
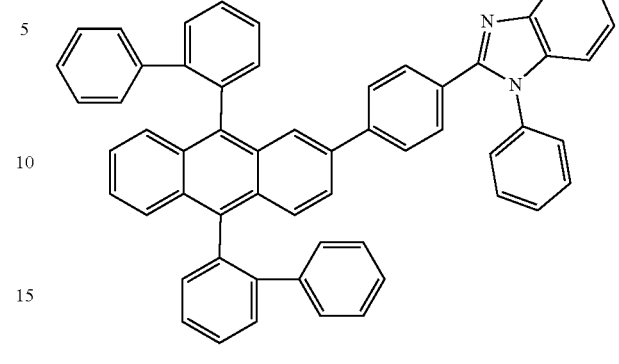
ET6
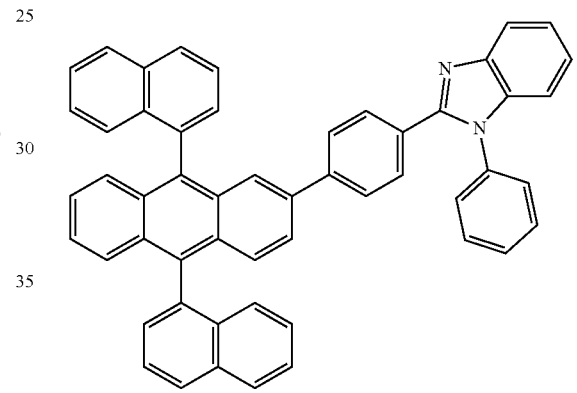
ET7
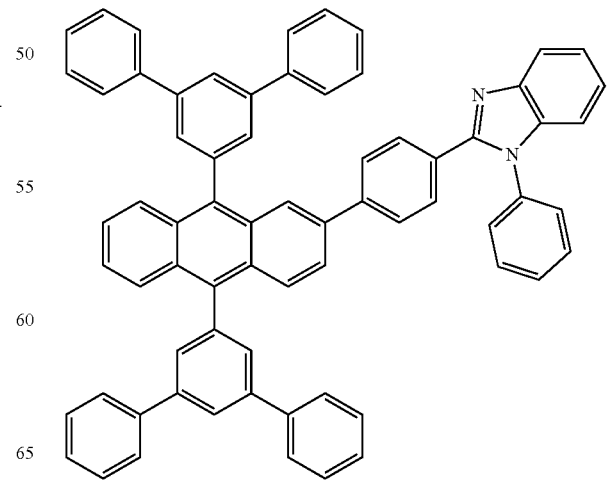

ET8
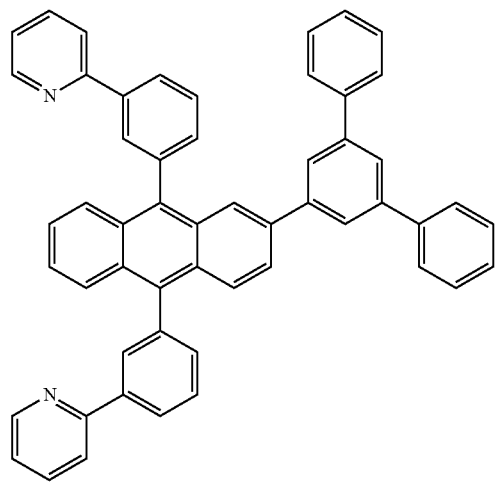
ET10
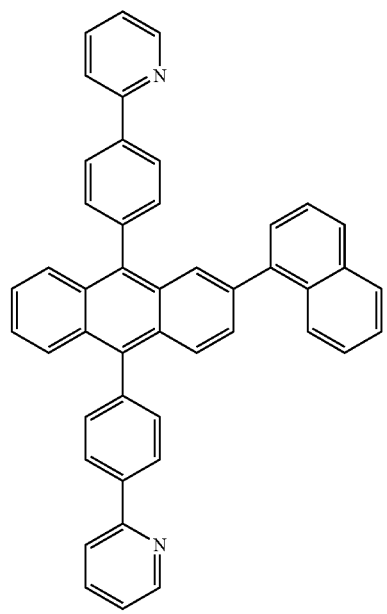
ET11
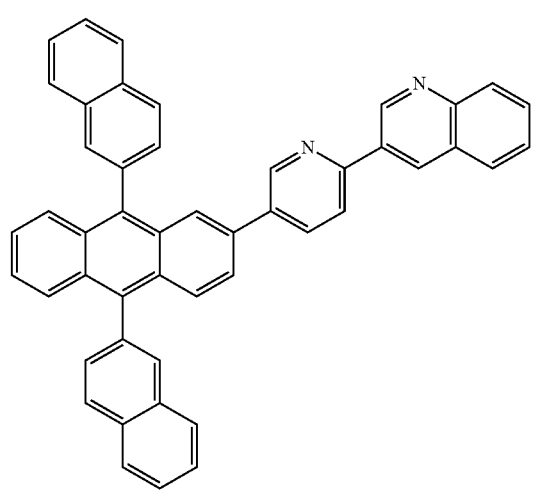
ET9
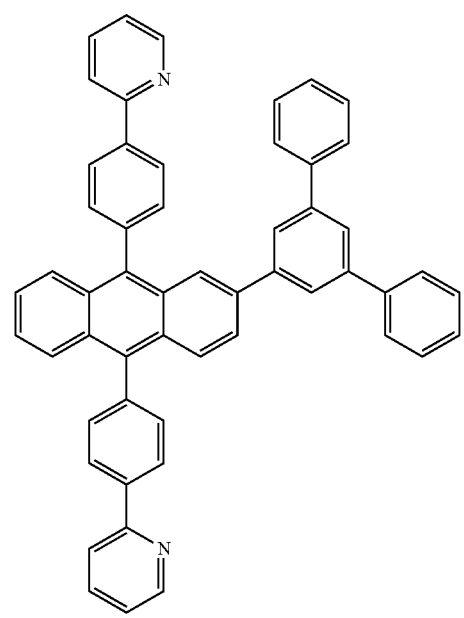
ET12
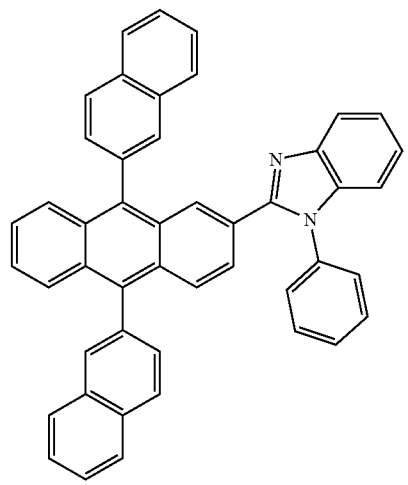

ET13
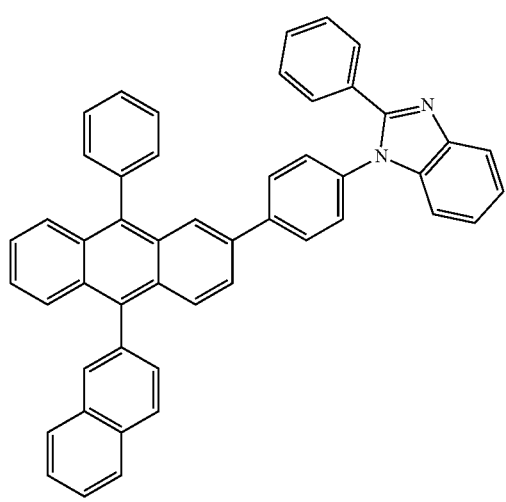
ET14
ET15
ET16
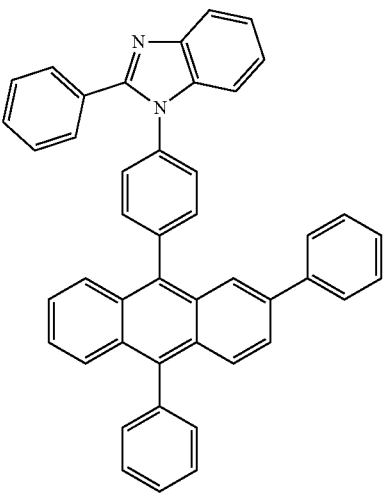
ET17
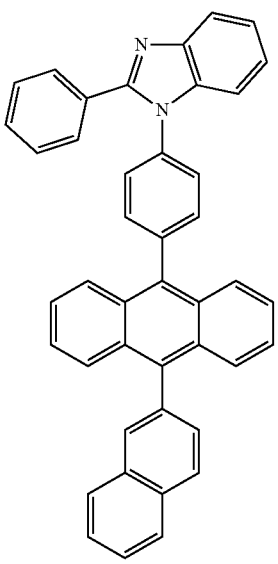
ET18
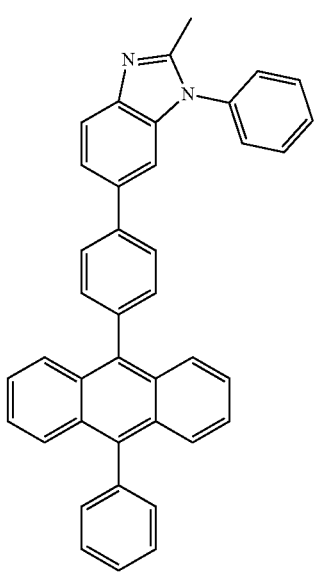

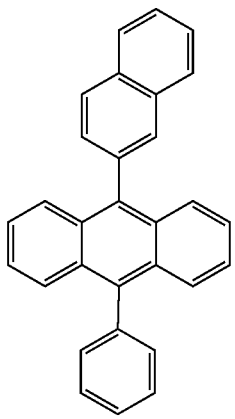
ET19
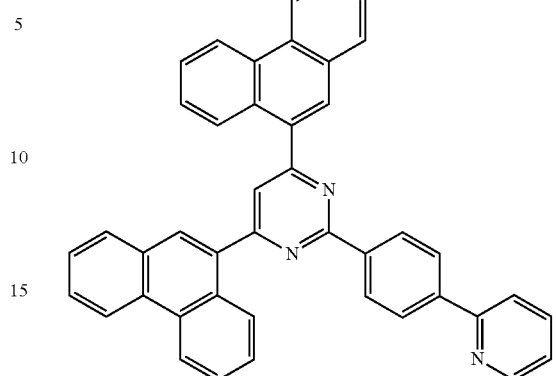
ET22
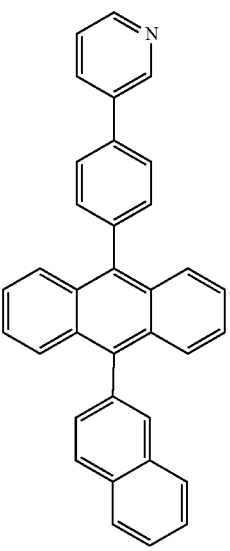
ET20
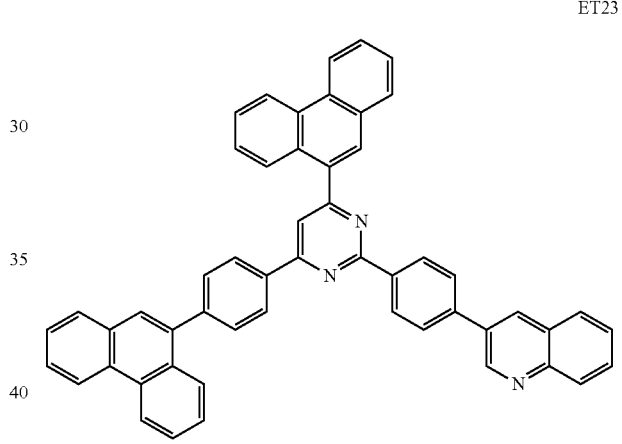
ET23
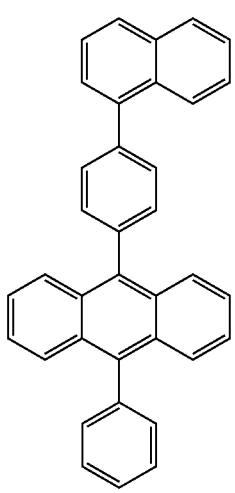
ET21
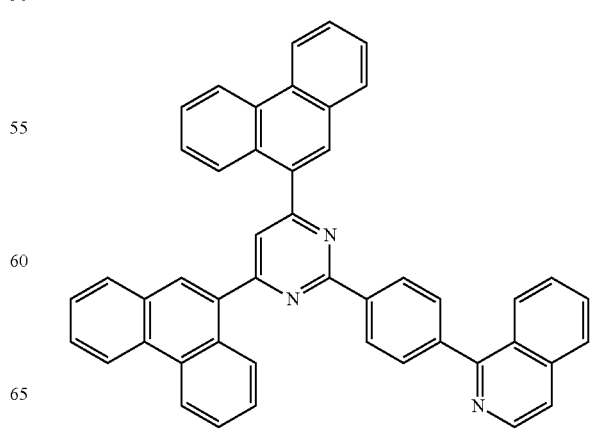
ET24

ET25
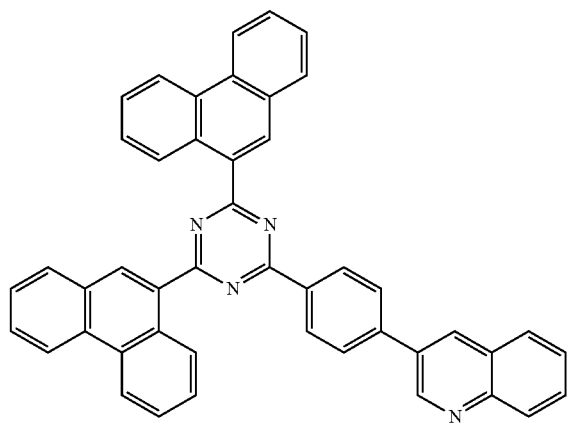
ET26
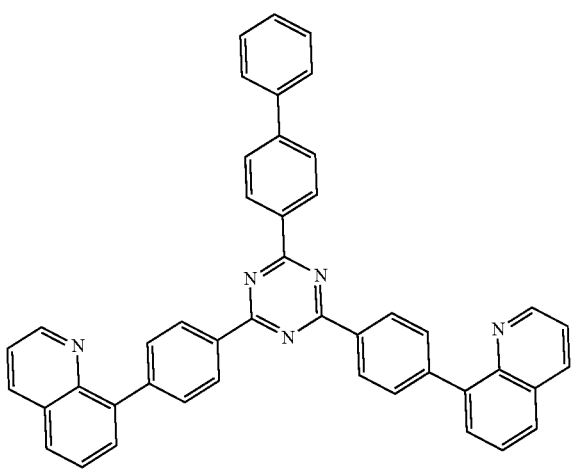
ET27
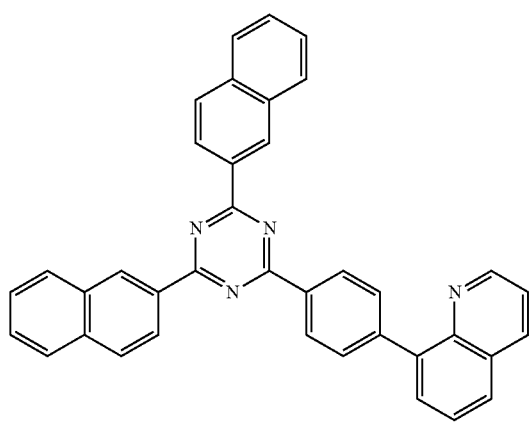
ET28
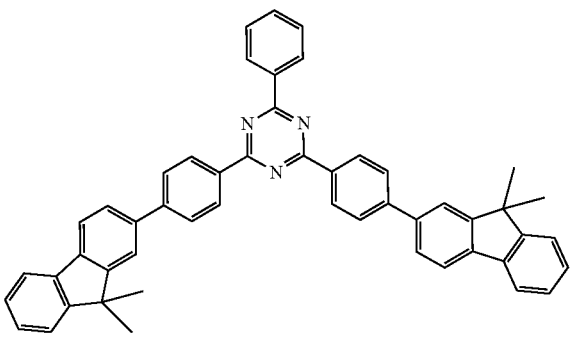
ET29
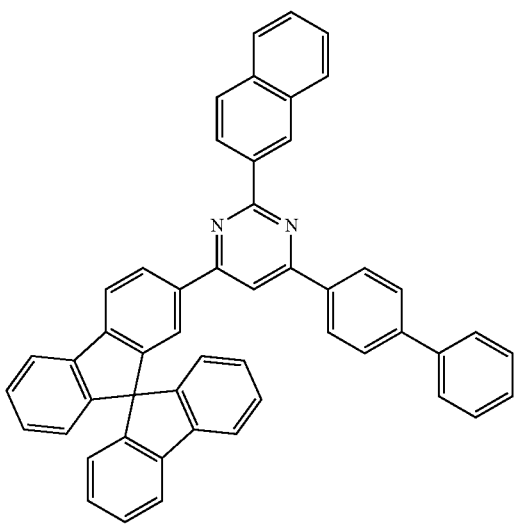
ET30
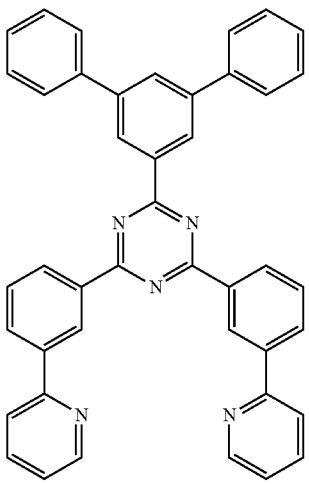

ET31
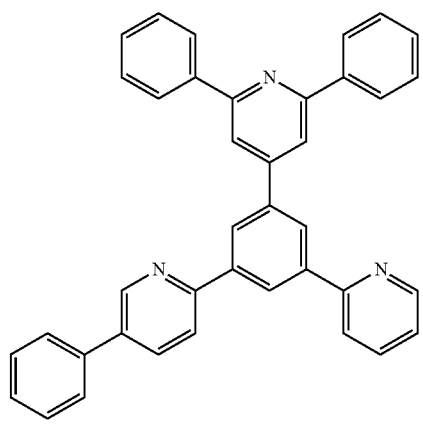
ET32
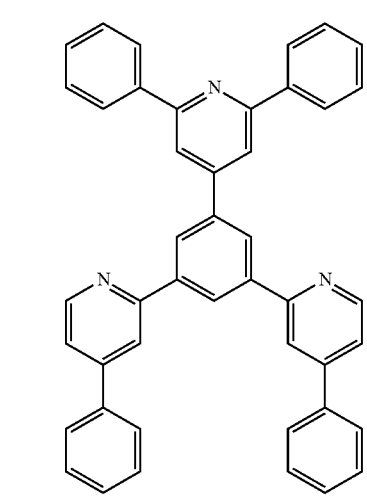
ET33
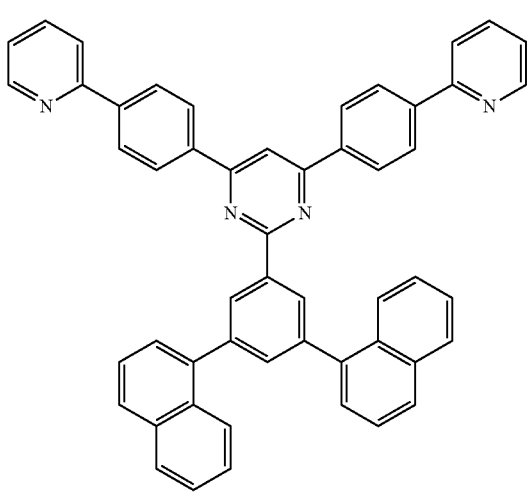
ET34
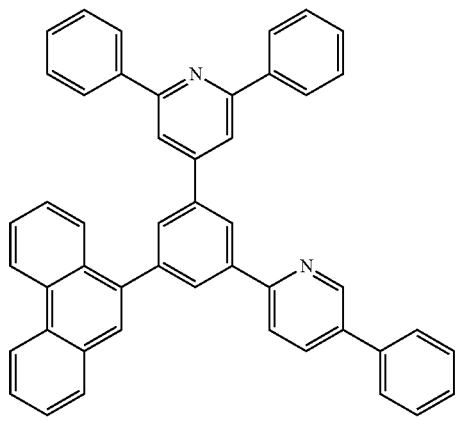
ET35
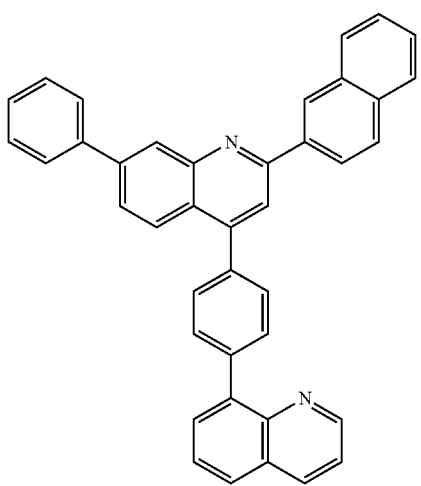
ET36
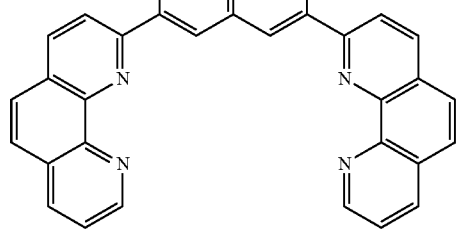
ET37
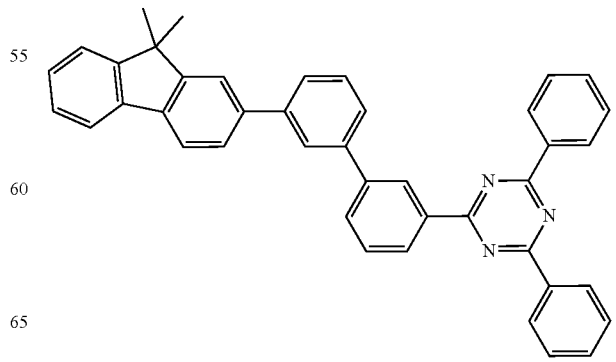

-continued
ET38
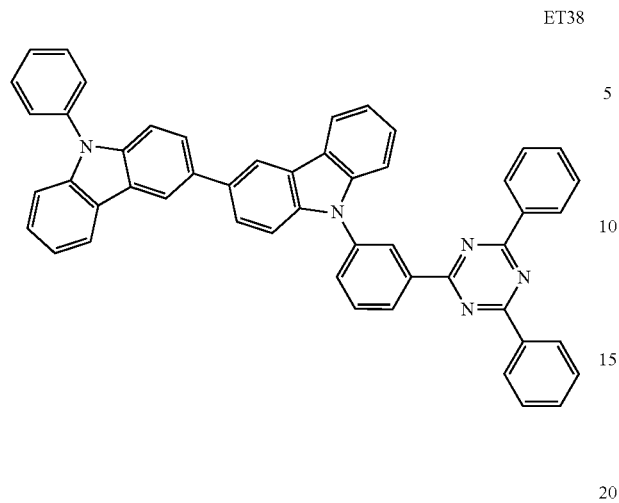
ET39
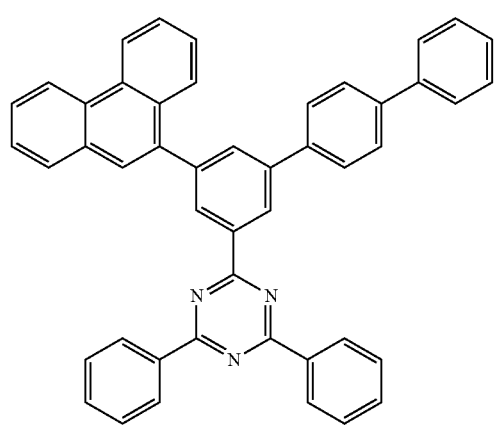
ET40
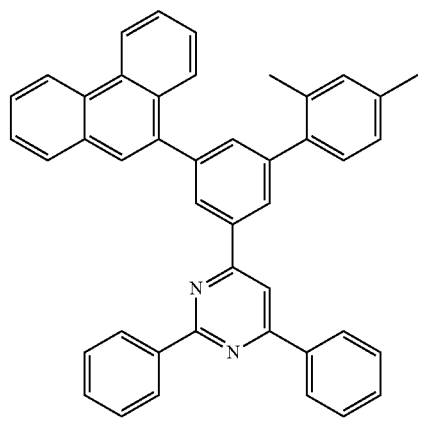
-continued
ET41
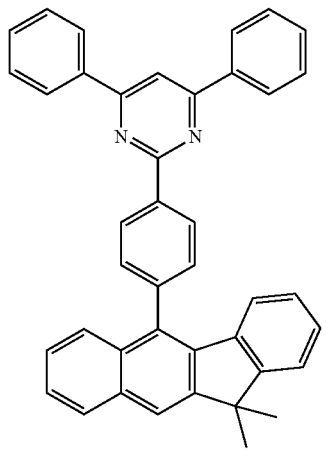
ET42
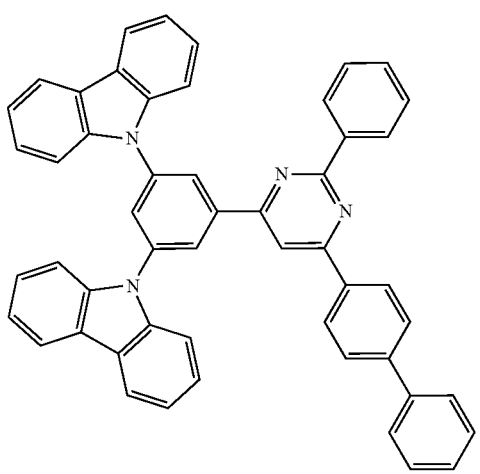
ET43
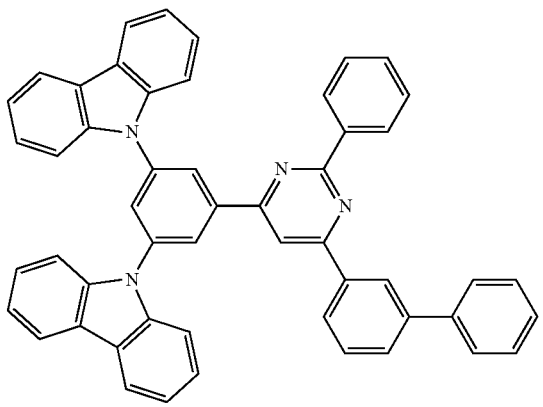

ET44

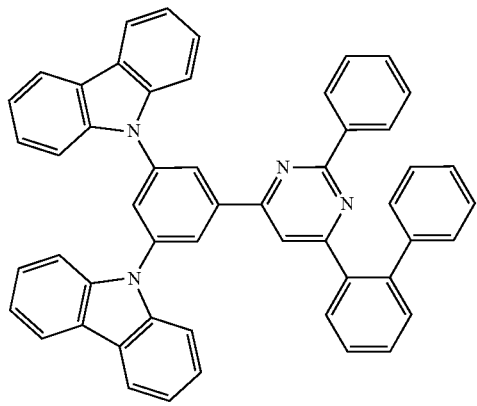

ET45

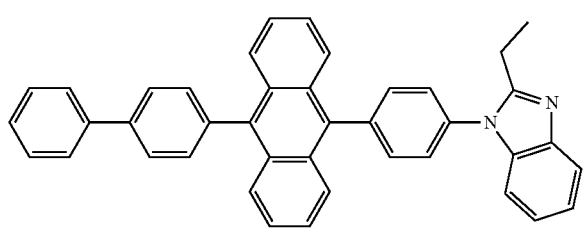

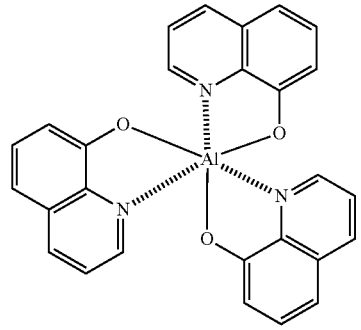

Alq3

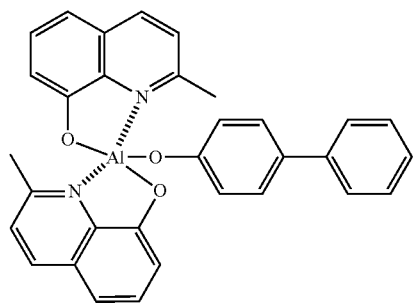

BAlq

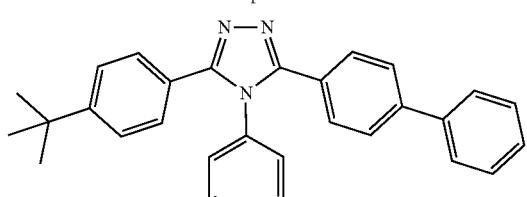

TAZ

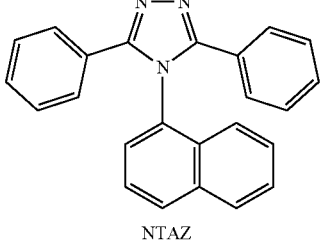

NTAZ

A thickness of the electron transport region may be in a range of about 100 Å to about 5,000 Å. For example, the thickness of the electron transport region may be in a range of about 160 Å to about 4,000 Å. When the electron transport region includes a buffer layer, a hole blocking layer, an electron control layer, an electron transport layer, or any combination thereof, a thickness of the buffer layer, the hole blocking layer, or the electron control layer may each independently be in a range of about 20 Å to about 1,000 Å, for example, and a thickness of the electron transport layer may be in a range of about 100 Å to about 1,000 Å. For example, the thickness of the buffer layer, the hole blocking layer, or the electron control layer may each independently be in a range of about 30 Å to about 300 Å. For example, the thickness of the electron transport layer may be in a range of about 150 Å to about 500 Å. When the thickness of the buffer layer, the hole blocking layer, the electron control layer, the electron transport layer, and/or the electron transport region are within these ranges, satisfactory electron transporting characteristics may be obtained without a substantial increase in driving voltage.

The electron transport region (for example, the electron transport layer in the electron transport region) may further include, in addition to the materials described above, a metal-containing material.

The metal-containing material may include an alkali metal complex, an alkaline earth metal complex, or any combination thereof. A metal ion of an alkali metal complex may be a Li ion, a Na ion, a K ion, a Rb ion, or a Cs ion, and a metal ion of an alkaline earth metal complex may be a Be ion, a Mg ion, a Ca ion, a Sr ion, or a Ba ion. A ligand coordinated with the metal ion of the alkali metal complex or the metal ion of the alkaline earth-metal complex may each independently include a hydroxyquinoline, a hydroxyisoquinoline, a hydroxybenzoquinoline, a hydroxyacridine, a hydroxyphenanthridine, a hydroxyphenyloxazole, a hydroxyphenylthiazole, a hydroxyphenyloxadiazole, a hydroxyphenylthiadiazole, a hydroxyphenylpyridine, a hydroxyphenylbenzimidazole, a hydroxyphenylbenzothiazole, a bipyridine, a phenanthroline, a cyclopentadiene, or any combination thereof.

In an embodiment, the metal-containing material may include a Li complex. The Li complex may include, for example, Compound ET-D1 (LiQ) or Compound ET-D2:

ET-D1

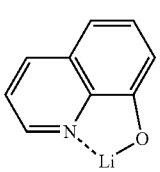

ET-D2

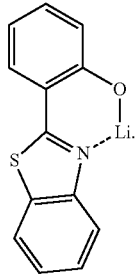

The electron transport region may include an electron injection layer that facilitates the injection of electrons from the second electrode 150. The electron injection layer may directly contact the second electrode 150.

The electron injection layer may have a structure consisting of a layer consisting of a single material, a structure consisting of a layer consisting of different materials, or a structure including multiple layers including different materials.

The electron injection layer may include an alkali metal, an alkaline earth metal, a rare earth metal, an alkali metal-containing compound, an alkaline earth metal-containing compound, a rare earth metal-containing compound, an alkali metal complex, an alkaline earth metal complex, a rare earth metal complex, or any combination thereof.

The alkali metal may include Li, a Na, K, Rb, Cs, or any combination thereof.

The alkaline earth metal may include Mg, Ca, Sr, Ba, or any combination thereof. The rare earth metal may include Sc, Y, Ce, Tb, Yb, Gd, or any combination thereof.

The alkali metal-containing compound, the alkaline earth metal-containing compound, and the rare earth metal-containing compound may be oxides, halides (for example, fluorides, chlorides, bromides, or iodides), or tellurides of the alkali metal, the alkaline earth metal, and the rare earth metal, or any combination thereof.

The alkali metal-containing compound may include: alkali metal oxides, such as $Li_2O$, $Cs_2O$, or $K_2O$; alkali metal halides, such as LiF, NaF, CsF, KF, LiI, NaI, CsI, or KI; or any combination thereof. The alkaline earth metal-containing compound may include an alkaline earth metal compound, such as BaO, SrO, CaO, $Ba_xSr_{1-x}O$ (wherein x is a real number satisfying the condition of 0<x<1), $Ba_xCa_{1-x}O$ (wherein x is a real number satisfying the condition of 0<x<1), or the like. The rare earth metal-containing compound may include $YbF_3$, $ScF_3$, $Sc_2O_3$, $Y_2O_3$, $Ce_2O_3$, $GdF_3$, $TbF_3$, $YbI_3$, $ScI_3$, $TbI_3$, or any combination thereof. In embodiments, the rare earth metal-containing compound may include a lanthanide metal telluride. Examples of the lanthanide metal telluride may include LaTe, CeTe, PrTe, NdTe, PmTe, SmTe, EuTe, GdTe, TbTe, DyTe, HoTe, ErTe, TmTe, YbTe, LuTe, $La_2Te_3$, $Ce_2Te_3$, $Pr_2Te_3$, $Nd_2Te_3$, $Pm_2Te_3$, $Sm_2Te_3$, $Eu_2Te_3$, $Gd_2Te_3$, $Tb_2Te_3$, $Dy_2Te_3$, $Ho_2Te_3$, $Er_2Te_3$, $Tm_2Te_3$, $Yb_2Te_3$, and $Lu_2Te_3$.

The alkali metal complex, the alkaline earth-metal complex, and the rare earth metal complex may include one of ions of the alkali metal, ions of the alkaline earth metal, and ions of the rare earth metal, and ligand bonded to the metal ion (for example, a hydroxyquinoline, a hydroxyisoquinoline, a hydroxybenzoquinoline, a hydroxyacridine, a hydroxyphenanthridine, a hydroxyphenyloxazole, a hydroxyphenylthiazole, a hydroxyphenyloxadiazole, a hydroxyphenylthiadiazole, a hydroxyphenylpyridine, a hydroxyphenyl benzimidazole, a hydroxyphenylbenzothiazole, a bipyridine, a phenanthroline, a cyclopentadiene, or any combination thereof).

The electron injection layer may consist of an alkali metal, an alkaline earth metal, a rare earth metal, an alkali metal-containing compound, an alkaline earth metal-containing compound, a rare earth metal-containing compound, an alkali metal complex, an alkaline earth metal complex, a rare earth metal complex, or any combination thereof, as described above. In embodiments, the electron injection layer may further include an organic material (for example, a compound represented by Formula 601).

In embodiments, the electron injection layer may consist of an alkali metal-containing compound (for example, an alkali metal halide); or the electron injection layer may consist of an alkali metal-containing compound (for example, an alkali metal halide), and an alkali metal, an alkaline earth metal, a rare earth metal, or any combination thereof. For example, the electron injection layer may be a KI:Yb co-deposited layer, an RbI:Yb co-deposited layer, or the like.

When the electron injection layer further includes an organic material, an alkali metal, an alkaline earth metal, a rare earth metal, an alkali metal-containing compound, an alkaline earth metal-containing compound, a rare earth metal-containing compound, an alkali metal complex, an alkaline earth-metal complex, a rare earth metal complex, or any combination thereof may be uniformly or non-uniformly dispersed in a matrix including the organic material.

A thickness of the electron injection layer may be in a range of about 1 Å to about 100 Å. For example, the thickness of the electron injection layer may be in a range of about 3 Å to about 90 Å. When the thickness of the electron injection layer is within the ranges described above, satisfactory electron injection characteristics may be obtained without a substantial increase in driving voltage.

[Second Electrode 150]

The second electrode 150 may be located on the interlayer 130 having a structure as described above. The second electrode 150 may be a cathode, which is an electron injection electrode. The second electrode 150 may include a material having a low-work function, for example, a metal, an alloy, an electrically conductive compound, or any combination thereof.

The second electrode 150 may include lithium (Li), silver (Ag), magnesium (Mg), aluminum (Al), aluminum-lithium (Al—Li), calcium (Ca), magnesium-indium (Mg—In), magnesium-silver (Mg—Ag), ytterbium (Yb), silver-ytterbium (Ag—Yb), ITO, IZO, or any combination thereof. The second electrode 150 may be a transmissive electrode, a semi-transmissive electrode, or a reflective electrode.

The second electrode 150 may have a structure consisting of a single layer or a structure including multiple layers.

[Capping Layer]

The light-emitting device 10 may include a first capping layer located outside the first electrode 110, and/or a second capping layer located outside the second electrode 150. For example, the light-emitting device 10 may have a structure in which the first capping layer, the first electrode 110, the interlayer 130, and the second electrode 150 are stacked in this stated order, a structure in which the first electrode 110, the interlayer 130, the second electrode 150, and the second capping layer are stacked in this stated order, or a structure in which the first capping layer, the first electrode 110, the interlayer 130, the second electrode 150, and the second capping layer are stacked in this stated order.

Light generated in an emission layer of the interlayer 130 of the light-emitting device 10 may be extracted toward the outside through the first electrode 110, which may be a semi-transmissive electrode or a transmissive electrode, and through the first capping layer. Light generated in an emission layer of the interlayer 130 of the light-emitting device 10 may be extracted toward the outside through the second electrode 150, which may be a semi-transmissive electrode or a transmissive electrode, and through the second capping layer.

The first capping layer and the second capping layer may each increase external emission efficiency according to the principle of constructive interference. Accordingly, the light extraction efficiency of the light-emitting device 10 may be increased, so that the luminescence efficiency of the light-emitting device 10 may be improved.

The first capping layer and the second capping layer may each include a material having a refractive index equal to or greater than about 1.6 (with respect to a wavelength of about 589 nm).

The first capping layer and the second capping layer may each independently be an organic capping layer including an organic material, an inorganic capping layer including an inorganic material, or an organic-inorganic composite capping layer including an organic material and an inorganic material.

In an embodiment, at least one of the first capping layer and the second capping layer may each independently include a carbocyclic compound, a heterocyclic compound, an amine group-containing compound, a porphine derivative, a phthalocyanine derivative, a naphthalocyanine derivative, an alkali metal complex, an alkaline earth metal complex, or any combination thereof. The carbocyclic compound, the heterocyclic compound, and the amine group-containing compound may each be optionally substituted with a substituent including O, N, S, Se, Si, F, Cl, Br, I, or any combination thereof.

In embodiments, at least one of the first capping layer and the second capping layer may each independently include an amine group-containing compound.

In embodiments, at least one of the first capping layer and the second capping layer may each independently include a compound represented by Formula 201, a compound represented by Formula 202, or any combination thereof.

In embodiments, at least one of the first capping layer and the second capping layer may each independently include one of Compounds HT28 to HT33, one of Compounds CP1 to CP6, β-NPB, or any combination thereof:

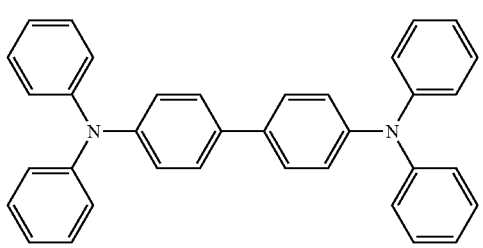

CP1

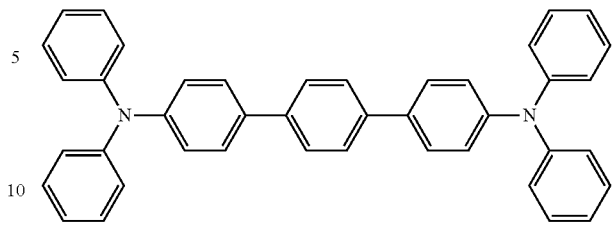

CP2

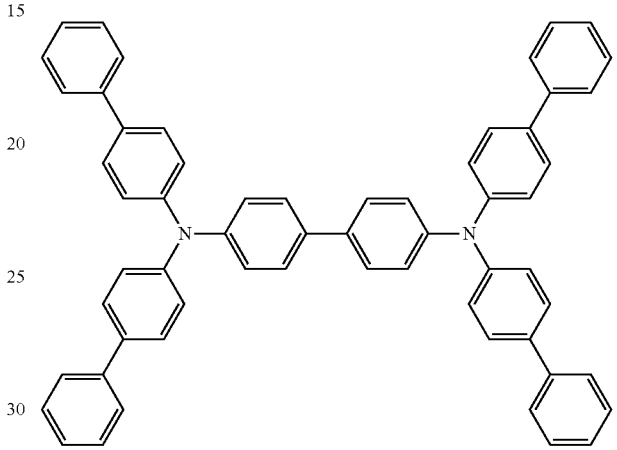

CP3

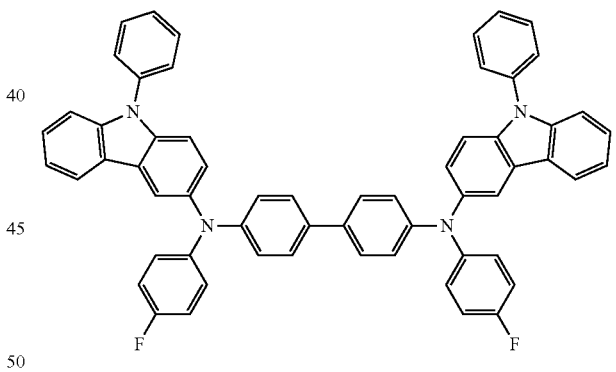

CP4

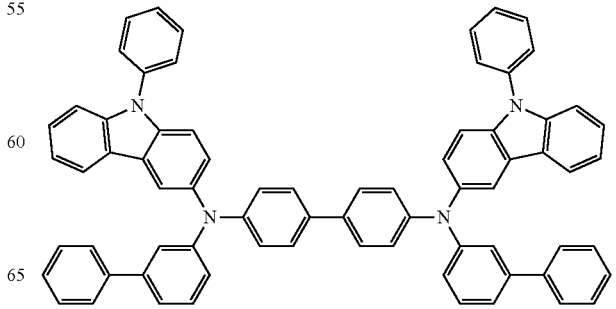

CP5

-continued

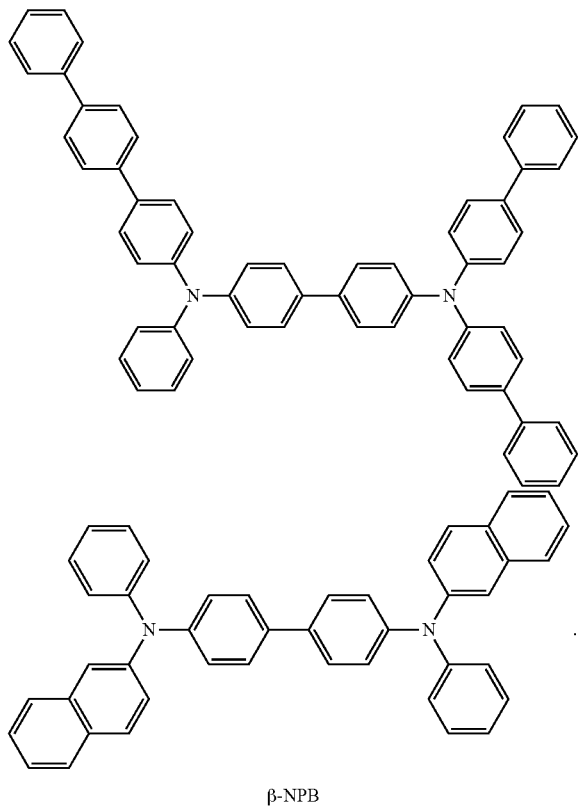

β-NPB

[Electronic Apparatus]

The light-emitting device may be included in various electronic apparatuses. For example, the electronic apparatus including the light-emitting device may be a light-emitting apparatus, an authentication apparatus, or the like.

The electronic apparatus (for example, a light-emitting apparatus) may further include, in addition to the light-emitting device, a color filter, a color conversion layer, or a color filter and a color conversion layer. The color filter and/or the color conversion layer may be located in at least one traveling direction of light emitted from the light-emitting device. For example, the light emitted from the light-emitting device may be blue light or white light. The light-emitting device may be the same as described herein. In embodiments, the color conversion layer may include a quantum dot. The quantum dot may be, for example, a quantum dot as described herein.

The electronic apparatus may include a substrate. The substrate may include subpixels, the color filter may include color filter areas respectively corresponding to the subpixels, and the color conversion layer may include color conversion areas respectively corresponding to the subpixels.

A pixel-defining film may be located between the subpixels to define each subpixel.

The color filter may further include color filter areas and light-shielding patterns located between the color filter areas, and the color conversion layer may further include color conversion areas and light-shielding patterns located between the color conversion areas.

The color filter areas (or the color conversion areas) may include a first area emitting first color light, a second area emitting second color light, and/or a third area emitting third color light, wherein the first color light, the second color light, and/or the third color light may have different maximum emission wavelengths from one another.

For example, the first color light may be red light, the second color light may be green light, and the third color light may be blue light. In an embodiment, the color filter areas (or the color conversion areas) may include quantum dots. For example, the first area may include a red quantum dot, the second area may include a green quantum dot, and the third area may not include a quantum dot. The quantum dot may be the same as described herein. The first area, the second area, and/or the third area may each further include a scatterer.

In an embodiment, the light-emitting device may emit first light, the first area may absorb the first light to emit first-first color light, the second area may absorb the first light to emit second-first color light, and the third area may absorb the first light to emit third-first color light. The first-first color light, the second-first color light, and the third-first color light may have different maximum emission wavelengths from one another. For example, the first light may be blue light, the first-first color light may be red light, the second-first color light may be green light, and the third-first color light may be blue light.

The electronic apparatus may further include a thin-film transistor, in addition to the light-emitting device as described herein. The thin-film transistor may include a source electrode, a drain electrode, and an active layer, wherein any one of the source electrode and the drain electrode may be electrically connected to any one of the first electrode and the second electrode of the light-emitting device.

The thin-film transistor may further include a gate electrode, a gate insulating film, or the like.

The active layer may include crystalline silicon, amorphous silicon, an organic semiconductor, an oxide semiconductor, or the like.

The electronic apparatus may further include a sealing portion for sealing the light-emitting device. The sealing portion may be located between the color conversion layer and/or color filter and the light-emitting device. The sealing portion may allow light from the light-emitting device to be extracted to the outside, and may simultaneously prevent ambient air and moisture from penetrating into the light-emitting device. The sealing portion may be a sealing substrate including a transparent glass substrate or a plastic substrate. The sealing portion may be a thin-film encapsulation layer including an organic layer and/or an inorganic layer. When the sealing portion is a thin film encapsulation layer, the electronic apparatus may be flexible.

Various functional layers may be further included on the sealing portion, in addition to the color filter and/or the color conversion layer, according to the use of the electronic apparatus. Examples of the functional layers may include a touch screen layer, a polarizing layer, an authentication apparatus, and the like. The touch screen layer may be a pressure-sensitive touch screen layer, a capacitive touch screen layer, or an infrared touch screen layer. The authentication apparatus may be, for example, a biometric authentication apparatus that authenticates an individual by using biometric information of a living body (for example, fingertips, pupils, etc.).

The authentication apparatus may further include, in addition to the light-emitting device as described above, a biometric information collector.

The electronic apparatus may be applied to various displays, light sources, lighting, personal computers (for example, a mobile personal computer), mobile phones, digital cameras, electronic organizers, electronic dictionaries, electronic game machines, medical instruments (for example, electronic thermometers, sphygmomanometers, blood glucose meters, pulse measurement devices, pulse wave measurement devices, electrocardiogram displays, ultrasonic diagnostic devices, or endoscope displays), fish finders, various measuring instruments, meters (for example, meters for a vehicle, an aircraft, and a vessel), projectors, and the like.

Description of FIG. 3

FIG. 3 is a schematic cross-sectional view of a light-emitting device according to an embodiment.

The light-emitting device of FIG. 3 may include the first emitting unit 145(1), the second emitting unit 145(2), the third emitting unit 145(3), and the fourth emitting unit 145(4), and may include a first charge generation unit 144(1), a second charge generation unit 144(2), and a third charge generation unit 144(3).

In an embodiment, the fourth emitting unit 145(4) may include the first layer, the second layer, and the third layer. For example, the fourth emitting unit 145(4) may have a structure in which the emission layer, the third layer, the second layer, and the first layer are stacked in this stated order, in the order closest to the first electrode.

In an embodiment, the fourth emitting unit 145(4) may emit green light.

In an embodiment, a maximum emission wavelength of light emitted from the fourth emitting unit 145(4) may be different from the maximum emission wavelength of light emitted from the rest of the emitting units (for example, the first emitting unit 145(1), the second emitting unit 145(2), and the third emitting unit 145(3)).

For example, the fourth emitting unit 145(4) may emit green light, and the first emitting unit 145(1), the second emitting unit 145(2), and the third emitting unit 145(3) may each emit a blue light.

Figure 4:
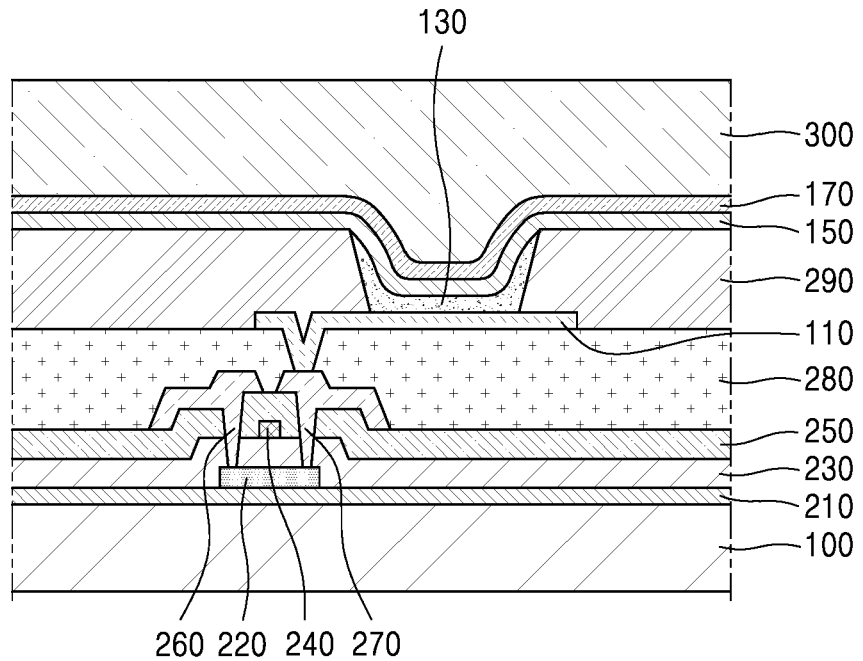
FIG. 4 is a schematic cross-sectional view of an electronic apparatus according to an embodiment.
Figure 5:
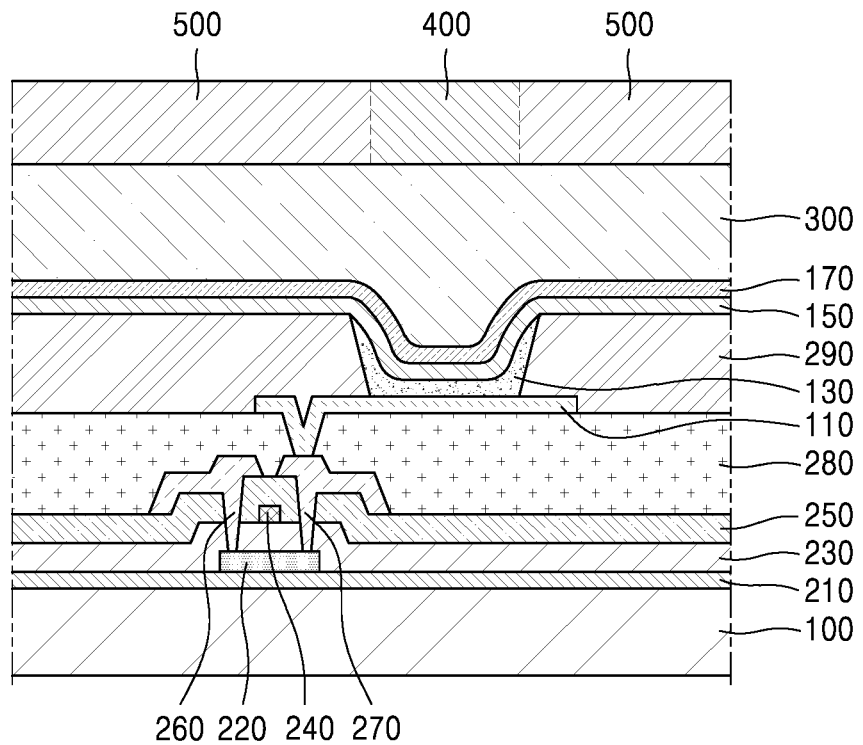
FIG. 5 is a schematic cross-sectional view of an electronic apparatus according to another embodiment.

Description of FIGS. 4 and 5

FIG. 4 is a schematic cross-sectional view showing an electronic apparatus according to an embodiment.

The electronic apparatus of FIG. 4 includes a substrate 100, a thin-film transistor (TFT), a light-emitting device, and an encapsulation portion 300 that seals the light-emitting device.

The substrate 100 may be a flexible substrate, a glass substrate, or a metal substrate. A buffer layer 210 may be located on the substrate 100. The buffer layer 210 may prevent penetration of impurities through the substrate 100 and may provide a flat surface on the substrate 100.

A TFT may be located on the buffer layer 210. The TFT may include an active layer 220, a gate electrode 240, a source electrode 260, and a drain electrode 270.

The active layer 220 may include an inorganic semiconductor such as silicon or polysilicon, an organic semiconductor, or an oxide semiconductor, and may include a source region, a drain region, and a channel region.

A gate insulating film 230 for insulating the active layer 220 from the gate electrode 240 may be located on the active layer 220, and the gate electrode 240 may be located on the gate insulating film 230.

An interlayer insulating film 250 may be located on the gate electrode 240. The interlayer insulating film 250 may be located between the gate electrode 240 and the source electrode 260 and between the gate electrode 240 and the drain electrode 270, to insulate the gate electrode 240, the source electrode 260, and the drain electrode 270 from one another.

The source electrode 260 and the drain electrode 270 may be located on the interlayer insulating film 250. The interlayer insulating film 250 and the gate insulating film 230 may be formed to expose the source region and the drain region of the active layer 220, and the source electrode 260 and the drain electrode 270 may respectively contact the exposed portions of the source region and the drain region of the active layer 220.

The TFT is electrically connected to a light-emitting device to drive the light-emitting device, and is covered and protected by a passivation layer 280. The passivation layer 280 may include an inorganic insulating film, an organic insulating film, or any combination thereof. A light-emitting device is provided on the passivation layer 280. The light-emitting device may include a first electrode 110, an interlayer 130, and a second electrode 150.

The first electrode 110 may be located on the passivation layer 280. The passivation layer 280 may not completely cover the drain electrode 270 and may expose a portion of the drain electrode 270, and the first electrode 110 may be electrically connected to the exposed portion of the drain electrode 270.

A pixel defining layer 290 including an insulating material may be located on the first electrode 110. The pixel defining layer 290 may expose a region of the first electrode 110, and an interlayer 130 may be formed in the exposed region of the first electrode 110. The pixel defining layer 290 may be a polyimide or polyacrylic organic film. Although not shown in FIG. 4, at least some layers of the interlayer 130 may extend beyond the upper portion of the pixel defining layer 290 to be provided in the form of a common layer.

The second electrode 150 may be located on the interlayer 130, and a capping layer 170 may be additionally formed on the second electrode 150. The capping layer 170 may be formed to cover the second electrode 150.

The encapsulation portion 300 may be located on the capping layer 170. The encapsulation portion 300 may be located on a light-emitting device to protect the light-emitting device from moisture and/or oxygen. The encapsulation portion 300 may include: an inorganic film including silicon nitride (SiNx), silicon oxide (SiOx), indium tin oxide, indium zinc oxide, or any combination thereof; an organic film including polyethylene terephthalate, polyethylene naphthalate, polycarbonate, polyimide, polyethylene sulfonate, polyoxymethylene, polyarylate, hexamethyldisiloxane, an acrylic resin (for example, polymethyl methacrylate, polyacrylic acid, or the like), an epoxy-based resin (for example, aliphatic glycidyl ether (AGE), or the like), or any combination thereof; or any combination of the inorganic films and the organic films.

FIG. 5 is a schematic cross-sectional view of an electronic apparatus according to another embodiment.

The electronic apparatus of FIG. 5 may differ from the electronic apparatus of FIG. 4, at least in that a light-shielding pattern 500 and a functional region 400 are further included on the encapsulation portion 300. The functional region 400 may be a color filter area, a color conversion area, or a combination of the color filter area and the color conversion area. In an embodiment, the light-emitting device included in the electronic apparatus of FIG. 5 may be a tandem light-emitting device.

[Manufacturing Method]

The layers included in the hole transport region, the emission layer, and the layers included in the electron transport region may be formed in a specific region by using various methods such as vacuum deposition, spin coating, casting, Langmuir-Blodgett (LB) deposition, ink-jet printing, laser-printing, laser-induced thermal imaging, and the like.

When respective layers included in the hole transport region, the emission layer, and respective layers included in the electron transport region are formed by vacuum deposition, the deposition may be performed at a deposition temperature of about 100° C. to about 500° C., a vacuum degree of about $10^{-8}$ torr to about $10^{-3}$ torr, and a deposition speed of about 0.01 Å/sec to about 100 Å/sec, depending on the material to be included in a layer to be formed and the structure of a layer to be formed.

Definitions of Terms

The term "$C_3$-$C_{60}$ carbocyclic group" as used herein may be a cyclic group consisting of carbon as the only ring-forming atoms and having three to sixty carbon atoms, and the term "$C_1$-$C_{60}$ heterocyclic group" as used herein may be a cyclic group that has one to sixty carbon atoms and further has, in addition to carbon, at least one heteroatom as ring-forming atoms. The $C_3$-$C_{60}$ carbocyclic group and the $C_1$-$C_{60}$ heterocyclic group may each be a monocyclic group consisting of one ring or a polycyclic group in which two or more rings are condensed with each other. In an embodiment, the $C_1$-$C_{60}$ heterocyclic group may have 3 to 61 ring-forming atoms.

The term "cyclic group" as used herein may include the $C_3$-$C_{60}$ carbocyclic group or the $C_1$-$C_{60}$ heterocyclic group.

The term "π electron-rich $C_3$-$C_{60}$ cyclic group" as used herein may be a cyclic group that has three to sixty carbon atoms and may not include *—N=*' as a ring-forming moiety, and the term "π electron-deficient nitrogen-containing $C_1$-$C_{60}$ cyclic group" as used herein may be a heterocyclic group that has one to sixty carbon atoms and may include *—N=*' as a ring-forming moiety.

In embodiments,
the $C_3$-$C_{60}$ carbocyclic group may be a T1 group or a cyclic group in which two or more T1 groups are condensed with each other (for example, a cyclopentadiene group, an adamantane group, a norbornane group, a benzene group, a pentalene group, a naphthalene group, an azulene group, an indacene group, an acenaphthylene group, a phenalene group, a phenanthrene group, an anthracene group, a fluoranthene group, a triphenylene group, a pyrene group, a chrysene group, a perylene group, a pentaphene group, a heptalene group, a naphthacene group, a picene group, a hexacene group, a pentacene group, a rubicene group, a coronene group, an ovalene group, an indene group, a fluorene group, a spiro-bifluorene group, a benzofluorene group, an indenophenanthrene group, or an indenoanthracene group), the $C_1$-$C_{60}$ heterocyclic group may be a T2 group, a cyclic group in which two or more T2 groups are condensed with each other, or a cyclic group in which at least one T2 group and at least one T1 group are condensed with each other (for example, a pyrrole group, a thiophene group, a furan group, an indole group, a benzoindole group, a naphthoindole group, an isoindole group, a benzoisoindole group, a naphthoisoindole group, a benzosilole group, a benzothiophene group, a benzofuran group, a carbazole group, a dibenzosilole group, a dibenzothiophene group, a dibenzofuran group, an indenocarbazole group, an indolocarbazole group, a benzofurocarbazole group, a benzothienocarbazole group, a benzosilolocarbazole group, a benzoindolocarbazole group, a benzocarbazole group, a benzonaphthofuran group, a benzonaphthothiophene group, a benzonaphthosilole group, a benzofurodibenzofuran group, a benzofurodibenzothiophene group, a benzothienodibenzothiophene group, a pyrazole group, an imidazole group, a triazole group, an oxazole group, an isoxazole group, an oxadiazole group, a thiazole group, an isothiazole group, a thiadiazole group, a benzopyrazole group, a benzimidazole group, a benzoxazole group, a benzoisoxazole group, a benzothiazole group, a benzoisothiazole group, a pyridine group, a pyrimidine group, a pyrazine group, a pyridazine group, a triazine group, a quinoline group, an isoquinoline group, a benzoquinoline group, a benzoisoquinoline group, a quinoxaline group, a benzoquinoxaline group, a quinazoline group, a benzoquinazoline group, a phenanthroline group, a cinnoline group, a phthalazine group, a naphthyridine group, an imidazopyridine group, an imidazopyrimidine group, an imidazotriazine group, an imidazopyrazine group, an imidazopyridazine group, an azacarbazole group, an azafluorene group, an azadibenzosilole group, an azadibenzothiophene group, an azadibenzofuran group, etc.), the π electron-rich $C_3$-$C_{60}$ cyclic group may be a T1 group, a cyclic group in which two or more T1 groups are condensed with each other, a T3 group, a cyclic group in which two or more T3 groups are condensed with each other, or a cyclic group in which at least one T3 group and at least one T1 group are condensed with each other (for example, the $C_3$-$C_{60}$ carbocyclic group, a 1H-pyrrole group, a silole group, a borole group, a 2H-pyrrole group, a 3H-pyrrole group, a thiophene group, a furan group, an indole group, a benzoindole group, a naphthoindole group, an isoindole group, a benzoisoindole group, a naphthoisoindole group, a benzosilole group, a benzothiophene group, a benzofuran group, a carbazole group, a dibenzosilole group, a dibenzothiophene group, a dibenzofuran group, an indenocarbazole group, an indolocarbazole group, a benzofurocarbazole group, a benzothienocarbazole group, a benzosilolocarbazole group, a benzoindolocarbazole group, a benzocarbazole group, a benzonaphthofuran group, a benzonaphthothiophene group, a benzonaphthosilole group, a benzofurodibenzofuran group, a benzofurodibenzothiophene group, a benzothienodibenzothiophene group, etc.), the π electron-deficient nitrogen-containing $C_1$-$C_{60}$ cyclic group may be a T4 group, a cyclic group in which two or more T4 groups are condensed with each other, a cyclic group in which at least one T4 group and at least one T1 group are condensed with each other, a cyclic group in which at least one T4 group and at least one T3 group are condensed with each other, or a cyclic group in which at least one T4 group, at least one T1 group, and at least one T3 group are condensed with one another (for example, a pyrazole group, an imidazole group, a triazole group, an oxazole group, an isoxazole group, an oxadiazole group, a thiazole group, an isothiazole group, a thiadiazole group, a benzopyrazole group, a benzimidazole group, a benzoxazole group, a benzoisoxazole group, a benzothiazole group, a benzoisothiazole group, a pyridine group, a pyrimidine group, a pyrazine group, a pyridazine group, a triazine group, a quinoline group, an isoquinoline group, a benzoquinoline group, a benzoisoquinoline group, a quinoxaline group, a benzoquinoxaline group, a quinazoline group, a benzoquinazoline group, a phenanthroline group, a cinnoline group, a phthalazine group, a naphthyridine group, an imidazopyridine group, an imidazopyrimidine group, an imidazotriazine group, an imidazopyrazine group, an imidazopyridazine group, an azacarbazole group, an azafluorene group, an azadibenzosilole group, an azadibenzothiophene group, an azadibenzofuran group, etc.), wherein the T1 group may be a cyclopropane group, a cyclobutane group, a cyclopentane group, a cyclohexane group, a cycloheptane group, a cyclooctane group, a cyclobutene group, a cyclopentene group, a cyclopentadiene group, a cyclohexene group, a cyclohexadiene group, a cycloheptene group, an adamantane group, a norbornane (or a bicyclo[2.2.1]heptane) group, a norbornene group, a bicyclo[1.1.1]pentane group, a bicyclo[2.1.1]hexane group, a bicyclo[2.2.2]octane group, or a benzene group, the T2 group may be a furan group, a thiophene group, a 1H-pyrrole group, a silole group, a borole group, a 2H-pyrrole group, a 3H-pyrrole group, an imidazole group, a pyrazole group, a triazole group, a tetrazole group, an oxazole group, an isoxazole group, an oxadiazole group, a thiazole group, an isothiazole group, a thiadiazole group, an azasilole group, an azaborole group, a pyridine group, a pyrimidine group, a pyrazine group, a pyridazine group, a triazine group, a tetrazine group, a pyrrolidine group, an imidazolidine group, a dihydropyrrole group, a piperidine group, a tetrahydropyridine group, a dihydropyridine group, a hexahydropyrimidine group, a tetrahydropyrimidine group, a dihydropyrimidine group, a piperazine group, a tetrahydropyrazine group, a dihydropyrazine group, a tetrahydropyridazine group, or a dihydropyridazine group, the T3 group may be a furan group, a thiophene group, a 1H-pyrrole group, a silole group, or a borole group, and the T4 group may be a 2H-pyrrole group, a 3H-pyrrole group, an imidazole group, a pyrazole group, a triazole group, a tetrazole group, an oxazole group, an isoxazole group, an oxadiazole group, a thiazole group, an isothiazole group, a thiadiazole group, an azasilole group, an azaborole group, a pyridine group, a pyrimidine group, a pyrazine group, a pyridazine group, a triazine group, or a tetrazine group.

The terms "cyclic group", "$C_3$-$C_{60}$ carbocyclic group", "$C_1$-$C_{60}$ heterocyclic group", "π electron-rich $C_3$-$C_{60}$ cyclic group", or "π electron-deficient nitrogen-containing $C_1$-$C_{60}$ cyclic group" as used herein may each be a group condensed to any cyclic group, a monovalent group, or a polyvalent group (for example, a divalent group, a trivalent group, a tetravalent group, etc.) according to the structure of a formula for which the corresponding term is used. For example, a "benzene group" may be a benzo group, a phenyl group, a phenylene group, or the like, which may be readily understood by one of ordinary skill in the art according to the structure of a formula including the "benzene group."

Examples of the monovalent $C_3$-$C_{60}$ carbocyclic group and the monovalent $C_1$-$C_{60}$ heterocyclic group may include a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a monovalent non-aromatic condensed polycyclic group, and a monovalent non-aromatic condensed heteropolycyclic group. Examples of the divalent $C_3$-$C_{60}$ carbocyclic group and the divalent $C_1$-$C_{60}$ heterocyclic group may include a $C_3$-$C_{10}$ cycloalkylene group, a $C_1$-$C_{10}$ heterocycloalkylene group, a $C_3$-$C_{10}$ cycloalkenylene group, a $C_1$-$C_{10}$ heterocycloalkenylene group, a $C_6$-$C_{60}$ arylene group, a $C_1$-$C_{60}$ heteroarylene group, a divalent non-aromatic condensed polycyclic group, and a substituted or unsubstituted divalent non-aromatic condensed heteropolycyclic group.

The term "$C_1$-$C_{60}$ alkyl group" as used herein may be a linear or branched aliphatic hydrocarbon monovalent group that has one to sixty carbon atoms, and examples thereof may include a methyl group, an ethyl group, an n-propyl group, an isopropyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, an n-hexyl group, an isohexyl group, a sec-hexyl group, a tert-hexyl group, an n-heptyl group, an isoheptyl group, a sec-heptyl group, a tert-heptyl group, an n-octyl group, an isooctyl group, a sec-octyl group, a tert-octyl group, an n-nonyl group, an isononyl group, a sec-nonyl group, a tert-nonyl group, an n-decyl group, an isodecyl group, a sec-decyl group, and a tert-decyl group. The term "$C_1$-$C_{60}$ alkylene group" as used herein may be a divalent group having a same structure as the $C_1$-$C_{60}$ alkyl group.

The term "$C_2$-$C_{60}$ alkenyl group" as used herein may be a monovalent hydrocarbon group having at least one carbon-carbon double bond in the middle or at a terminus of the $C_2$-$C_{60}$ alkyl group, and examples thereof may include an ethenyl group, a propenyl group, and a butenyl group. The term "$C_2$-$C_{60}$ alkenylene group" as used herein may be a divalent group having a same structure as the $C_2$-$C_{60}$ alkenyl group.

The term "$C_2$-$C_{60}$ alkynyl group" as used herein may be a monovalent hydrocarbon group having at least one carbon-carbon triple bond in the middle or at a terminus of the $C_2$-$C_{60}$ alkyl group, and examples thereof may include an ethynyl group, a propynyl group, and the like. The term "$C_2$-$C_{60}$ alkynylene group" as used herein may be a divalent group having a same structure as the $C_2$-$C_{60}$ alkynyl group.

The term "$C_1$-$C_{60}$ alkoxy group" as used herein may be a monovalent group represented by —O($A_{101}$) (wherein $A_{101}$ may be a $C_1$-$C_{60}$ alkyl group), and examples thereof may include a methoxy group, an ethoxy group, and an isopropyloxy group.

The term "$C_3$-$C_{10}$ cycloalkyl group" as used herein may be a monovalent saturated hydrocarbon cyclic group having 3 to 10 carbon atoms, and examples thereof may include a cyclopropyl group, a cyclobutyl group, a cyclopentyl group, a cyclohexyl group, a cycloheptyl group, a cyclooctyl group, an adamantanyl group, a norbornanyl group (or bicyclo[2.2.1]heptyl group), a bicyclo[1.1.1]pentyl group, a bicyclo[2.1.1]hexyl group, and a bicyclo[2.2.2]octyl group. The term "$C_3$-$C_{10}$ cycloalkylene group" as used herein may be a divalent group having a same structure as the $C_3$-$C_{10}$ cycloalkyl group.

The term "$C_1$-$C_{10}$ heterocycloalkyl group" as used herein may be a monovalent cyclic group of 1 to 10 carbon atoms, further including, in addition to carbon atoms, at least one heteroatom, as ring-forming atoms, and specific examples may include a 1,2,3,4-oxatriazolidinyl group, a tetrahydrofuranyl group, and a tetrahydrothiophenyl group. The term "$C_1$-$C_{10}$ heterocycloalkylene group" as used herein may be a divalent group having a same structure as the $C_1$-$C_{10}$ heterocycloalkyl group.

The term "$C_3$-$C_{10}$ cycloalkenyl group" as used herein may be a monovalent cyclic group that has three to ten carbon atoms and at least one carbon-carbon double bond in the ring thereof and no aromaticity, and examples thereof may include a cyclopentenyl group, a cyclohexenyl group, and a cycloheptenyl group. The term "$C_3$-$C_{10}$ cycloalkenylene group" as used herein may be a divalent group having a same structure as the $C_3$-$C_{10}$ cycloalkenyl group.

The term "$C_1$-$C_{10}$ heterocycloalkenyl group" as used herein may be a monovalent cyclic group of 1 to 10 carbon atoms, further including, in addition to carbon atoms, at least one heteroatom, as ring-forming atoms, and having at least one carbon-carbon double bond in the cyclic structure thereof. Examples of the $C_1$-$C_{10}$ heterocycloalkenyl group may include a 4,5-dihydro-1,2,3,4-oxatriazolyl group, a 2,3-dihydrofuranyl group, and a 2,3-dihydrothiophenyl group. The term "$C_1$-$C_{10}$ heterocycloalkenylene group" as used herein may be a divalent group having a same structure as the $C_1$-$C_{10}$ heterocycloalkenyl group.

The term "$C_6$-$C_{60}$ aryl group" as used herein may be a monovalent group having a carbocyclic aromatic system of 6 to 60 carbon atoms, and the term "$C_6$-$C_{60}$ arylene group" as used herein may be a divalent group having a carbocyclic aromatic system of 6 to 60 carbon atoms. Examples of the $C_6$-$C_{60}$ aryl group may include a phenyl group, a pentalenyl group, a naphthyl group, an azulenyl group, an indacenyl group, an acenaphthyl group, a phenalenyl group, a phenanthrenyl group, an anthracenyl group, a fluoranthenyl group, a triphenylenyl group, a pyrenyl group, a chrysenyl group, a perylenyl group, a pentaphenyl group, a heptalenyl group, a naphthacenyl group, a picenyl group, a hexacenyl group, a pentacenyl group, a rubicenyl group, a coronenyl group, and an ovalenyl group. When the $C_6$-$C_{60}$ aryl group and the $C_6$-$C_{60}$ arylene group each include two or more rings, the respective rings may be condensed with each other.

The term "$C_1$-$C_{60}$ heteroaryl group" as used herein may be a monovalent group having a heterocyclic aromatic system of 1 to 60 carbon atoms, further including, in addition to carbon atoms, at least one heteroatom, as ring-forming atoms. The term "$C_1$-$C_{60}$ heteroarylene group" as used herein may be a divalent group having a heterocyclic aromatic system of 1 to 60 carbon atoms, further including, in addition to carbon atoms, at least one heteroatom, as ring-forming atoms. Examples of the $C_1$-$C_{60}$ heteroaryl group may include a pyridinyl group, a pyrimidinyl group, a pyrazinyl group, a pyridazinyl group, a triazinyl group, a quinolinyl group, a benzoquinolinyl group, an isoquinolinyl group, a benzoisoquinolinyl group, a quinoxalinyl group, a benzoquinoxalinyl group, a quinazolinyl group, a benzoquinazolinyl group, a cinnolinyl group, a phenanthrolinyl group, a phthalazinyl group, and a naphthyridinyl group. When the $C_1$-$C_{60}$ heteroaryl group and the $C_1$-$C_{60}$ heteroarylene group each include two or more rings, the respective rings may be condensed with each other.

The term "monovalent non-aromatic condensed polycyclic group" as used herein may be a monovalent group (for example, having 8 to 60 carbon atoms) having two or more rings condensed to each other, only carbon atoms as ring-forming atoms, and no aromaticity in its entire molecular structure. Examples of the monovalent non-aromatic condensed polycyclic group may include an indenyl group, a fluorenyl group, a spiro-bifluorenyl group, a benzofluorenyl group, an indenophenanthrenyl group, and an indeno anthracenyl group. The term "divalent non-aromatic condensed polycyclic group" as used herein may be a divalent group having a same structure as the monovalent non-aromatic condensed polycyclic group.

The term "monovalent non-aromatic condensed heteropolycyclic group" as used herein may be a monovalent group (for example, having 1 to 60 carbon atoms) having two or more rings condensed to each other, further including, in addition to carbon atoms, at least one heteroatom, as ring-forming atoms, and having non-aromaticity in its entire molecular structure. Examples of the monovalent non-aromatic condensed heteropolycyclic group may include a pyrrolyl group, a thiophenyl group, a furanyl group, an indolyl group, a benzoindolyl group, a naphthoindolyl group, an isoindolyl group, a benzoisoindolyl group, a naphthoisoindolyl group, a benzosilolyl group, a benzothiophenyl group, a benzofuranyl group, a carbazolyl group, a dibenzosilolyl group, a dibenzothiophenyl group, a dibenzofuranyl group, an azacarbazolyl group, an azafluorenyl group, an azadibenzosilolyl group, an azadibenzothiophenyl group, an azadibenzofuranyl group, a pyrazolyl group, an imidazolyl group, a triazolyl group, a tetrazolyl group, an oxazolyl group, an isoxazolyl group, a thiazolyl group, an isothiazolyl group, an oxadiazolyl group, a thiadiazolyl group, a benzopyrazolyl group, a benzimidazolyl group, a benzoxazolyl group, a benzothiazolyl group, a benzoxadiazolyl group, a benzothiadiazolyl group, an imidazopyridinyl group, an imidazopyrimidinyl group, an imidazotriazinyl group, an imidazopyrazinyl group, an imidazopyridazinyl group, an indeno carbazolyl group, an indolocarbazolyl group, a benzofurocarbazolyl group, a benzothienocarbazolyl group, a benzosilolocarbazolyl group, a benzoindolocarbazolyl group, a benzocarbazolyl group, a benzonaphthofuranyl group, a benzonaphthothiophenyl group, a benzonaphthosilolyl group, a benzofurodibenzofuranyl group, a benzofurodibenzothiophenyl group, and a benzothienodibenzothiophenyl group. The term "divalent non-aromatic condensed heteropolycyclic group" as used herein may be a divalent group having a same structure as the monovalent non-aromatic condensed heteropolycyclic group.

The term "$C_6$-$C_{60}$ aryloxy group" as used herein may be represented by —O($A_{102}$) (wherein $A_{102}$ may be a $C_6$-$C_{60}$ aryl group), and the term "$C_6$-$C_{60}$ arylthio group" as used herein may be represented by —S($A_1O_3$) (wherein $A_{103}$ may be a $C_6$-$C_{60}$ aryl group).

The term "$C_7$-$C_{60}$ aryl alkyl group" as used herein may be represented by -($A_{104}$)($A_{105}$) (wherein $A_{104}$ may be a $C_1$-$C_{54}$ alkylene group, and $A_{105}$ may be a $C_6$-$C_{59}$ aryl group), and the term "$C_2$-$C_{60}$ heteroaryl alkyl group" as used herein may be represented by -($A_{106}$)($A_{107}$) (wherein $A_{106}$ may be a $C_1$-$C_{59}$ alkylene group, and $A_{107}$ may be a $C_1$-$C_{59}$ heteroaryl group).

The term "$R_{10a}$" as used herein may be:
deuterium (-D), —F, —Cl, —Br, —I, a hydroxyl group, a cyano group, or a nitro group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each unsubstituted or substituted with deuterium, —F, —Cl, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ aryl alkyl group, a $C_2$-$C_{60}$ heteroaryl alkyl group, —Si($Q_{11}$)($Q_{12}$)($Q_{13}$), —N($Q_{11}$)($Q_{12}$), —B($Q_{11}$)($Q_{12}$), —C(=O)($Q_{11}$), —S(=O)$_2$($Q_{11}$), —P(=O)($Q_{11}$)($Q_{12}$), or any combination thereof;

a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ aryl alkyl group, or a $C_2$-$C_{60}$ heteroaryl alkyl group, each unsubstituted or substituted with deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ aryl alkyl group, a $C_2$-$C_{60}$ heteroaryl alkyl group, —Si($Q_{21}$)($Q_{22}$)($Q_{23}$), —N($Q_{21}$)($Q_{22}$), —B(Q$_{21}$)(Q$_{22}$), —C(=O)(Q$_{21}$), —S(=O)$_2$(Q$_{21}$), —P(=O)(Q$_{21}$)(Q$_{22}$), or any combination thereof; or —Si(Q$_{31}$)(Q$_{32}$)(Q$_{33}$), —N(Q$_{31}$)(Q$_{32}$), —B(Q$_{31}$)(Q$_{32}$), —C(=O)(Q$_{31}$), —S(=O)$_2$(Q$_{31}$), or —P(=O)(Q$_{31}$)(Q$_{32}$).

The groups Q$_1$ to Q$_3$, Q$_{11}$ to Q$_{13}$, Q$_{21}$ to Q$_{23}$ and Q$_{31}$ to Q$_{33}$ as used herein may each independently be: hydrogen; deuterium; —F; —Cl; —Br; —I; a hydroxyl group; a cyano group; a nitro group; a C$_1$-C$_{60}$ alkyl group; a C$_2$-C$_{60}$ alkenyl group; a C$_2$-C$_{60}$ alkynyl group; a C$_1$-C$_{60}$ alkoxy group; a C$_3$-C$_{60}$ carbocyclic group or a C$_1$-C$_{60}$ heterocyclic group, each unsubstituted or substituted with deuterium, —F, a cyano group, a C$_1$-C$_{60}$ alkyl group, a C$_1$-C$_{60}$ alkoxy group, a phenyl group, a biphenyl group, or any combination thereof; a C$_7$-C$_{60}$ aryl alkyl group; or a C$_2$-C$_{60}$ heteroaryl alkyl group.

The term "heteroatom" as used herein may be any atom other than a carbon atom or a hydrogen atom. Examples of the heteroatom may include O, S, N, P, Si, B, Ge, Se, and any combinations thereof.

Examples of the term "third-row transition metal" as used herein may include hafnium (Hf), tantalum (Ta), tungsten (W), rhenium (Re), osmium (Os), iridium (Ir), platinum (Pt), gold (Au), and the like.

The term "Ph" as used herein refers to a phenyl group, the term "Me" as used herein refers to a methyl group, the term "Et" as used herein refers to an ethyl group, the terms "ter-Bu" or "Bu$^t$" as used herein refers to a tert-butyl group, and the term "OMe" as used herein refers to a methoxy group.

The term "biphenyl group" as used herein may be a phenyl group substituted with a phenyl group. For example, the "biphenyl group" may be a substituted phenyl group having a C$_6$-C$_{60}$ aryl group as a substituent.

The term "terphenyl group" as used herein may be a phenyl group substituted with a biphenyl group. For example, the "terphenyl group" may be a substituted phenyl group having, as a substituent, a C$_6$-C$_{60}$ aryl group substituted with a C$_6$-C$_{60}$ aryl group.

The symbols * and *' as used herein, unless defined otherwise, each refer to a binding site to a neighboring atom in a corresponding formula or moiety.

Hereinafter, a compound according to embodiments and a light-emitting device according to embodiments will be described in detail with reference to Examples.

The wording "B was used instead of A" used in describing Examples means that an identical molar equivalent of B was used in place of A.

EXAMPLES

Example 1

A glass substrate with a 15 Ω/cm$^2$ (800 Å) ITO/Ag/ITO anode formed thereon (a product of Corning Inc.) was cut to a size of 50 mm×50 mm×0.7 mm, sonicated with isopropyl alcohol and pure water each for 5 minutes, and cleaned by exposure to ultraviolet rays and ozone for 15 minutes. The resultant glass substrate was loaded onto a vacuum deposition apparatus.

HAT-CN was deposited on the ITO/Ag/ITO anode of the glass substrate to form a hole injection layer having a thickness of 50 Å, NPB was deposited on the hole injection layer to form a hole transport layer having a thickness of 600 Å, TCTA was deposited on the hole transport layer to form an electron blocking layer having a thickness of 50 Å, H125 and FD37 were co-deposited to a weight ratio of 100:3 on the electron blocking layer to form a first emission layer having a thickness of 200 Å, T2T was deposited on the first emission layer to form a hole blocking layer having a thickness of 50 Å, and TPM-TAZ and LiQ were co-deposited to a weight ratio of 50:50 on the hole blocking layer to form an electron transport layer having a thickness of 200 Å, thereby forming the first emitting unit.

BCP and Li were co-deposited to a weight ratio of 99:1 on the first emitting unit to form an n-type charge generation layer having a thickness of 150 Å, and HAT-CN was deposited on the n-type charge generation layer to form a p-type charge generation layer having a thickness of 50 Å, thereby forming the first charge generation unit.

NPB was deposited on the first charge generation unit to form a hole transport layer having a thickness of 600 Å, TCTA was deposited on the hole transport layer to form an electron blocking layer having a thickness of 50 Å, H125 and FD37 were co-deposited to a weight ratio of 100:3 on the electron blocking layer to form a second emission layer having a thickness of 200 Å, T2T was deposited on the second emission layer to form a hole blocking layer having a thickness of 50 Å, and TPM-TAZ and LiQ were co-deposited to a weight ratio of 50:50 on the hole blocking layer to form an electron transport layer having a thickness of 200 Å, thereby forming the second emitting unit.

BCP and Li were co-deposited to a weight ratio of 99:1 on the second emitting unit to form an n-type charge generation layer having a thickness of 150 Å, and HAT-CN was deposited on the n-type charge generation layer to form a p-type charge generation layer having a thickness of 50 Å, thereby forming the second charge generation unit.

NPB was deposited on the second charge generation unit to form a hole transport layer having a thickness of 600 Å, TCTA was deposited on the hole transport layer to form an electron blocking layer having a thickness of 50 Å, H125 and FD37 were co-deposited to a weight ratio of 100:3 on the electron blocking layer to form a third emission layer having a thickness of 200 Å, T2T was deposited on the third emission layer to form a hole blocking layer having a thickness of 50 Å, and TPM-TAZ and LiQ were co-deposited to a weight ratio of 50:50 on the hole blocking layer to form an electron transport layer having a thickness of 200 Å, thereby forming the third emitting unit.

BCP and Li were co-deposited to a weight ratio of 99:1 on the third emitting unit to form an n-type charge generation layer having a thickness of 150 Å, and HAT-CN was deposited on the n-type charge generation layer to form a p-type charge generation layer having a thickness of 50 Å, thereby forming the third charge generation unit.

NPB was deposited on the third charge generation unit to form a hole transport layer having a thickness of 600 Å, TCTA was deposited on the hole transport layer to form an electron blocking layer having a thickness of 50 Å, and H127 and H128 as hosts and PD40 as a dopant were co-deposited on the electron blocking layer to a weight ratio of 60:40:5 to form a fourth emission layer having a thickness of 250 Å. Compound 3-4 was deposited on the fourth emission layer to form a third layer having a thickness of 550 Å, Compounds 3-4 and ET-D1 were co-deposited on the third layer to a weight ratio of 50:50 to form a second layer having a thickness of 50 Å, and Compound 1-1 and Li were co-deposited to a weight ratio of 90:10 on the second layer to form a first layer having a thickness of 20 Å, thereby forming the fourth emitting unit.

Ag and Mg were co-deposited to a weight ratio of 90:10 on the fourth emitting unit to form a cathode having a thickness of 100 Å, and HT28 was deposited on the cathode as a capping layer having a thickness of 700 Å, so as to form a light-emitting device.

161
H125
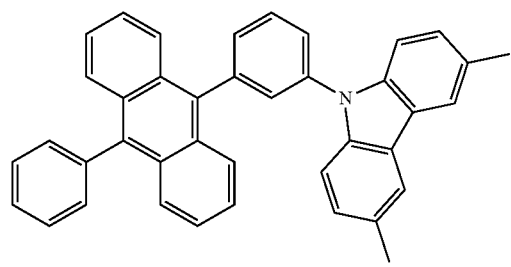
FD37
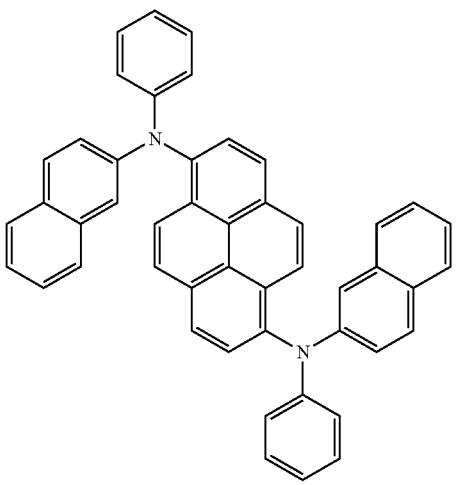
H127
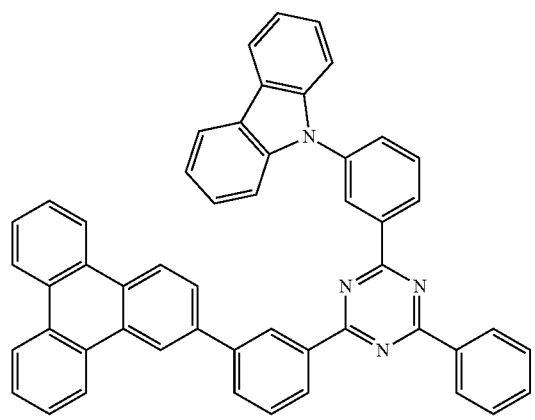
H128
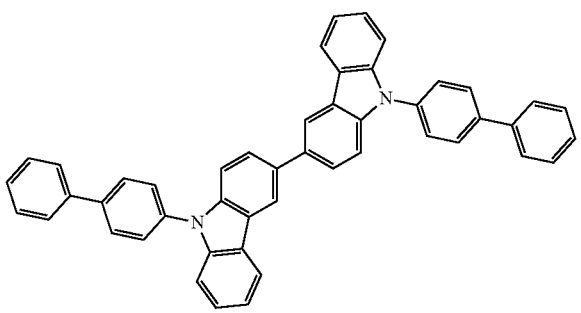
PD40
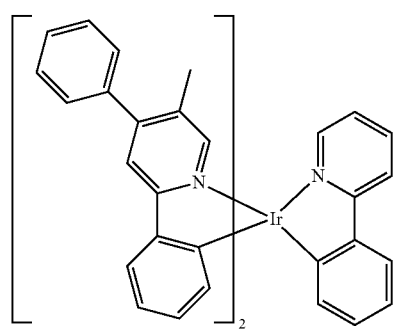
HT28
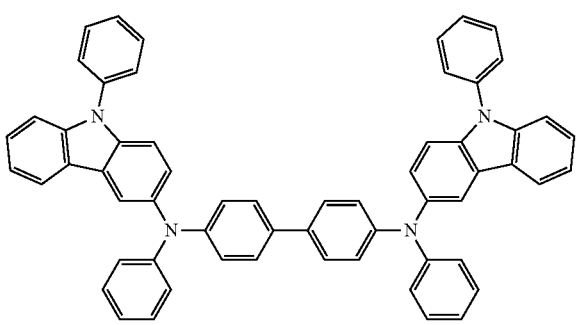
ET-D1
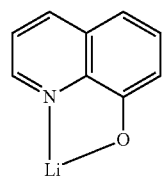
BCP
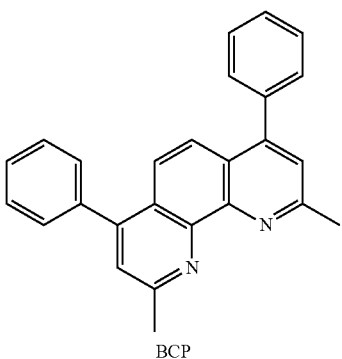

-continued
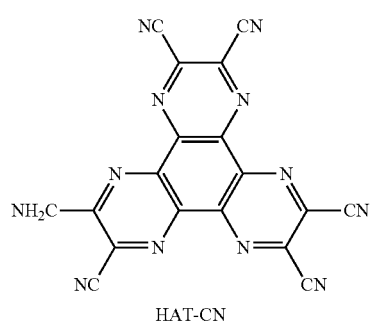
HAT-CN
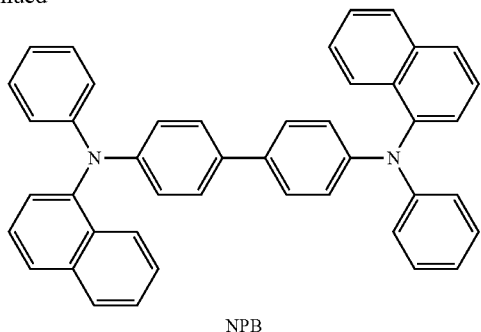
NPB
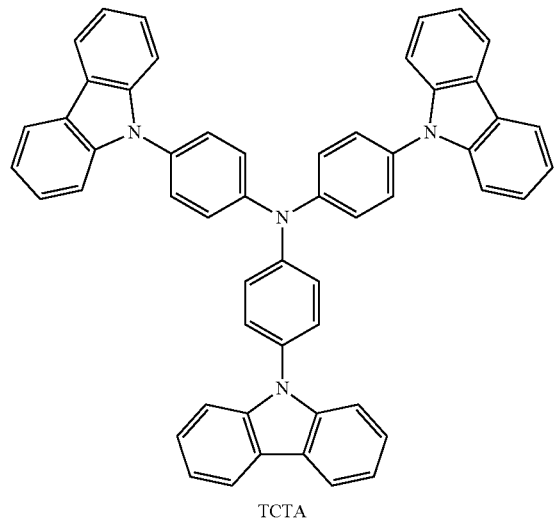
TCTA
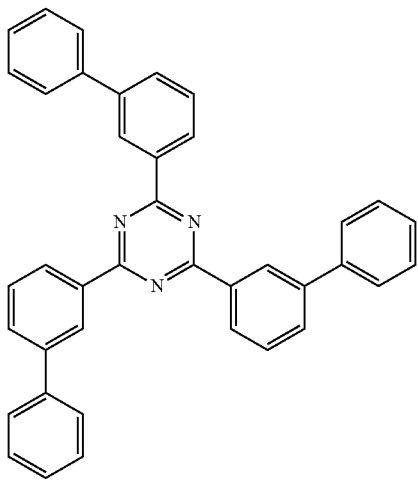
T2T
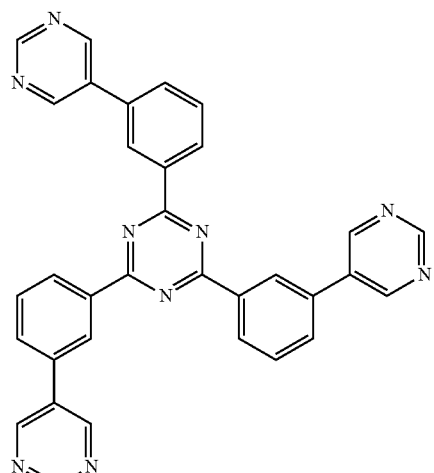
TPM-TAZ
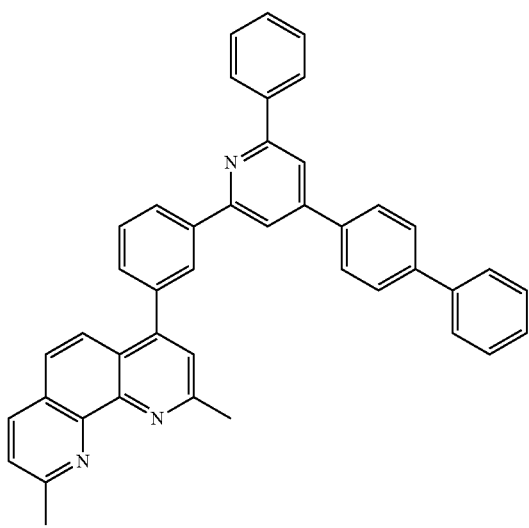
1-1

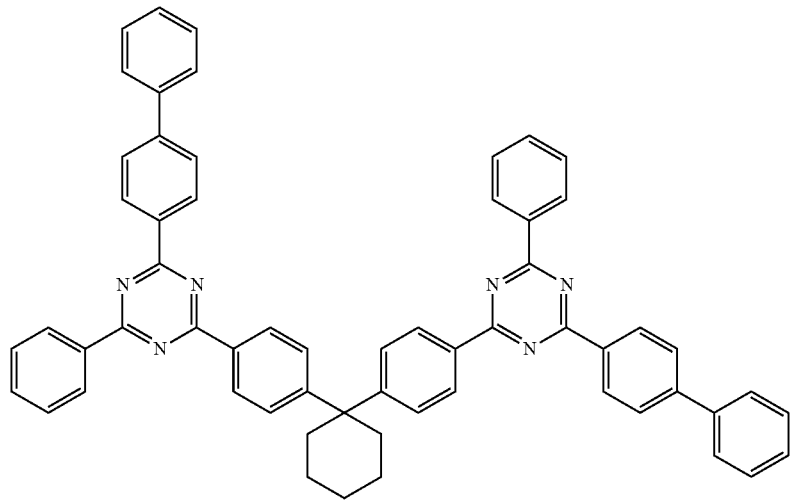

3-4

Comparative Examples 1 to 7

The light-emitting devices of Comparative Examples 1 to 7 were manufactured in the same manner as in Example 1, except that the compounds of Table 1 were used when forming each of the first to third layers of the fourth emitting unit of Example 1. (X indicates that the corresponding layer does not exist)

TABLE 1

| | Fourth emitting unit (weight ratio) | | |
|---|---|---|---|
| Examples | First layer | Second layer | Third layer |
| Example 1 | Compound 1-1, Li (90:10) | Compound 3-4, ET-D1 (50:50) | Compound 3-4 |
| Comparative Example 1 | Yb | X | Compound 3-4, ET-D1 (50:50) |
| Comparative Example 2 | Yb | X | Compound 3-4 |
| Comparative Example 3 | Compound 1-1, Li (90:10) | X | Compound 3-4, ET-D1 (50:50) |
| Comparative Example 4 | Compound 1-1, Li (90:10) | X | Compound 3-4 |
| Comparative Example 5 | X | Compound 3-4, ET-D1 (50:50) | Compound 3-4, ET-D1 (50:50) |
| Comparative Example 6 | X | Compound 3-4, ET-D1 (50:50) | Compound 3-4 |
| Comparative Example 7 | Compound 1-1, Li (90:10) | Compound 3-4, ET-D1 (50:50) | Compound 3-4, ET-D1 (50:50) |

Evaluation Example 1: Evaluation of Light-Emitting Device of Example 1 and Comparative Examples 1 to 7

The driving voltage, luminescence efficiency, and lifespan ($T_{95}$) of the light-emitting devices manufactured according to Example 1 and Comparative Examples 1 to 7 were measured using Keithley SMU 236 and luminance meter PR650, and the values converted relative to 100% of the measured value of Comparative Example 1 are shown in Table 2.

TABLE 2

| | Fourth emitting unit (weight ratio) | | | Driving voltage @10000 nt (V) | Luminescence Efficiency @10000 nit (cd/A) | Lifespan @10000 nit ($T_{95}$) |
|---|---|---|---|---|---|---|
| Examples | First layer/Layer thickness (Å) | Second layer | Third layer | | | |
| Example 1 | Compound 1-1, Li (90:10)/20 | Compound 3-4, ET-D1 (50:50) | Compound 3-4 | 82% | 123% | 125% |
| Comparative Example 1 | Yb/10 | X | Compound 3-4, ET-D1 (50:50) | 100% | 100% | 100% |
| Comparative Example 2 | Yb/10 | X | Compound 3-4 | 153% | 82% | 32% |
| Comparative Example 3 | Compound 1-1, Li (90:10)/20 | X | Compound 3-4, ET-D1 (50:50) | 112% | 100% | 100% |

TABLE 2-continued

| Examples | Fourth emitting unit (weight ratio) | | | Driving voltage @10000 nt (V) | Luminescence Efficiency @10000 nit (cd/A) | Lifespan @10000 nit ($T_{95}$) |
|---|---|---|---|---|---|---|
| | First layer/Layer thickness (Å) | Second layer | Third layer | | | |
| Comparative Example 4 | Compound 1-1, Li (90:10)/20 | X | Compound 3-4 | 125% | 92% | 85% |
| Comparative Example 5 | X | Compound 3-4, ET-D1 (50:50) | Compound 3-4, ET-D1 (50:50) | 132% | 80% | 73% |
| Comparative Example 6 | X | Compound 3-4, ET-D1 (50:50) | Compound 3-4 | 152% | 78% | 58% |
| Comparative Example 7 | Compound 1-1, Li (90:10) | Compound 3-4, ET-D1 (50:50) | Compound 3-4, ET-D1 (50:50) | 100% | 95% | 98% |

From Table 2, it can be seen that the light-emitting device of Example 1 has lower driving voltage and excellent luminescence efficiency and lifespan, as compared with those of the light-emitting devices of Comparative Examples 1 to 7.

Examples 2 to 17

The light-emitting devices of Examples 2 to 17 were manufactured in the same manner as in Example 1, except that each of the first layer to the third layer of the fourth emitting unit of Example 1 was deposited according to the thickness in Table 3.

Evaluation Example 2: Evaluation of Light-Emitting Devices of Examples 1 to 17

The driving voltage, luminescence efficiency, and lifespan ($T_{95}$) of the light-emitting devices manufactured according to Examples 1 to 17 were measured using Keithley SMU 236 and luminance meter PR650, and the values converted relative to 100% of the measured value of Comparative Example 1 of Table 2 are shown in Table 3.

From Table 3, it can be seen that the light-emitting device of Examples 1 to 17 has lower driving voltage and excellent luminescence efficiency and lifespan, as compared with those of the light-emitting devices of Comparative Examples 1 to 7.

Examples 18 to 25

The light-emitting devices of Examples 18 to 25 were manufactured in the same manner as in Example 1 except that, when forming the second layer of the fourth emitting unit of Example 1, Compounds 3-4 and ET-D1 were co-deposited to a weight ratio shown in Table 4 to form a second layer having a thickness of 50 Å.

Evaluation Example 3: Evaluation of Light-Emitting Device of Examples 1 and 18 to 25

The driving voltage, luminescence efficiency, and lifespan ($T_{95}$) of the light-emitting devices manufactured according to Examples 1 and 18 to 25 were measured using Keithley SMU 236 and luminance meter PR650, and the values converted relative to 100% of the measured value of Comparative Example 1 of Table 2 are shown in Table 4.

TABLE 3

| Examples | Fourth emitting unit (Layer thickness, Å) | | | Driving voltage @10000 nit (V) | Luminescence Efficiency @10000 nit (cd/A) | Lifespan @10000 nit ($T_{95}$) |
|---|---|---|---|---|---|---|
| | First layer | Second layer | Third layer | | | |
| Example 1 | 20 | 50 | 550 | 82% | 123% | 125% |
| Example 2 | 20 | 25 | 575 | 81% | 124% | 120% |
| Example 3 | 20 | 75 | 525 | 83% | 124% | 123% |
| Example 4 | 20 | 100 | 500 | 83% | 125% | 120% |
| Example 5 | 20 | 125 | 475 | 85% | 122% | 117% |
| Example 6 | 20 | 150 | 450 | 85% | 120% | 115% |
| Example 7 | 20 | 175 | 425 | 87% | 118% | 113% |
| Example 8 | 20 | 200 | 400 | 90% | 115% | 112% |
| Example 9 | 5 | 50 | 550 | 81% | 122% | 124% |
| Example 10 | 10 | 50 | 550 | 82% | 123% | 125% |
| Example 11 | 15 | 50 | 550 | 82% | 123% | 127% |
| Example 12 | 25 | 50 | 550 | 84% | 122% | 125% |
| Example 13 | 30 | 50 | 550 | 87% | 121% | 127% |
| Example 14 | 35 | 50 | 550 | 90% | 120% | 126% |
| Example 15 | 40 | 50 | 550 | 92% | 118% | 125% |
| Example 16 | 45 | 50 | 550 | 95% | 115% | 122% |
| Example 17 | 50 | 50 | 550 | 100% | 114% | 120% |

TABLE 4

| Examples | Weight ratio of second layer of fourth emitting unit (Compounds 3-4:Compound ET-D1) | Driving voltage @10000 nit (V) | Luminescence Efficiency @10000 nit (cd/A) | Lifespan @10000 nit ($T_{95}$) |
|---|---|---|---|---|
| Example 1  | 5:5 | 82%  | 123% | 125% |
| Example 18 | 6:4 | 83%  | 122% | 114% |
| Example 19 | 3:7 | 88%  | 120% | 108% |
| Example 20 | 8:2 | 95%  | 112% | 103% |
| Example 21 | 4:6 | 82%  | 115% | 128% |
| Example 22 | 3:7 | 83%  | 108% | 132% |
| Example 23 | 8:2 | 84%  | 104% | 134% |
| Example 24 | 9:1 | 105% | 103% | 95%  |
| Example 25 | 1:9 | 90%  | 92%  | 133% |

From Table 4, it can be seen that the light-emitting devices of Examples 1 and 18 to 25 have equal or superior driving voltage, luminescence efficiency, and lifespan compared to those of the light-emitting device of Comparative Example 1.

Although the disclosure has been described with reference to the Examples, these are provided for an illustrative purpose only, and one of ordinary skill in the art may understand that these examples may have various modifications and other examples equivalent thereto.

According to an embodiment, by including the first layer including the first metal-free material and the first metal-containing material, the second layer including the second metal-free material and the second metal-containing material, and the third layer including the third metal-free material in the electron transport region, a light-emitting device that stabilizes the electron injection characteristics, has excellent electron mobility, and prevents exciton quenching, thereby having a low driving voltage, high efficiency, and a long lifespan may be realized.

Embodiments have been disclosed herein, and although terms are employed, they are used and are to be interpreted in a generic and descriptive sense only and not for purpose of limitation. In some instances, as would be apparent by one of ordinary skill in the art, features, characteristics, and/or elements described in connection with an embodiment may be used singly or in combination with features, characteristics, and/or elements described in connection with other embodiments unless otherwise specifically indicated. Accordingly, it will be understood by those of ordinary skill in the art that various changes in form and details may be made without departing from the spirit and scope of the disclosure as set forth in the claims.

What is claimed is:

1. A light-emitting device comprising:
   a first electrode;
   a second electrode; and
   an interlayer between the first electrode and the second electrode, wherein
   the interlayer comprises:
     an emission layer;
     a third layer between the emission layer and the second electrode;
     a first layer between the third layer and the second electrode; and
     a second layer between the first layer and the third layer,
   the first layer comprises a first metal-free material and a first metal-containing material,
   the second layer comprises a second metal-free material and a second metal-containing material,
   the first metal-free material and the second metal-free material are different from each other,
   the first metal-free material comprises a phosphine oxide-based compound, a phenanthroline-based compound, or a combination thereof,
   the first metal-containing material and the second metal-containing material are different from each other, and
   the third layer consists of a third metal-free material.

2. The light-emitting device of claim 1, wherein the interlayer comprises:
   m emitting units; and
   m−1 charge generation unit(s) between neighboring emitting units among the m emitting units,
   m is an integer of 2 or more, and
   one of the m emitting units comprises the emission layer, the first layer, the second layer, and the third layer.

3. The light-emitting device of claim 2, wherein a maximum emission wavelength of light emitted from at least one of the m emitting units is different from a maximum emission wavelength of light emitted from at least one of the remainder of the m emitting units.

4. The light-emitting device of claim 2, wherein an emitting unit neighboring the second electrode among the m emitting units includes the emission layer, the first layer, the second layer, and the third layer.

5. The light-emitting device of claim 2, wherein m is 4.

6. The light-emitting device of claim 5, wherein
   the m emitting units comprise a first emitting unit, a second emitting unit, a third emitting unit, and a fourth emitting unit,
   the m−1 charge generation units comprise a first charge generation unit, a second charge generation unit, and a third charge generation unit,
   the first charge generation unit is between the first emitting unit and the second emitting unit,
   the second charge generation unit is between the second emitting unit and the third emitting unit,
   the third charge generation unit is between the third emitting unit and the fourth emitting unit,
   the first emitting unit is between the first electrode and the first charge generation unit,
   the second emitting unit is between the first charge generation unit and the second charge generation unit,
   the third emitting unit is between the second charge generation unit and the third charge generation unit,
   the fourth emitting unit is between the third charge generation unit and the second electrode, and
   one of the first emitting unit, the second emitting unit, the third emitting unit, and the fourth emitting unit includes the emission layer, the first layer, the second layer, and the third layer.

7. The light-emitting device of claim 6, wherein the fourth emitting unit comprises the emission layer, the first layer, the second layer, and the third layer.

8. The light-emitting device of claim 6, wherein the fourth emitting unit emits green light.

9. The light-emitting device of claim 1, wherein the first metal-containing material comprises an alkali metal, an alkaline earth metal, a lanthanide metal, or a combination thereof.

10. The light-emitting device of claim 1, wherein the first metal-containing material is Yb, Li, Cu, Ag, Au, Al, Mg, or a combination thereof.

11. The light-emitting device of claim 1, wherein the second metal-free material comprises a compound including at least one of:
  groups of Group 2A;
  a condensed cyclic group in which two or more groups of Group 2A are condensed with each other; or
  a condensed cyclic group in which at least one group of Group 2A and at least one of Group 2B are condensed with each other:
  [Group 2A]
  a pyridine group, a diazine group, a triazine group, a tetrazine group,
  [Group 2B]
  a benzene group.

12. The light-emitting device of claim 1, wherein the second metal-containing material comprises an alkali metal complex.

13. The light-emitting device of claim 1, wherein the third metal-free material comprises a compound comprising at least one of:
  groups of Group 3A;
  a condensed cyclic group in which two or more groups of Group 3A are condensed with each other; or
  a condensed cyclic group in which at least one group of Group 3A and at least one of Group 3B are condensed with each other:
  [Group 3A]
  a pyridine group, a diazine group, a triazine group, a tetrazine group,
  [Group 3B]
  a benzene group.

14. The light-emitting device of claim 1, wherein the second metal-free material and the third metal-free material are identical to each other.

15. The light-emitting device of claim 1, wherein an amount of the second metal-free material is in a range of about 10 parts by weight to about 90 parts by weight, based on 100 parts by weight of the second metal-free material and the second metal-containing material.

16. The light-emitting device of claim 1, wherein the first layer directly contacts the second layer.

17. The light-emitting device of claim 1, wherein a thickness of the first layer is equal to or less than a thickness of the second layer.

18. An electronic apparatus comprising:
  the light-emitting device of claim 1; and
  a thin-film transistor, wherein
  the thin-film transistor comprises a source electrode and a drain electrode, and
  the first electrode of the light-emitting device is electrically connected to the source electrode or the drain electrode.

19. The electronic apparatus of claim 18, further comprising a color filter, a color conversion layer, a touch screen layer, a polarizing layer, or a combination thereof.

* * * * *